(12) United States Patent
Liang et al.

(10) Patent No.: US 12,432,977 B2
(45) Date of Patent: Sep. 30, 2025

(54) SEMICONDUCTOR DEVICE AND METHOD FOR MANUFACTURING THE SAME

(71) Applicant: TAIWAN SEMICONDUCTOR MANUFACTURING COMPANY, LTD., Hsinchu (TW)

(72) Inventors: Shuen-Shin Liang, Hsinchu (TW); Min-Chiang Chuang, Hsinchu (TW); Chia-Cheng Chen, Hsinchu (TW); Chun-Hung Wu, Hsinchu (TW); Liang-Yin Chen, Hsinchu (TW); Sung-Li Wang, Hsinchu (TW); Pinyen Lin, Hsinchu (TW); Kuan-Kan Hu, Hsinchu (TW); Jhih-Rong Huang, Hsinchu (TW); Szu-Hsian Lee, Hsinchu (TW); Tsun-Jen Chan, Hsinchu (TW); Cheng-Wei Lian, Hsinchu (TW); Po-Chin Chang, Hsinchu (TW); Chuan-Hui Shen, Hsinchu (TW); Lin-Yu Huang, Hsinchu (TW); Yuting Cheng, Hsinchu (TW); Yan-Ming Tsai, Hsinchu (TW); Hong-Mao Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 646 days.

(21) Appl. No.: 17/825,516

(22) Filed: May 26, 2022

(65) Prior Publication Data
US 2023/0387316 A1    Nov. 30, 2023

(51) Int. Cl.
*H01L 29/786*    (2006.01)
*H10D 30/67*    (2025.01)

(52) U.S. Cl.
CPC ..... *H10D 30/6743* (2025.01); *H10D 30/6729* (2025.01)

(58) Field of Classification Search
CPC .......... H10D 30/6743; H10D 30/6729; H10D 30/797; H10D 30/014; H10D 30/43; H10D 30/6735; H10D 30/6757; H10D 62/83; H10D 30/6219; H10D 62/822; H10D 62/832; H10D 62/121; H10D 84/017; H10D 84/85; H10D 30/0198; H10D 64/017; H10D 64/256; H10D 64/62; H10D 84/038; H01L 21/76831; H01L 21/76843; H01L 21/26506; H01L 21/28518; H01L 21/76895; B82Y 10/00
See application file for complete search history.

(56) References Cited

U.S. PATENT DOCUMENTS

2012/0161321 A1*  6/2012  Haverty ................. H10D 62/83
                                                        438/653

\* cited by examiner

*Primary Examiner* — Mohammed R Alam
(74) *Attorney, Agent, or Firm* — Birch, Stewart, Kolasch & Birch, LLP

(57) ABSTRACT

A semiconductor device includes a source/drain portion, a metal silicide layer disposed over the source/drain portion, and a transition layer disposed between the source/drain portion and the metal silicide layer. The transition layer includes implantation elements, and an atomic concentration of the implantation elements in the transition layer is higher than that in each of the source/drain portion and the metal silicide layer so as to reduce a contact resistance between the source/drain portion and the metal silicide layer. Methods for manufacturing the semiconductor device are also disclosed.

20 Claims, 52 Drawing Sheets ically, various features are not drawn to scale. In fact, the dimensions of the various features may be arbitrarily increased or reduced for clarity of discussion.
SEMICONDUCTOR DEVICE AND METHOD FOR MANUFACTURING THE SAME

BACKGROUND

With increase in device density and scaling down of chip size, critical dimension (CD) of metal lines and contacts continues to decrease, which results in a higher source/drain series resistance (Rp). Among multi-components in the source/drain series resistance (Rp), the proportion of a contact resistance (Rcsd) between a source/drain region and a metal silicide region becomes higher in advanced technology nodes. Since contact resistance has become a critical factor in advanced semiconductor technologies, there is continuous demand to develop a structure and/or a method to reduce the contact resistance in order to fulfill requirement of Rcsd.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
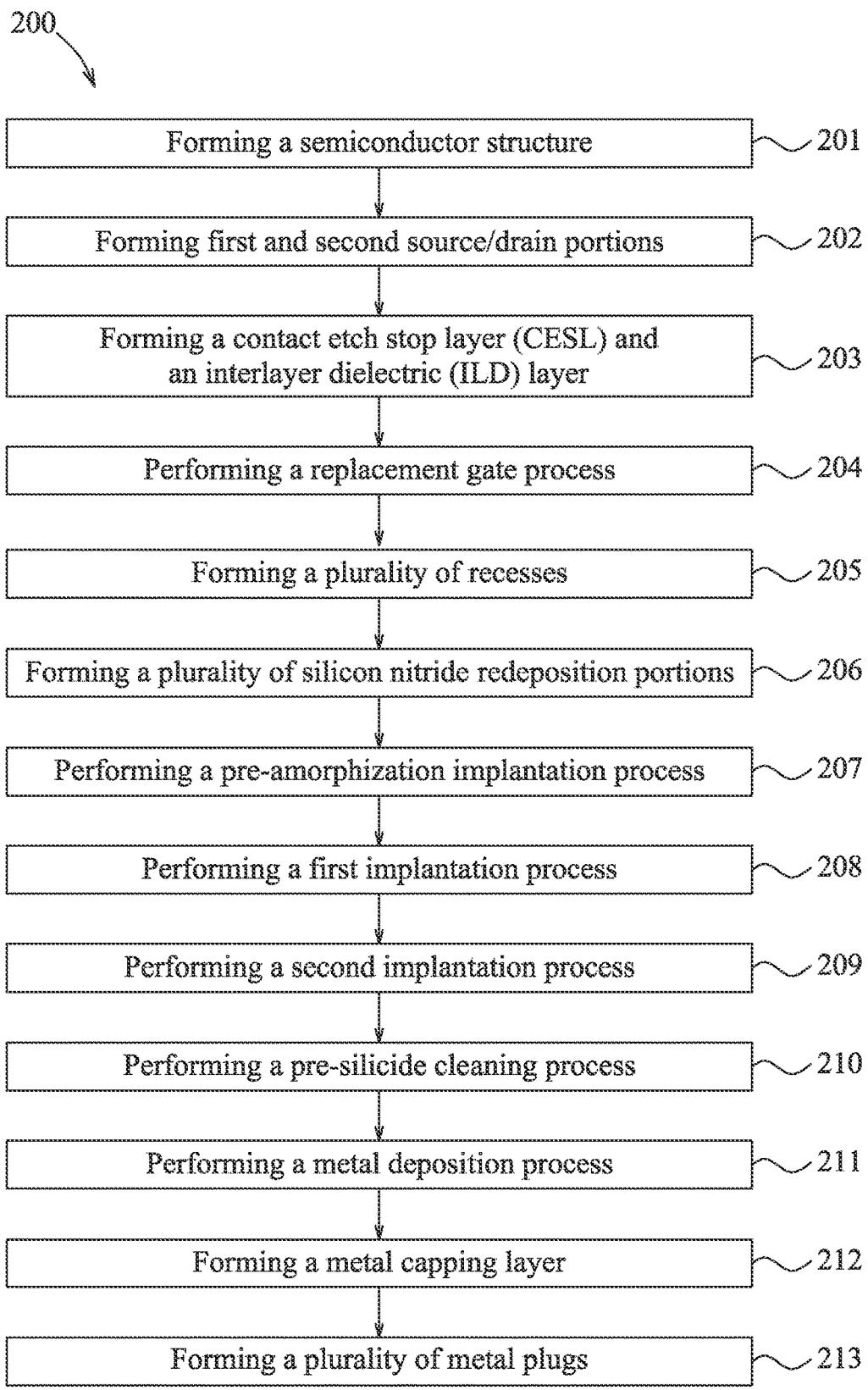
FIG. 1 is a flow diagram illustrating a method for manufacturing a semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a semiconductor device in which a contact resistance (Rcsd) between a metal silicide layer and a source/drain portion is reduced, and a method for manufacturing the same. The semiconductor device may be applied to a metal-oxide-semiconductor field effect transistor (MOSFET), such as a planar MOSFET, a fin-type FET (FinFET), a gate-all-around (GAA) nanosheet FET, a GAA nanowire FET, or other suitable devices.

For reducing the Rcsd, the source/drain portion may be implanted with dopants, followed by a rapid thermal anneal (RTA) process and/or a laser anneal process to increase the concentration of the dopants at an interface between the source/drain portion and the metal silicide layer. Along with the dimensional shrinkage of the semiconductor device, reduction of the Rcsd by increasing the dopant concentration at the interface between the source/drain portion and the metal silicide layer might be insufficient. In this disclosure, an approach for reducing a Schottky barrier height (SBH) between the source/drain portion and a metal plug is proposed to further reduce the Rcsd.

FIG. 1 is a flow diagram illustrating a method 200 for manufacturing the semiconductor device in accordance with some embodiments. FIGS. 2 to 16 illustrate schematic views of the intermediate stages of the method 200 in accordance with some embodiments. Some repeating structures are omitted in FIGS. 2 to 16 for the sake of brevity.

Figure 2:
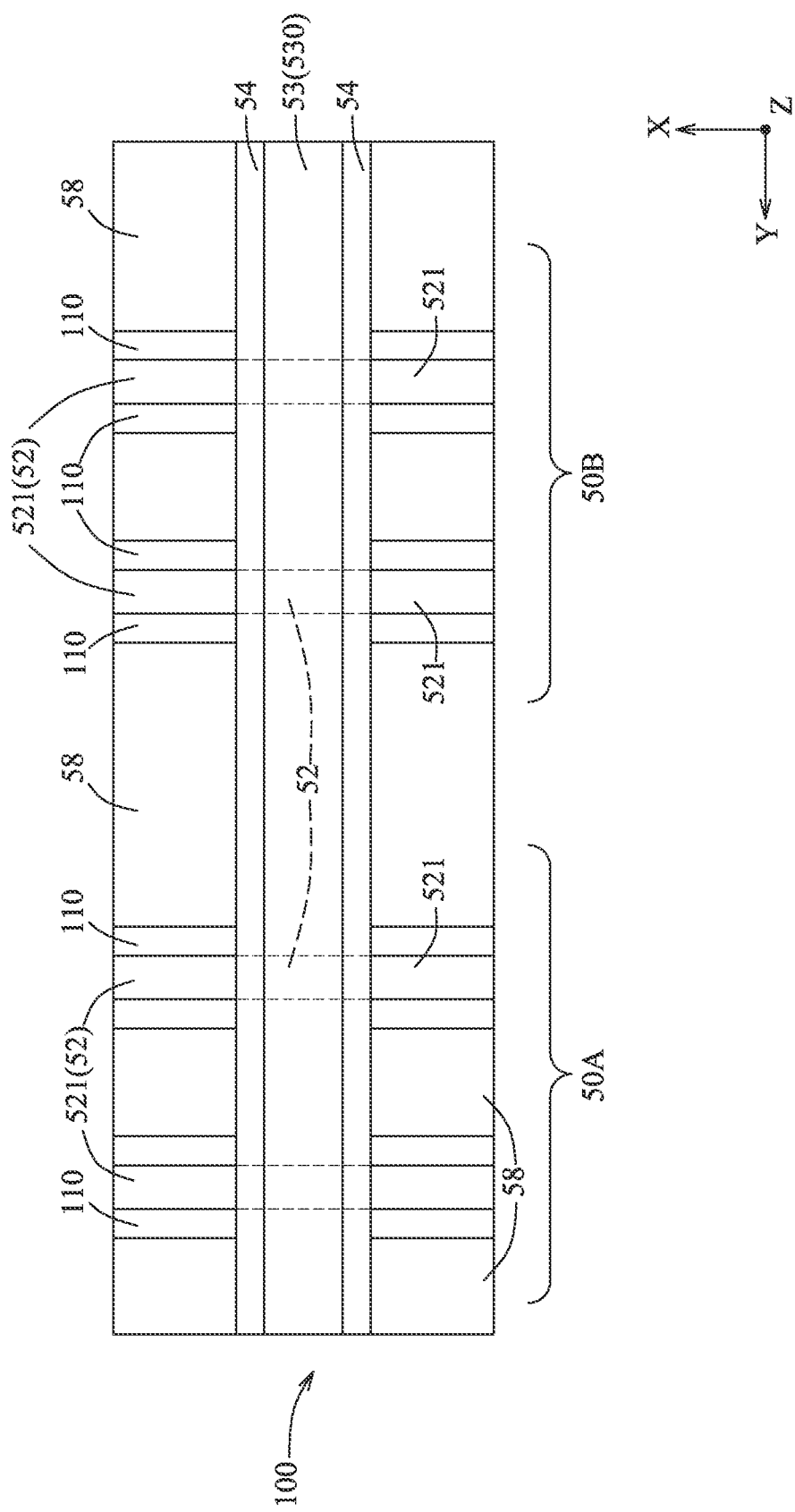
FIGS. 2 to 16 are schematic views illustrating intermediate stages of the method depicted in FIG. 1 in accordance with some embodiments.

Referring to FIG. 1 and the example illustrated in FIG. 2, the method 200 begins at step 201, where a semiconductor structure 100 is formed. FIG. 2 is a top view of the semiconductor structure 100 in accordance with some embodiments. The semiconductor structure 100 includes a semiconductor substrate 50 (see FIG. 4), a plurality of semiconductor fins 52, a dummy portion 53, a plurality of isolation portions 58, a plurality of fin sidewalls 110, and two gate spacers 54.

The semiconductor substrate 50 may be made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The material for forming the semiconductor substrate 50 may be doped with p-type impurities or n-type impurities, or undoped. In addition, the semiconductor substrate 50 may be a bulk silicon substrate, a silicon-on-insulator (SOI) substrate, or a germanium-on-insulator (GOI) substrate. Other suitable materials for the semiconductor substrate 50 are within the contemplated scope of the present disclosure.

The semiconductor fins 52 are formed on the semiconductor substrate 50, and may be made from a material the same or different from that of the semiconductor substrate 50. Since suitable materials for the semiconductor fins 52 are similar to those for the semiconductor substrate 50, the details thereof are omitted for the sake of brevity. In some embodiments, the semiconductor fins 52 extend in an X direction, and are spaced apart from each other in a Y direction transverse to the X direction. Although four of the semiconductor fins 52 are shown in FIG. 2, the number of the semiconductor fins 52 can be varied according to the layout design of the semiconductor structure 100.

The isolation portions 58 are formed on the semiconductor substrate 50 to isolate the semiconductor fins 52 from each other. The isolation portions 58 may each be a portion of a shallow trench isolation (STI), a deep trench isolation (DTI), or other suitable structures, and may be made of an oxide material (for example, silicon oxide), a nitride material (for example, silicon nitride), or a combination thereof. Other suitable materials for the isolation portions 58 are within the contemplated scope of the present disclosure.

The dummy portion 53 extends in the Y direction, and is formed over the semiconductor fins 52. In some embodiments, the dummy portion 53 includes a hard mask 530, a dummy gate 531 (see FIG. 5) formed beneath the hard mask 530, and a dummy gate dielectric (not shown) formed beneath the dummy gate 531 to separate the dummy gate 531 from the semiconductor fins 52. In some embodiments, the hard mask 530 may include silicon nitride, silicon oxide, silicon oxynitride, or combinations thereof; the dummy gate 531 may include polycrystalline silicon, single crystalline silicon, amorphous silicon, or combinations thereof; and the dummy dielectric may include silicon oxide, silicon nitride, silicon oxynitride, high dielectric constant (k) materials, or combinations thereof. Other suitable materials for the dummy portion 53 are within the contemplated scope of the present disclosure.

The gate spacers 54 are formed at two opposite sides of the dummy portion 53, and each of the semiconductor fins 52 has two recessed fin portions 521 exposed from the dummy structure 53 and the gate spacers 54. At two opposite sides of each of the recessed fin portions 521, two corresponding ones of the fin sidewalls 110 are formed. Each of the gate spacers 54 and the fin sidewalls 110 may include silicon oxide, silicon nitride, or a combination thereof. Other suitable materials for the gate spacers 54 and the fin sidewalls 110 are within the contemplated scope of the present disclosure.

In some embodiments, the semiconductor structure 100 may be formed by (i) patterning the semiconductor substrate 50 to form the semiconductor fins 52, (ii) forming an isolation layer over the semiconductor substrate 50 and the semiconductor fins 52 followed by a planarization process, for example, but not limited to, chemical mechanism polishing (CMP), to form the isolation portions 58, (iii) recessing the isolation portions 58 to expose upper portions of the semiconductor fins 52, (iv) forming the dummy portion 53 over the semiconductor fins 52 such that each of the semiconductor fins 52 has two fin portions exposed from and located at two opposite sides of the dummy portion 53, (v) forming the two gate spacers 54 at two opposite sides of the dummy portion 53, and the two fin sidewalls 110 at two opposite sides of each of the fin portions of the semiconductor fins 52, and (vi) recessing the fin portions of each of the semiconductor fins 52 to form the recessed fin portions 521. Other suitable processes for forming the semiconductor structure 100 are within the contemplated scope of the present disclosure. For example, the semiconductor fins 52 may be formed by depositing a semiconductor layer on the semiconductor substrate 50, followed by patterning the semiconductor layer, and may be made of a material different from that of the semiconductor substrate 50.

The semiconductor structure 100 can be divided into a first type portion 50A and a second type portion 50B. In some embodiments, the first type portion 50A is an n-FET portion, and the second type portion 50B is a p-FET portion.

Figure 3:
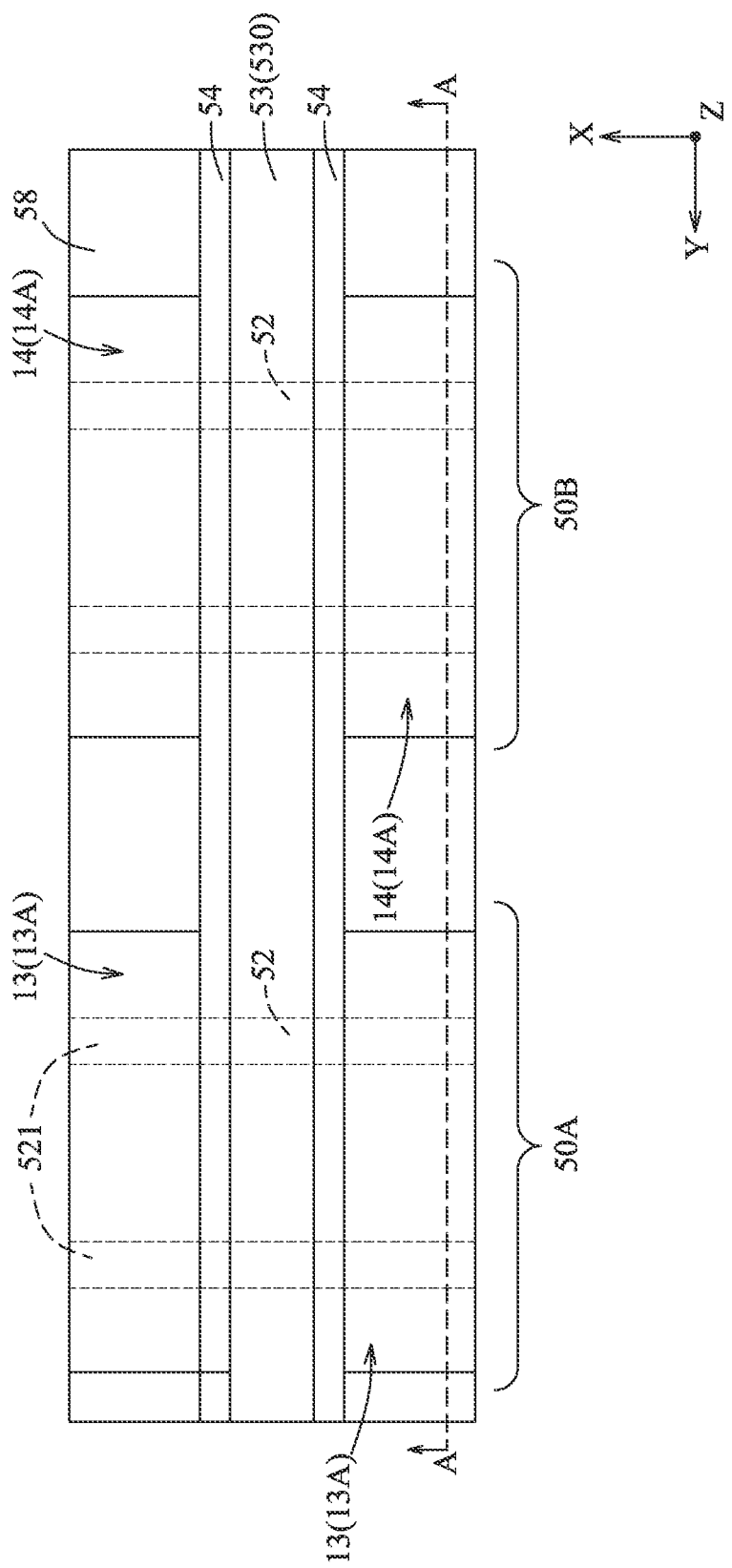
Figure 4:
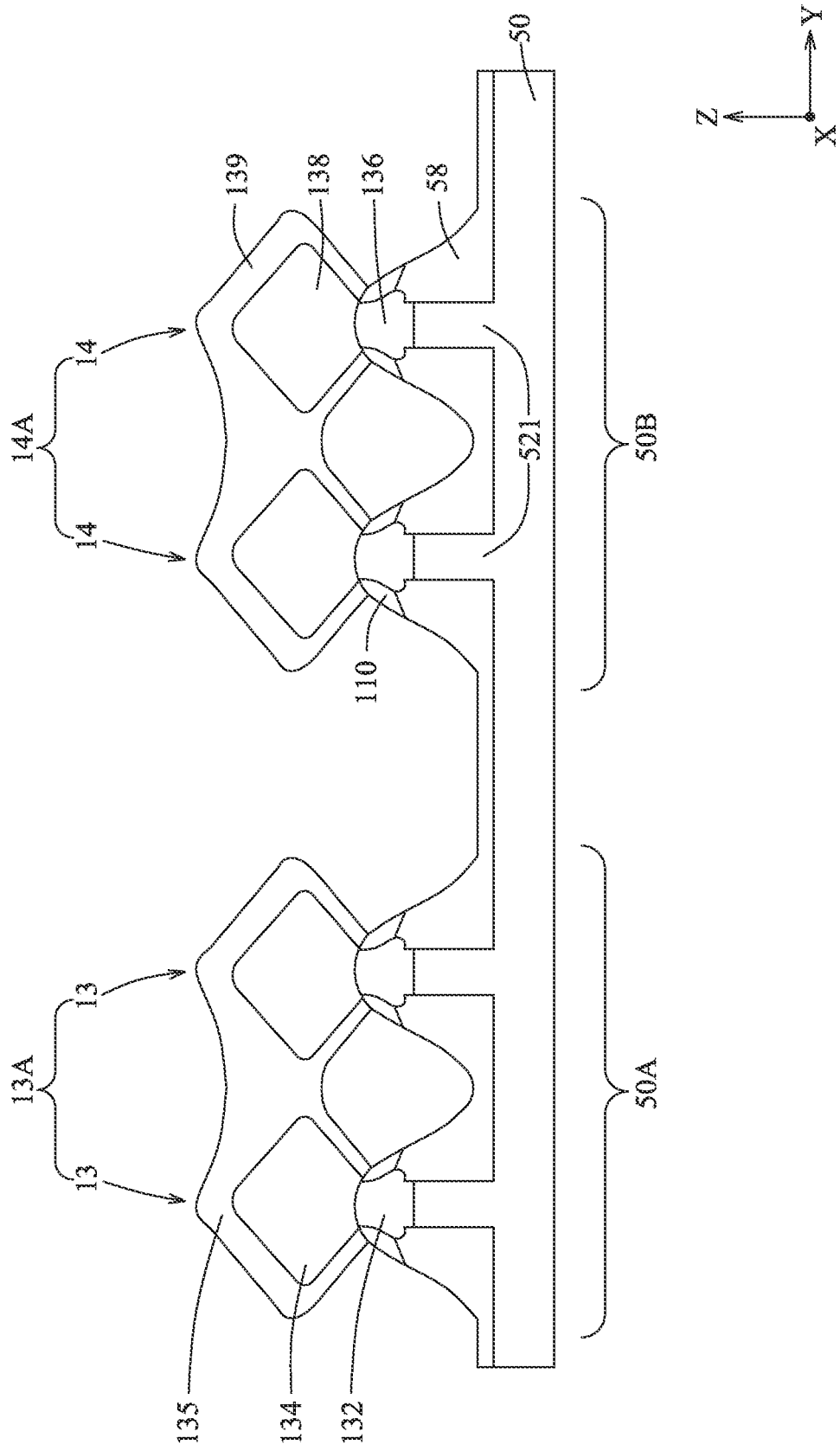

Referring to FIG. 1 and the examples illustrated in FIGS. 2 to 4, the method 200 proceeds to step 202, where a plurality of first source/drain portions 13 are respectively formed on the recessed fin portions 521 of the n-FET portion 50A, and a plurality of second source/drain portions 14 are respectively formed on the recessed fin portions 521 of the p-FET portion 50B. FIG. 3 is a view similar to that of FIG. 2, but illustrating the structure after step 202, and FIG. 4 is a cross-sectional view taken along line A-A of FIG. 3.

Figure 17:
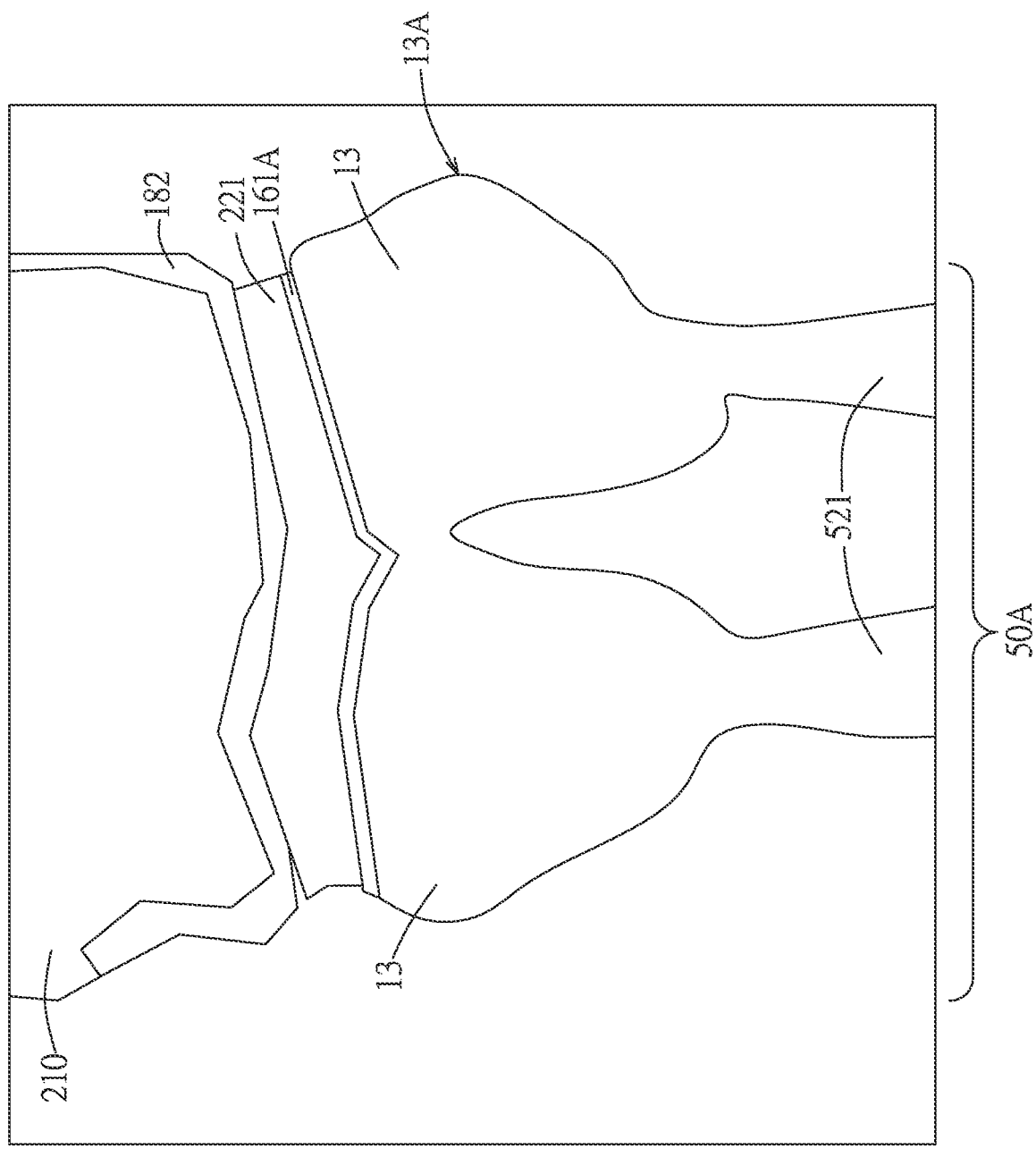
FIG. 17 is a partially enlarged view of an n-FET portion of the semiconductor device illustrating two adjacent first source/drain portions being merged in accordance with some embodiments.
Figure 18:
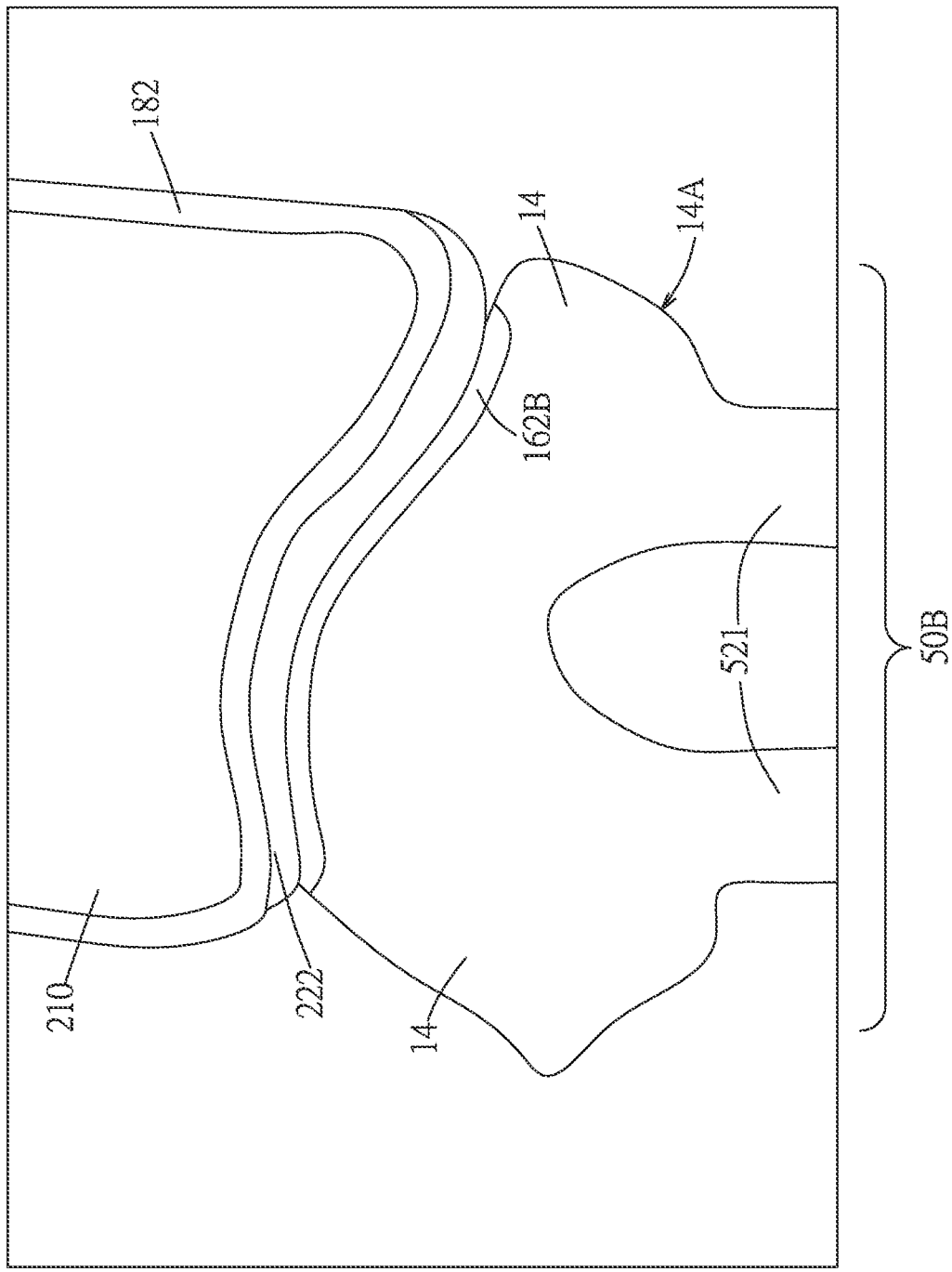
FIG. 18 is a partially enlarged view of a p-FET portion of the semiconductor device illustrating two adjacent second source/drain portions being merged in accordance with some embodiments.
Figure 19:
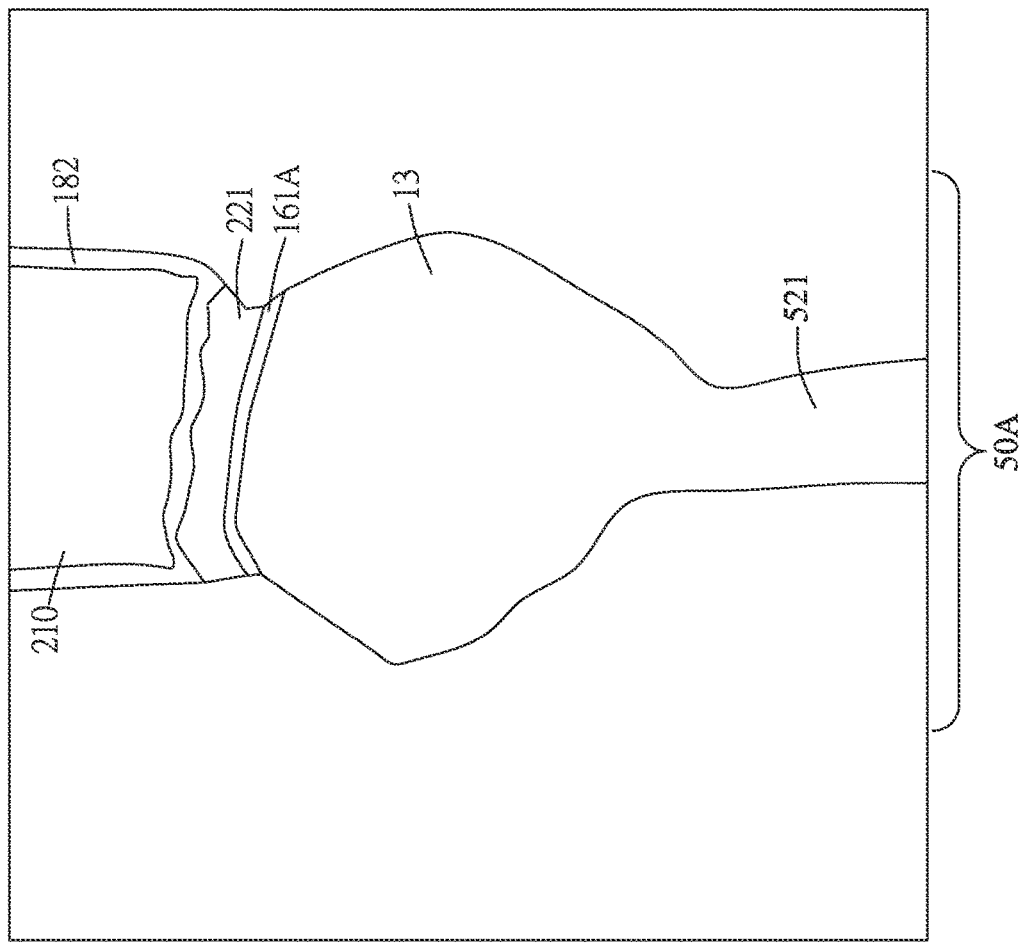
FIG. 19 is a view similar to that of FIG. 17, but illustrating a single first source/drain portion without being merged in accordance with some embodiments.
Figure 20:
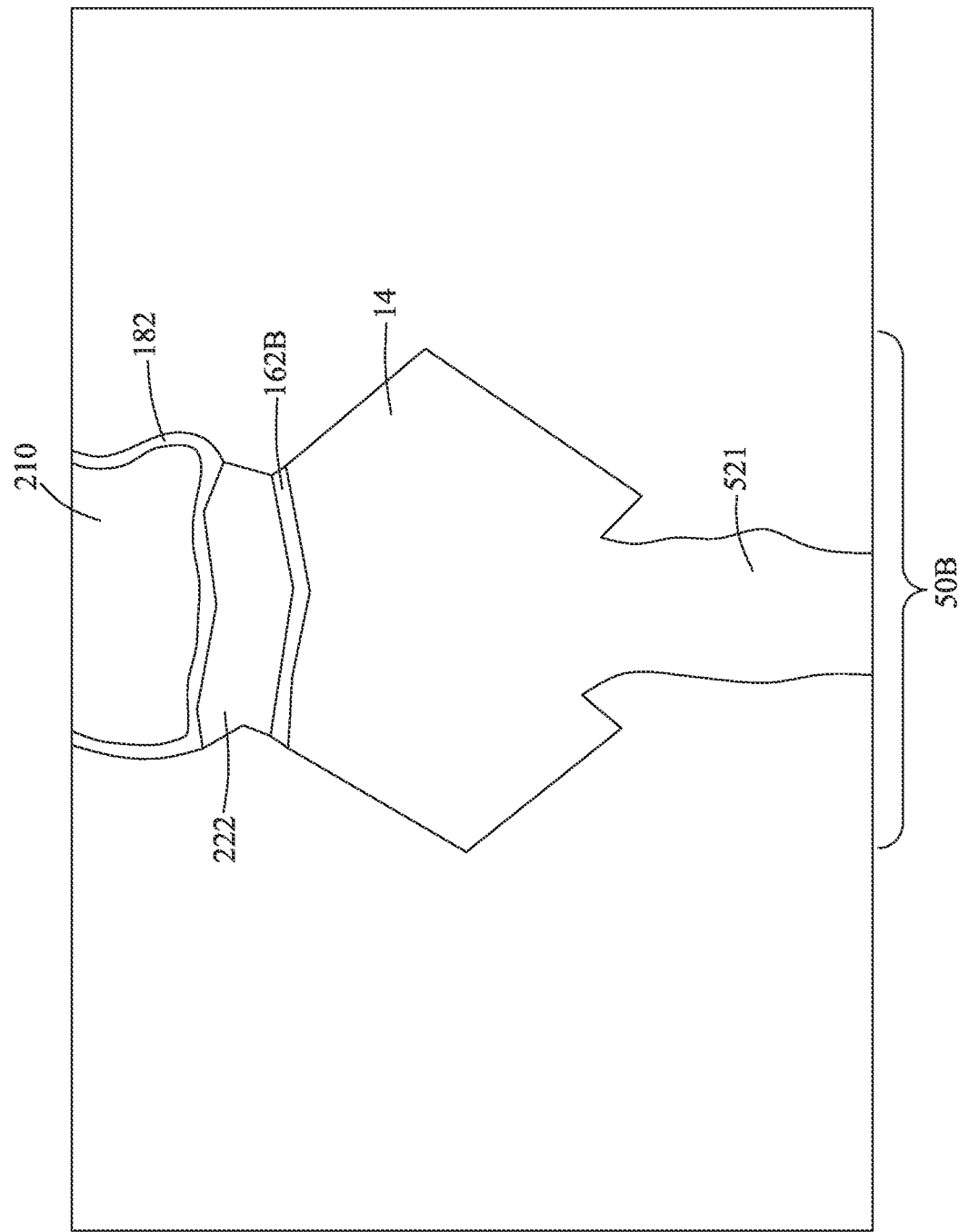
FIG. 20 is a view similar to that of FIG. 18, but illustrating a single second source/drain portion without being merged in accordance with some embodiments.

In some embodiments, two adjacent ones of the first source/drain portions 13 are merged to form a first merged portion 13A (see FIGS. 4 and 17), and two adjacent ones of the second source/drain portions 14 are merged to form a second merged portion 14A (see FIGS. 4 and 18). In some embodiments, as shown in FIGS. 3 and 4, two of the first merged portions 13A are formed at two opposite sides of the dummy portion 53, and two of second merged portions 14A are formed at two opposite sides of the dummy portion 53. In some alternative embodiments, the two adjacent ones of the first source/drain portions 13 are not merged (see FIG. 19), and two adjacent ones of the first source/drain portions 14 are not merged (see FIG. 20). In some other embodiments, the first merged portion 13A may include more than two of the first source/drain portions 13, and the second merged portion 14A may include more than two of the source/drain portions. Please note that the first merged portions 13A (including a plurality of the first source/drain portions 13) may also be referred to as a source/drain portion, and the second merged portions 14A (including a plurality of the second source/drain portions 14) may also be referred to as a source/drain portion.

In some embodiments, each of the first source/drain portions 13 on the n-FET portion 50A includes a first epitaxial layer 132, a second epitaxial layer 134, and a third epitaxial layer 135, and each of the epitaxial layers 132, 134, 135 may be a semiconductor epitaxial layer doped with an n-type impurity, for example, but not limited to, phosphorus. The semiconductor epitaxial layer may include silicon, silicon germanium, silicon carbide, germanium, III-V compound semiconductors, or combinations thereof. Other suitable materials for the epitaxial layers 132, 134, 135 are within the contemplated scope of the present disclosure.

In some embodiments, each of the second source/drain portions 14 on the p-FET portion 50B includes a first epitaxial layer 136, a second epitaxial layer 138, and a third epitaxial layer 139, and each of the epitaxial layers 136, 138, 139 may be a semiconductor epitaxial layer doped with a p-type impurity, for example, but not limited to, boron. The semiconductor epitaxial layer may include silicon, silicon germanium, silicon carbide, germanium, III-V compound semiconductors, or combinations thereof. Other suitable materials for the epitaxial layers 136, 138, 139 are within the contemplated scope of the present disclosure. It is noted that each of the first and second source/drain portions 13, 14 may refer to a source or a drain, individually or collectively dependent upon the context.

Figure 5:
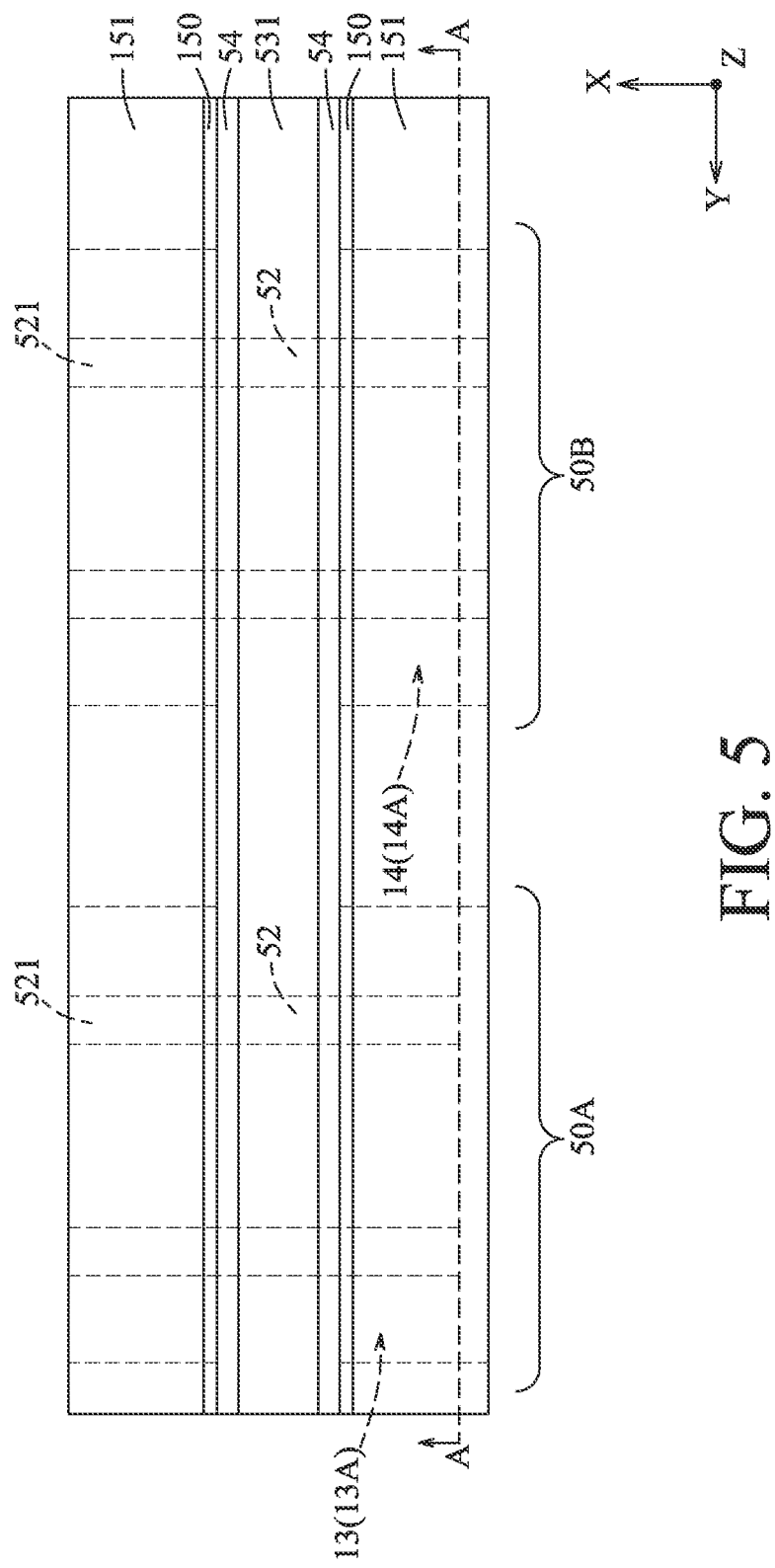
Figure 6:
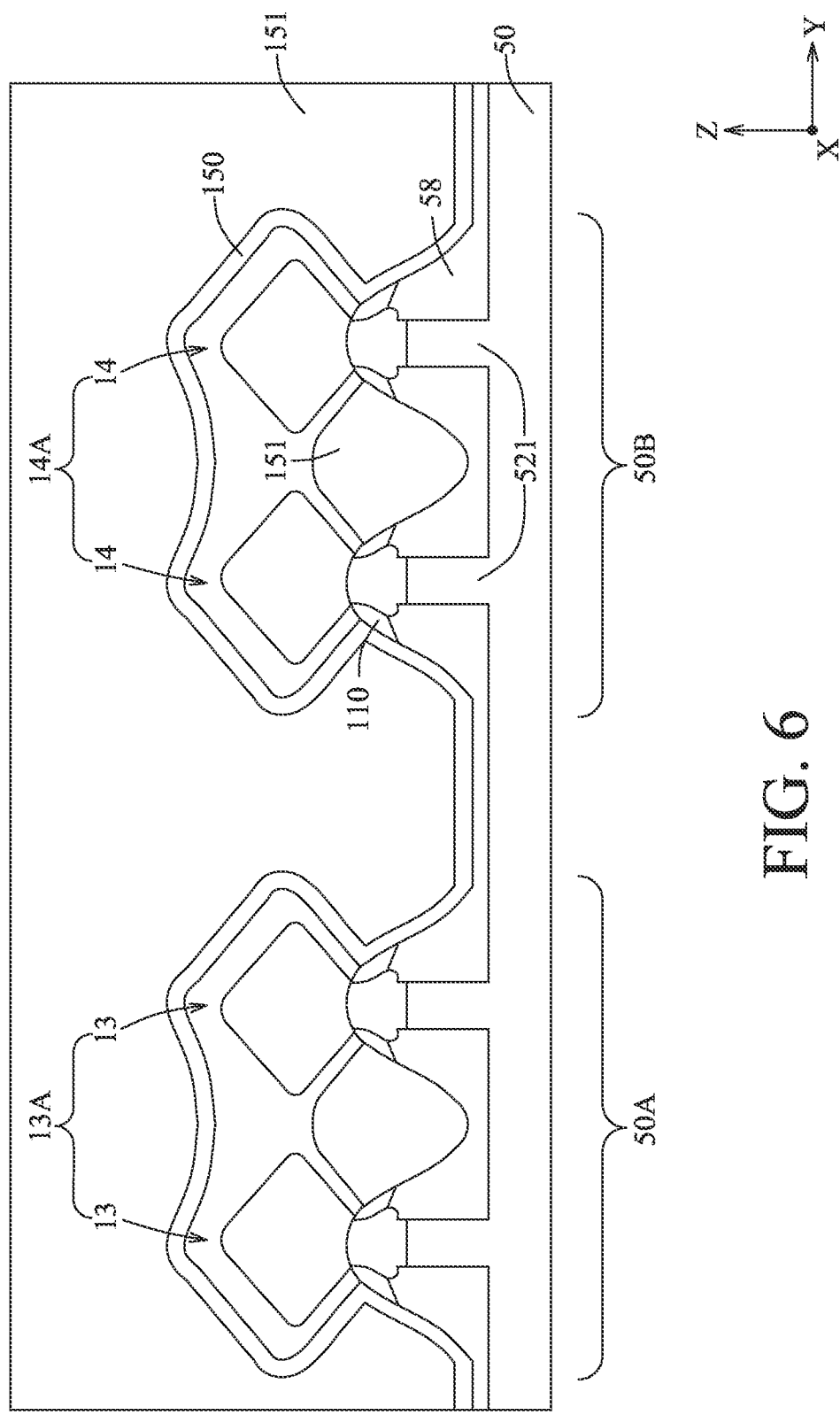

Referring to FIG. 1 and the examples illustrated in FIGS. 5 and 6, the method 200 proceeds to step 203, where a contact etch stop layer (CESL) 150 and an interlayer dielectric (ILD) layer 151 are sequentially formed over the structure shown in FIGS. 3 and 4. FIGS. 5 and 6 are views similar to those of FIGS. 3 and 4, respectively, but illustrating the structure after step 203. In some embodiments, step 203 is performed by sequentially depositing the CESL 150 and the ILD layer 151 using a blanket deposition process, such as, but not limited to, chemical vapor deposition (CVD), high density plasma CVD (HDPCVD), sub-atmospheric CVD (SACVD), or molecular layer deposition (MLD), followed by a planarization process, for example, but not limited to, CMP, thereby exposing the dummy gate 531. In other words, the hard mask 530 shown in FIG. 3 is removed after step 203. Other suitable processes for forming the CESL 150 and the ILD layer 151 are within the contemplated scope of the present disclosure.

In some embodiments, the CESL 150 includes, for example, but not limited to, silicon nitride, carbon-doped silicon nitride, other suitable materials, or combinations thereof. The ILD layer 151 includes a dielectric material such as, but not limited to, silicon oxide, silicon nitride, silicon oxynitride, other suitable materials, or combinations thereof. Other suitable materials for forming the CESL 150 and the ILD layer 151 are within the contemplated scope of the present disclosure.

Figure 7:
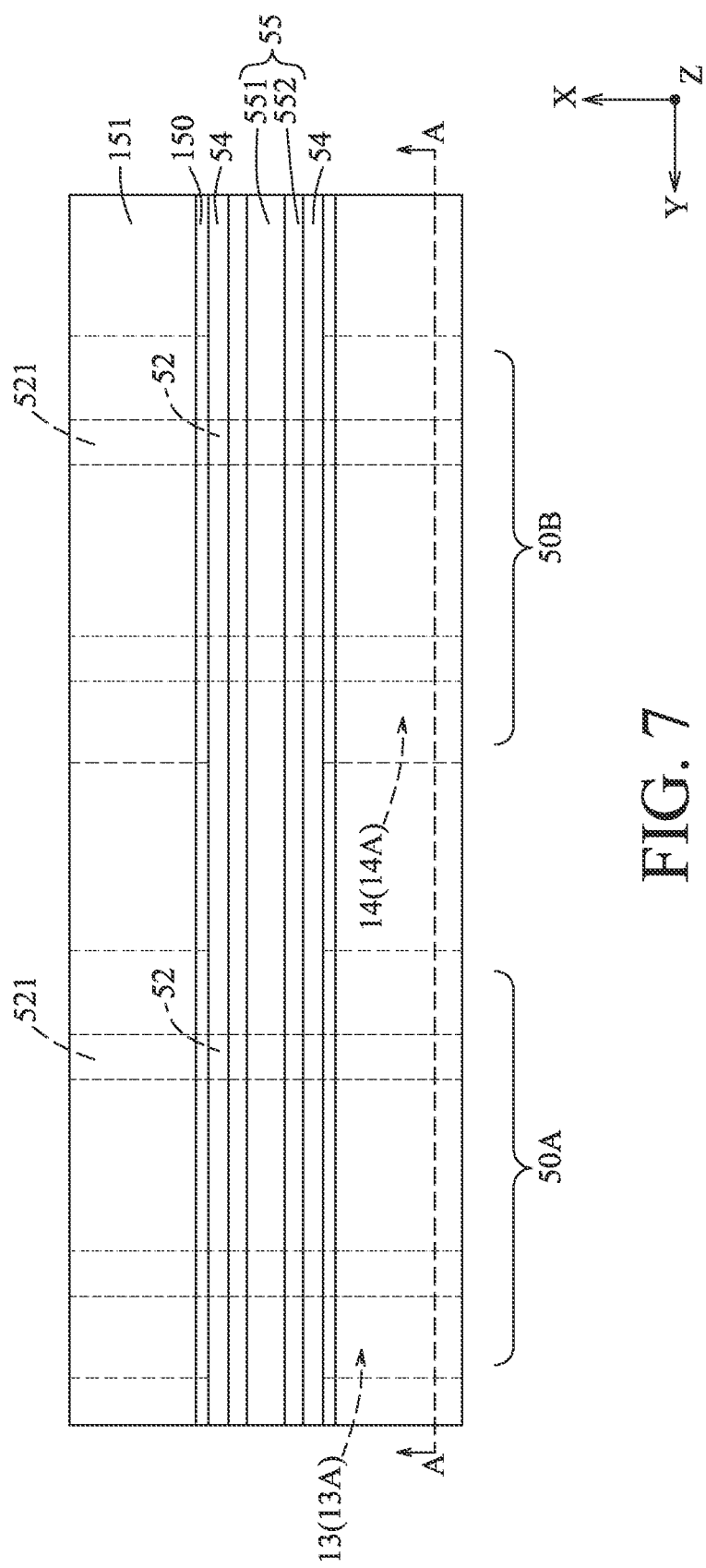

Referring to FIG. 1 and the examples illustrated in FIGS. 5 and 7, the method 200 proceeds to step 204, where a replacement gate (RPG) process is performed to replace the remaining of the dummy portion 53 (i.e., the dummy gate 531 and the dummy dielectric) with a gate portion 55 which includes a gate electrode 551 and a gate dielectric 552. FIG. 7 is a view similar to that of FIG. 5, but illustrating the structure after step 204. In some embodiments, step 204 includes (i) removing the dummy gate 531 and the dummy dielectric to form a trench (not shown) using dry etching, wet etching, other suitable processes, or combinations thereof, (ii) sequentially depositing layers of the gate dielectric 552 and the gate electrode 551 to fill the trench by a blanket deposition process, such as CVD, HDPCVD, SACVD, MLD, or physical vapor deposition (PVD), and (iii) performing a planarization process, for example, but not limited to, CMP, to remove excesses of the gate electrode 551 and the gate dielectric 552 and to expose the ILD layer 151. Other suitable processes for forming the gate portion 55 are within the contemplated scope of the present disclosure.

In some embodiments, the gate dielectric 552 includes silicon oxide, silicon nitride, silicon oxynitride, high dielectric constant (k) materials, other suitable materials, or combinations thereof, and the gate electrode 551 includes aluminum, tungsten, copper, other suitable materials, or combinations thereof. Other suitable materials for forming the gate portion 55 are within the contemplated scope of the present disclosure.

Figure 8:
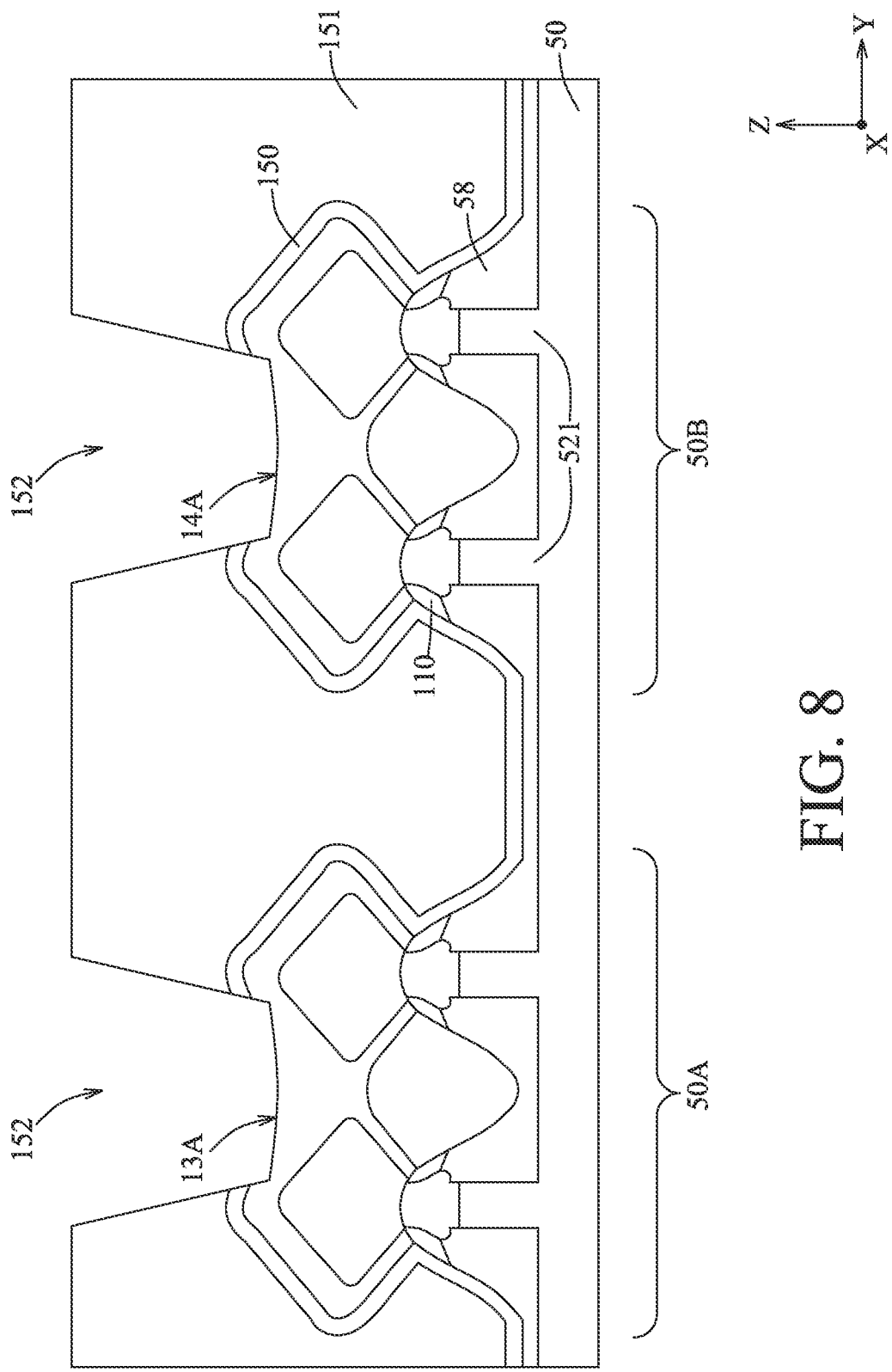

Referring to FIG. 1 and the example illustrated in FIG. 8, the method 200 proceeds to step 205, where a plurality of recesses 152 are formed. FIG. 8 is a view similar to that of FIG. 6, but illustrating the structure after step 205. Each of the recesses 152 extends through the ILD layer 151 and the CESL 150 to expose a corresponding one of the first and second merged portions 13A, 14A. In some embodiments, step 205 includes (i) forming a patterned mask layer (not shown) to cover a top surface of the structure shown in FIG. 7, the patterned mask layer being a patterned photoresist or a patterned hard mask and having openings in positions respectively corresponding to the first and second merged portions 13A, 14A, (ii) etching the ILD layer 151 and the CESL 150 through the openings of the patterned mask layer using dry etching, wet etching, other suitable processes, or combinations thereof, to form the recesses 152 until the first and second merged portions 13A, 14A are exposed from the recesses 152, and (iii) removing the patterned mask layer. Other suitable processes for forming the recesses 152 are within the contemplated scope of the present disclosure.

Figure 9:
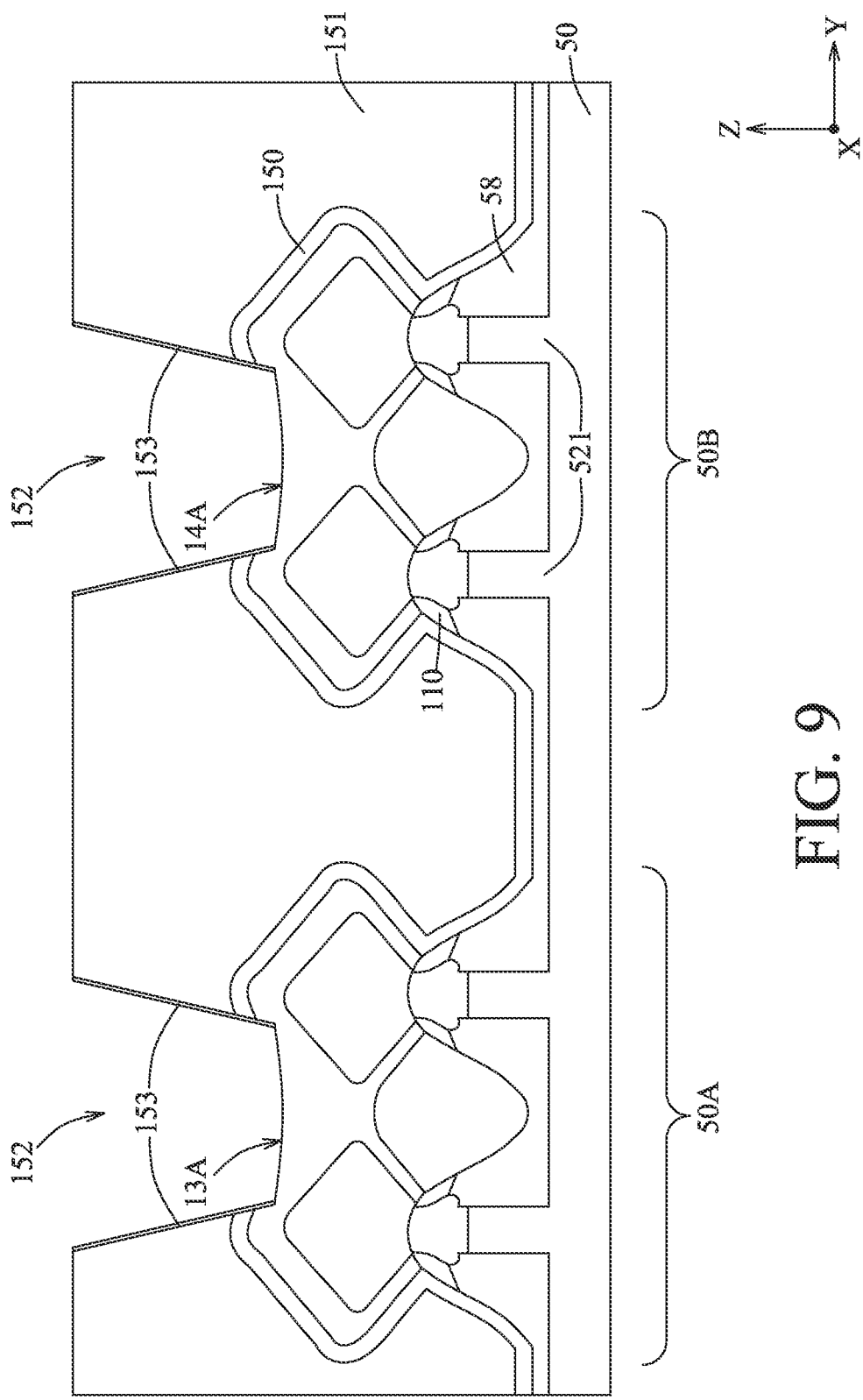

Referring to FIG. 1 and the example illustrated in FIG. 9, the method 200 proceeds to step 206, where a plurality of silicon nitride redeposition (SNR) portions 153 are respectively formed in the recesses 152. FIG. 9 is a view similar to that of FIG. 8, but illustrating the structure after step 206. In some embodiment, step 206 includes (i) conformally forming a SNR layer (not shown) over the structure shown in FIG. 8 using, for example, but not limited to, CVD, and (ii) selectively removing the SNR layer on an upper surface of the ILD layer 151 and on the first and second merged portions 13A, 14A using, for example, but not limited to, antistrophic etching, thereby leaving the SNR portions 153 respectively on inner sidewall surfaces of the recesses 152. The SNR portions 153 are provided to prevent metal plugs 210 (see FIG. 18) from contacting and forming short circuit with the gate electrode 551 shown in FIG. 7. In some embodiments, step 206 may be omitted.

Figure 10:
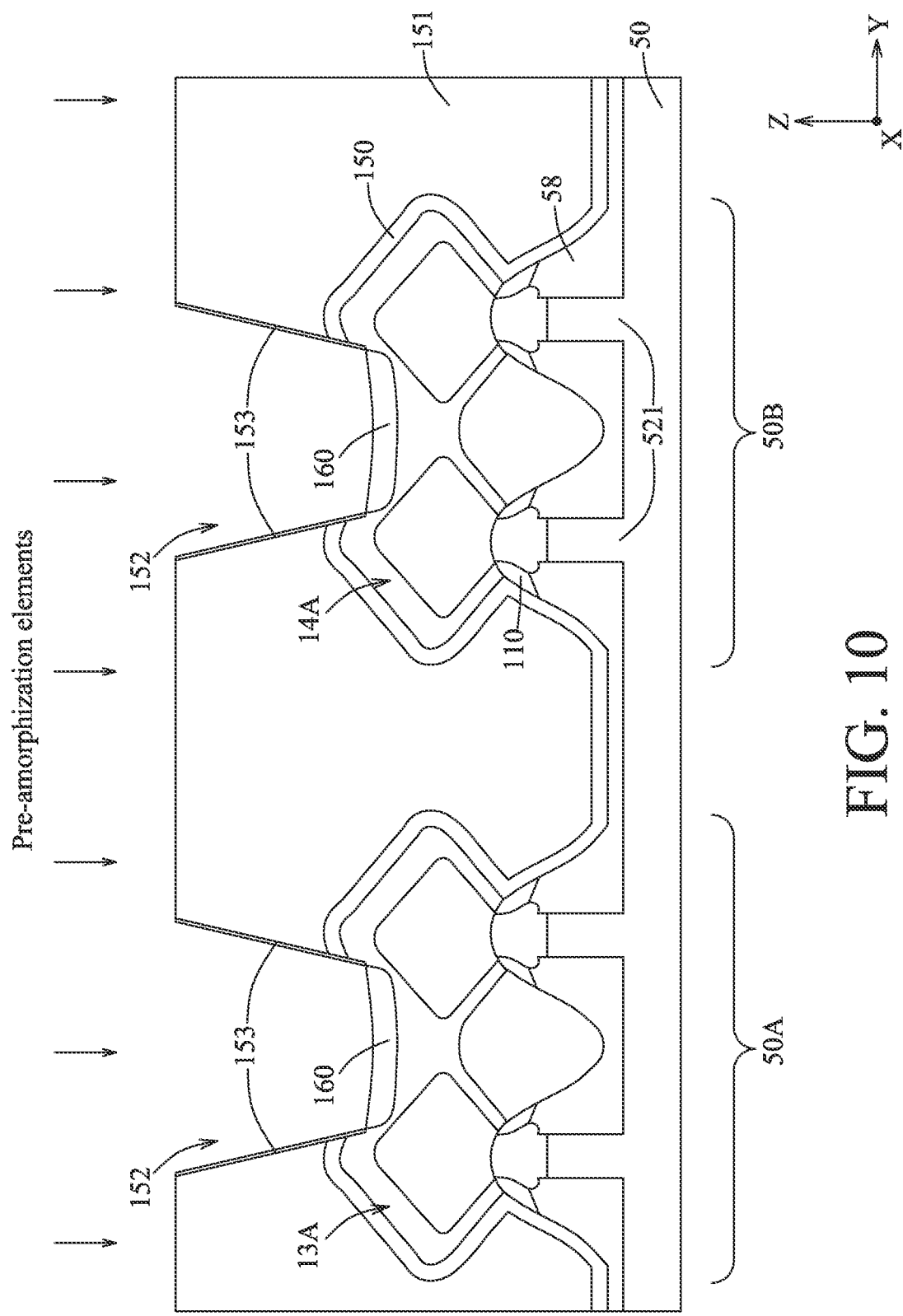

Referring to FIG. 1 and the example illustrated in FIG. 10, the method 200 proceeds to step 207, where the first and second merged portions 13A, 14A are subjected to a pre-amorphization implantation process. FIG. 10 is a view similar to that of FIG. 9, but illustrating the structure after the pre-amorphization implantation process. In some embodiments, step 207 is performed by implanting pre-amorphization elements into an upper region of each the first and second merged portions 13A, 14A which are exposed respectively from the recesses 152 of the n-FET and p-FET portions 50A, 50B. After the pre-amorphization implantation process, a crystalline phase in the upper region of each the first and second merged portions 13A, 14A is transformed into an amorphous phase. Therefore, after step 207, each the first and second merged portions 13A, 14A has an amorphous region 160, which can facilitate reaction between metal elements and silicon elements in each of first and second implanted regions 161, 162 which is formed respectively in the subsequent steps 208 and 209. In some embodiments, the pre-amorphization elements include germanium (Ge), xenon (Xe), bismuth (Bi), or combinations thereof. Other suitable pre-amophization elements are within the contemplated scope of the present disclosure. In some embodiments, step 207 may be omitted.

Figure 11:
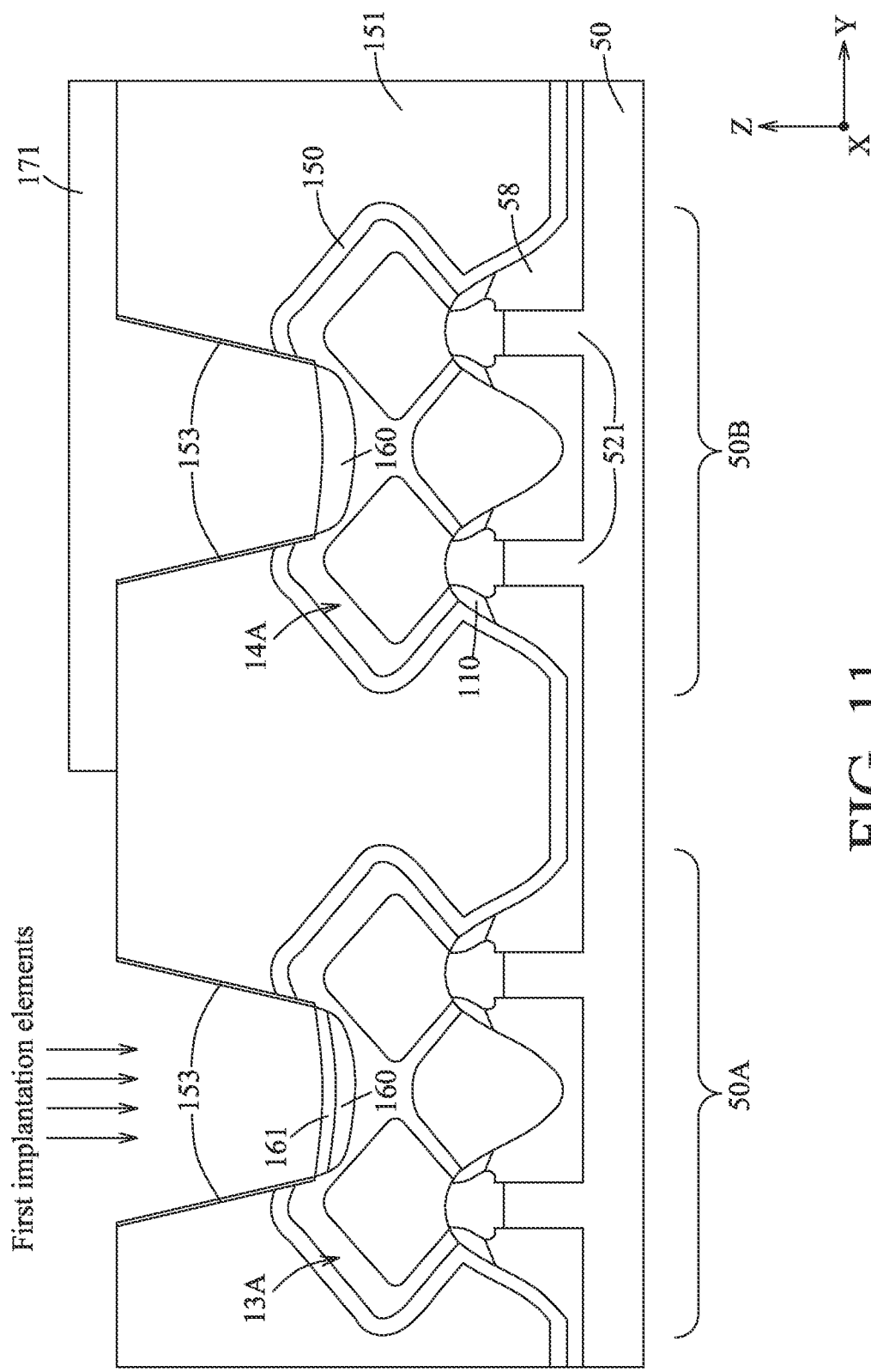

Referring to FIG. 1 and the example illustrated in FIG. 11, the method 200 proceeds to step 208, where the first merged portions 13A (one of which is shown in FIG. 11) are subjected to a first implantation process. FIG. 11 is a view similar to that of FIG. 10, but illustrating the structure after step 208. In some embodiments, step 208 includes (i) forming a first mask layer 171 to cover the p-FET portion 50B, (ii) implanting the upper region of the first merged portion 13A using first implantation elements (i.e., first selected elements), and (iii) removing the first mask layer 171. The first implantation process is used to reduce a Schottky barrier height (SBH) between each metal plug 210 (see FIG. 16) on the n-FET portion 50A and a corresponding one of the first merged portions 13A. In the case that step 207 is omitted, after the first implantation process, each of the first merged portions 13A has a first implanted region 161 which is amorphous. In the case that step 207 is performed, the first implanted region 161 is formed in a corresponding one of the amorphous regions 160 of the n-FET portion 50A, and is also amorphous. In some embodiments, the first implantation elements are implanted to a depth in a Z direction transverse to both the X and Y directions so as to permit the first implanted region 161 to be formed to have a thickness equal to or less than that of the amorphous region 160 of the n-FET portion 50A (formed in step 207). In some embodiments, the thickness of the first implanted region 161 ranges from about 0.5 nm to about 7 nm. In some embodiments, for elements that are relatively heavy, the thickness of the first implanted region 161 may be lesser, for example, ranging from about 0.5 nm to about 5 nm. In some embodiments, step 208 is performed after step 207, whereas in some other embodiments, step 208 may be performed before step 207. Furthermore, in certain embodiments, the pre-amorphization implantation process of step 207 may be performed together with step 208. To be specific, in some embodiments, step 207 may be performed after sub-step (i) and before sub-step (ii) of step 208. In some other embodiments, step 207 may be performed after sub-step (ii) and before sub-step (iii) of step 208. In either cases (step 207 performed before or after sub-step (ii) of step 208), the pre-amorphization elements are implanted into the upper region of the first merged portion 13A, and thus an energy for implanting the pre-amorphization elements into the first merged portion 13A can be adjusted to optimize the electrical performance of the n-FET portion 50A of the semiconductor device.

In some embodiments, the first implantation elements include phosphorus (P), zirconium (Zr), hafnium (Hf), antimony (Sb), cerium (Ce), scandium (Sc), yttrium (Y), ytterbium (Yb), erbium (Er), or combinations thereof. The first implantation elements are provided for reducing the SBH at the n-FET portion 50A, and other suitable implantation elements for reducing the SBH at the n-FET portion 50A are within the contemplated scope of the present disclosure. In some embodiments, an energy for implanting the first implantation elements is lower than an energy for implanting the pre-amorphization elements (i.e., step 207). In some embodiments, the energy for implanting the first implantation elements ranges from about 0.3 keV to about 3 keV. Furthermore, in some embodiments, a dosage for implanting the first implantation elements is higher than a dosage for implanting the pre-amorphization elements (i.e., step 207). In some embodiments, the dosage for implanting the first implantation elements ranges from about 5E14 atoms/cm$^2$ to about 5E16 atoms/cm$^2$. In some embodiments, the dosage for implanting the first implantation elements ranges from about 5E14 atoms/cm$^2$ to about 9E15 atoms/cm$^2$. In addition, in some embodiments, in the first implantation process, an implantation angle for implanting the first implantation elements ranges from about 0 degree to about 45 degree.

In some embodiments, the first mask layer 171 is formed by coating a photoresist layer (not shown) over the structure shown in FIG. 10, soft-baking, exposing the photoresist through a photomask (not shown), post-exposure baking, and developing the photoresist, followed by hard-baking so as to form a patterned photoresist (i.e., the first mask layer 171) on the p-FET portion 50B. In some other embodiments, the patterned photoresist can be replaced by a patterned hard mask. In this case, before coating the photoresist layer, a layer of hard mask (not shown) is formed over the structure shown in FIG. 10, and the patterned photoresist is provided for patterning the hard mask and is removed after obtaining the patterned hard mask.

Figure 12:
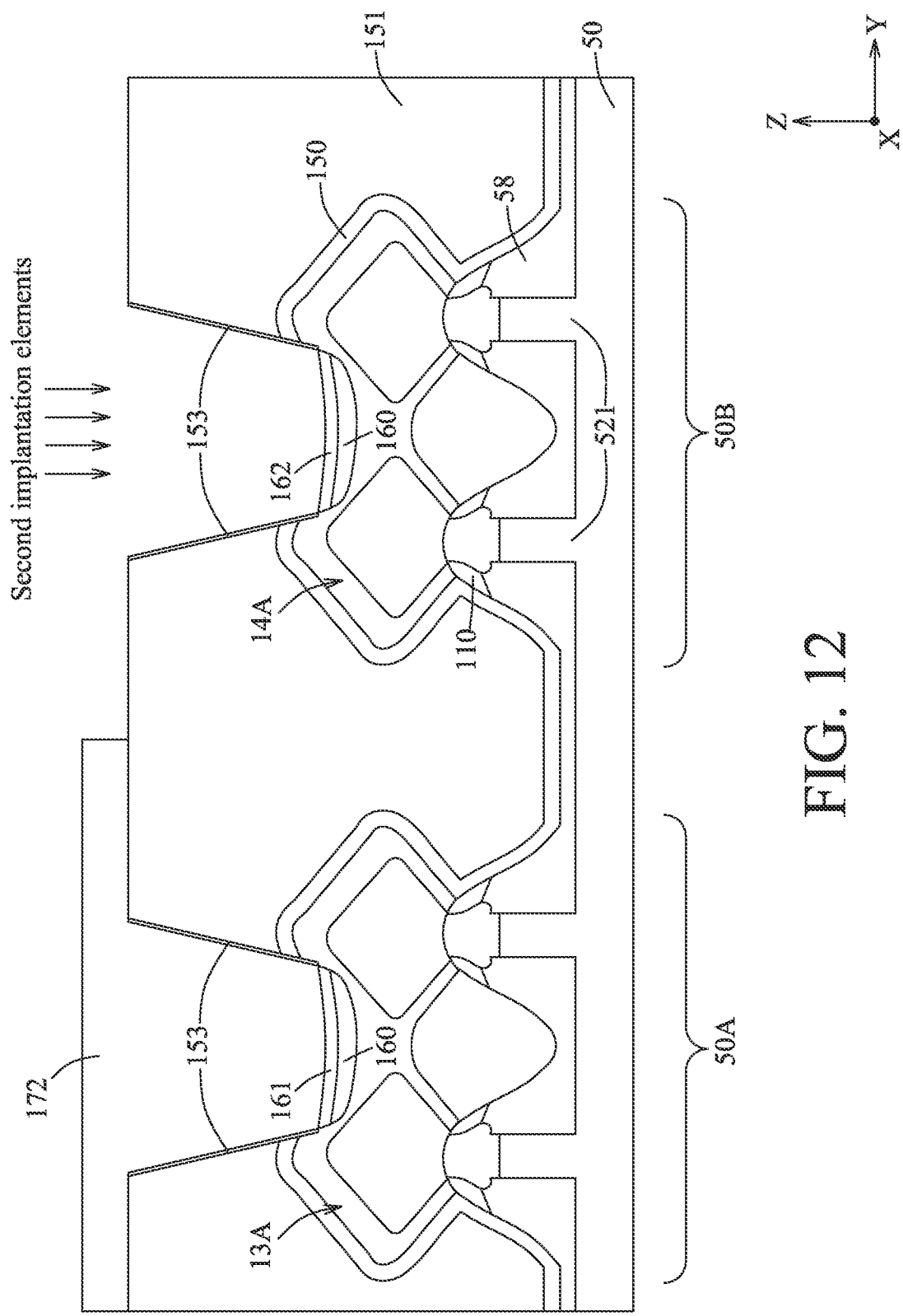

Referring to FIG. 1 and the example illustrated in FIG. 12, the method 200 proceeds to step 209, where the second merged portions 14A (one of which is shown in FIG. 12) are subjected to a second implantation process. FIG. 12 is a view similar to that of FIG. 11, but illustrating the structure after step 209. In some embodiments, step 209 includes (i) forming a second mask layer 172 to cover the n-FET portion 50A, (ii) implanting the upper region of the second merged portions 14A using second implantation elements (i.e., second selected elements), and (iii) removing the second mask layer 172. Since the second mask layer 172 may be formed in a manner similar to that for forming the first mask layer 171 as described in step 208, the details thereof are omitted for the sake of brevity. The second implantation process is used to reduce a Schottky barrier height (SBH) between each metal plug 210 (see FIG. 16) on the p-FET portion 50B and a corresponding one of the second merged portions 14A. In the case that step 207 is omitted, after the second implantation process, each of the second merged portions 14A has a second implanted region 162 which is amorphous. In the case that step 207 is performed, the second implanted region 162 is formed in a corresponding one of the amorphous regions 160 of the p-FET portion 50B, and is also amorphous. In some embodiments, the second implantation elements are implanted to a depth in the Z direction so as to permit the second implanted region 162 to be formed to have a thickness equal to or less than that of the amorphous region 160 of the p-FET portion 50B (formed in step 207). In some embodiments, the thickness of the second implanted region 162 ranges from about 0.5 nm to about 7 nm. In some embodiments, for elements that are relatively heavy, the thickness of the second implanted region 162 may be lesser, for example, ranging from about 0.5 nm to about 5 nm. In some embodiments, step 209 is performed after steps 207 and 208, whereas in some other embodiments, step 209 may be performed before or after each of steps 207 and 208.

Furthermore, in certain embodiments, the pre-amorphization implantation process of step 207 may be performed together with step 209. To be specific, in some embodiments, step 207 may be performed after sub-step (i) and before sub-step (ii) of step 209. In some other embodiments, step 207 may be performed after sub-step (ii) and before sub-step (iii) of step 209. In either cases (step 207 performed before or after sub-step (ii) of step 209), the pre-amorphization elements are implanted into the upper region of the second merged portion 14A, and thus an energy for implanting the pre-amorphization elements into the second merged portion 13A can be adjusted to optimize the electrical performance of the p-FET portion 50B of the semiconductor device.

In some embodiments, the second implantation elements include boron (B), aluminum (Al), gallium (Ga), indium (In), germanium (Ge), tin (Sn), molybdenum (Mo), platinum (Pt), nickel (Ni), cobalt (Co), ruthenium (Ru), or combinations thereof. The second implantation elements are provided for reducing the SBH at the p-FET portion 50B, and other suitable implantation elements for reducing the SBH at the p-FET portion 50B are within the contemplated scope of the present disclosure. In some embodiments, an energy for implanting the second implantation elements is lower than an energy for implanting the pre-amorphization elements (i.e., step 207). In some embodiments, the energy for implanting the second implantation elements ranges from about 0.3 keV to about 3 keV. Furthermore, in some embodiments, a dosage for implanting the second implantation elements is higher than a dosage for implanting the pre-amorphization elements (i.e., step 207). In some embodiments, the dosage for implanting the second implantation elements ranges from about 5E14 atoms/cm$^2$ to about 5E16 atoms/cm$^2$. In some embodiments, the dosage for implanting the second implantation elements ranges from about 1E15 atoms/cm$^2$ to about 5E16 atoms/cm$^2$. In addition, in some embodiments, in the second implantation process, an implantation angle for implanting the second implantation elements ranges from about 0 degree to about 45 degree.

Figure 14:
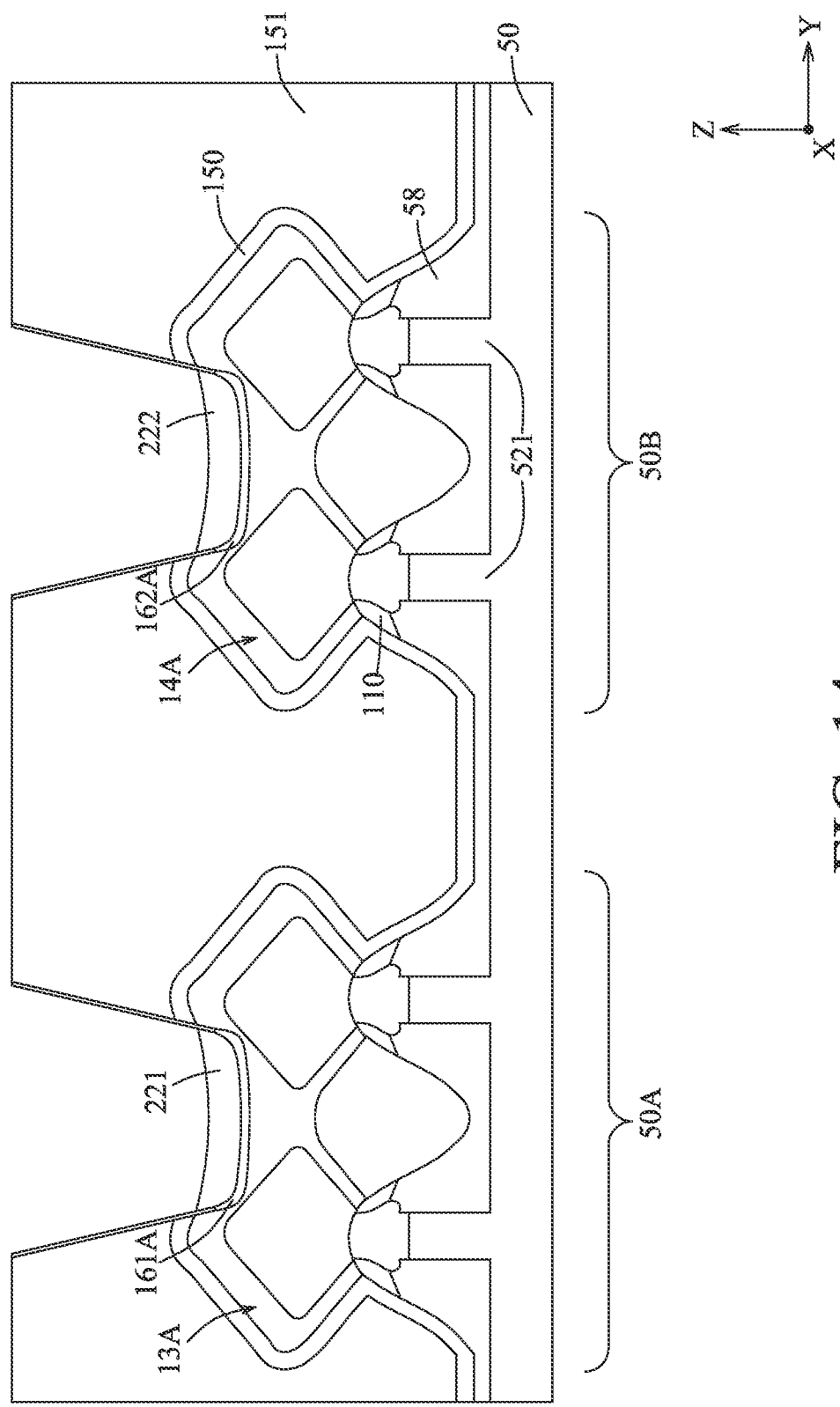

Please note that the pre-amorphization implantation process is performed to damage the upper regions of the first and second merged portions 13A, 14A, so as to facilitate formation of first and second metal silicide layers 221, 222 (see FIG. 14). In some embodiments, the first implantation process for reducing the SBH at the n-FET portion 50A, and the second implantation process for reducing the SBH at the p-FET portion 50B are also performed to damage the upper regions of the first and second merged portions 13A, 14A, respectively, and therefore, the pre-amorphization implantation process can be omitted.

Figure 13:
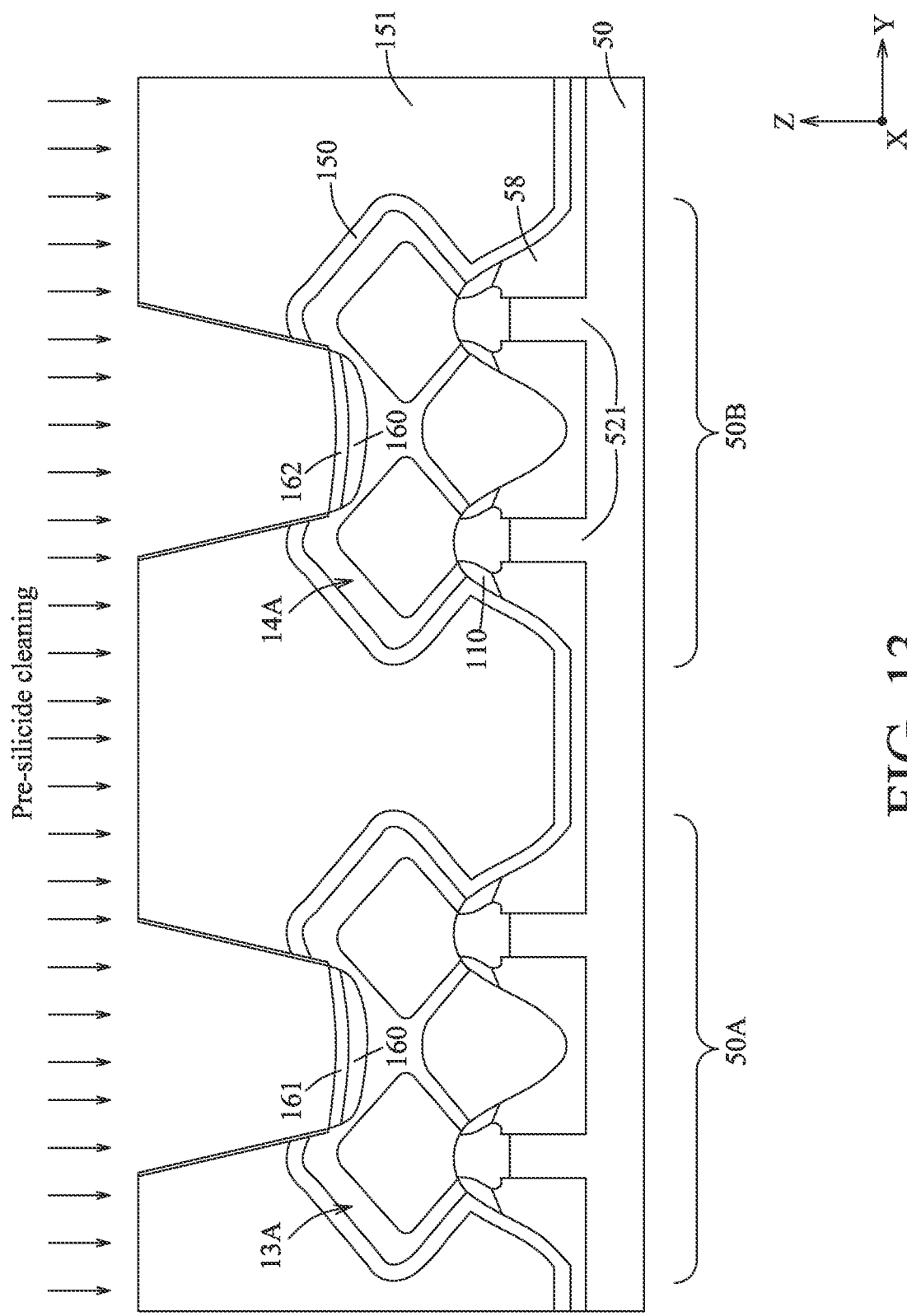

Referring to FIG. 1 and the example illustrated in FIG. 13, the method 200 proceeds to step 210, where a pre-silicide cleaning process is performed to remove any undesired materials remaining on the structure shown in FIG. 13 and those remaining in the recesses 152. FIG. 13 is a view similar to that of FIG. 12, but illustrating the structure after step 210. In some embodiments, the pre-silicide cleaning process may be performed using, for example, a hydrofluoric acid (HF) based solution, or a fluoride-containing gas. Other suitable cleaning processes are within the contemplated scope of the present disclosure.

Referring to FIG. 1 and the examples illustrated in FIGS. 13 and 14, the method 200 proceeds to step 211, where a metal deposition process is performed on the structure shown in FIG. 13. FIG. 14 is a view similar to that of FIG. 13, but illustrating the structure after step 211. After the metal deposition process, (i) first metal silicide layers 221 (one of which is shown) are respectively formed on remaining regions of the first merged portions 13A, (ii) second metal silicide layers 222 (one of which is shown) are respectively formed on remaining regions of the second merged portions 14A, (iii) first transition layers 161A (one of which is shown) are each formed between a corresponding one of the first metal silicide layers 221 and a corresponding one of the remaining regions of the first merged portion 13A, and (iv) second transition layers 162A (one of which is shown) are each formed between a corresponding one of the second metal silicide layers 222 and a corresponding one of the remaining region of the second merged portion 14A. The first and second transition layers 161A, 162A respectively include the first and second implantation elements. An atomic concentration of the first implantation elements in the first transition layers 161A is higher than that in each of the first metal silicide layers 221 and the remaining regions of the first merged portions 13A. An atomic concentration of the second implantation elements in the second transition layers 162A is higher than that in each of the second metal silicide layers 222 and the remaining regions of the second merged portions 14A. In some embodiments, the atomic concentration of the first implantation elements in the first transition layers 161A is higher than that in each of the first metal silicide layers 221 and the remaining regions of the first merged portions 13A by about 0.5% to about 35%. In some embodiments, the atomic concentration of the second implantation elements in the second transition layers 162A is higher than that in each of the second metal silicide layers 222 and the remaining regions of the second merged portions 14A by about 0.5% to about 35%. In some embodiments, each the first and second transition layers 161A, 162A independently has a thickness ranging from one atomic layer to three atomic layers. In some embodiments, the thickness of each the first and second transition layers 161A, 162A independently ranges from about 0.3 nm to about 5 nm.

In some embodiments, step 211 includes (i) depositing metal elements (not shown) over the structure shown in FIG. 13 at a relatively high temperature to permit silicon elements in the first and second implanted regions 161, 162 (and the amorphous region 160, if any) to diffuse and react with the metal elements so as to form the first and second metal silicide layers 221, 222 respectively on the remaining regions of the first and second merged portions 13A, 14A, and (ii) removing unreacted metal elements (if any). In step 211, during the time period when the silicon elements in the first and second implanted regions 161, 162 are driven to diffuse and react with the metal elements to form the first and second silicide layers 221, 222, the first implantation elements in each of the first implanted regions 161 are simultaneously separated from the silicon elements in the first implanted regions 161 to form the first transition layer 161A (which may be also called as a segregation layer) between each of the first metal silicide layers 221 and a corresponding one of the remaining regions of the first merged portions 13A, and the second implantation elements in each of the second implanted regions 162 are simultaneously separated from the silicon elements in the second implanted regions 162 to form the second transition layer 162A (which may be also called as a segregation layer) between each of the second metal silicide layers 222 and a corresponding one of the remaining regions of the second merged portions 14A. In this case, since the silicon elements in the first and second implanted regions 161, 162 can diffuse to react with the metal elements during the aforesaid time period, silicon elements in the upper regions of the first and second merged portions 13A, 14A, which are damaged in the pre-amorphization implantation process and in the first and second implantation processes, may be mostly consumed in step 211. As such, a further annealing process for recovering the damaged upper regions of the first and second merged portions 13A, 14A may be omitted. In other cases, a further annealing process may be performed to ensure recovery of the damaged upper regions of the first and second merged portions 13A, 14A. In some embodiments, the metal elements include titanium (Ti), nickel (Ni), cobalt (Co), ruthenium (Ru), molybdenum (Mo), or combinations thereof. Other suitable materials for the metal elements are within the contemplated scope of the present disclosure.

In some other embodiments, step 211 includes (i) depositing a metal film (not shown, including the aforesaid metal elements) over the structure shown in FIG. 13 at a relatively low temperature (for example, but not limited to, a room temperature), (ii) performing a thermal treatment (for example, but not limited to, an annealing process) to permit the silicon elements in the first and second implanted regions 161, 162 to diffuse and react with the metal elements in the metal film so as to form the first and second metal silicide layers 221, 222, and (iii) removing unreacted portions of the metal film. Similarly, in this case, the first implantation elements, which remain in between each of the first metal silicide layers 221 and a corresponding one of the remaining regions of the first merged portions 13A, form the first transition layer 161A, and the second implantation elements, which remain in between each of the second metal silicide layers 222 and a corresponding one of the remaining regions of the second merged portions 14A, form the second transition layer 162A.

Figure 15:
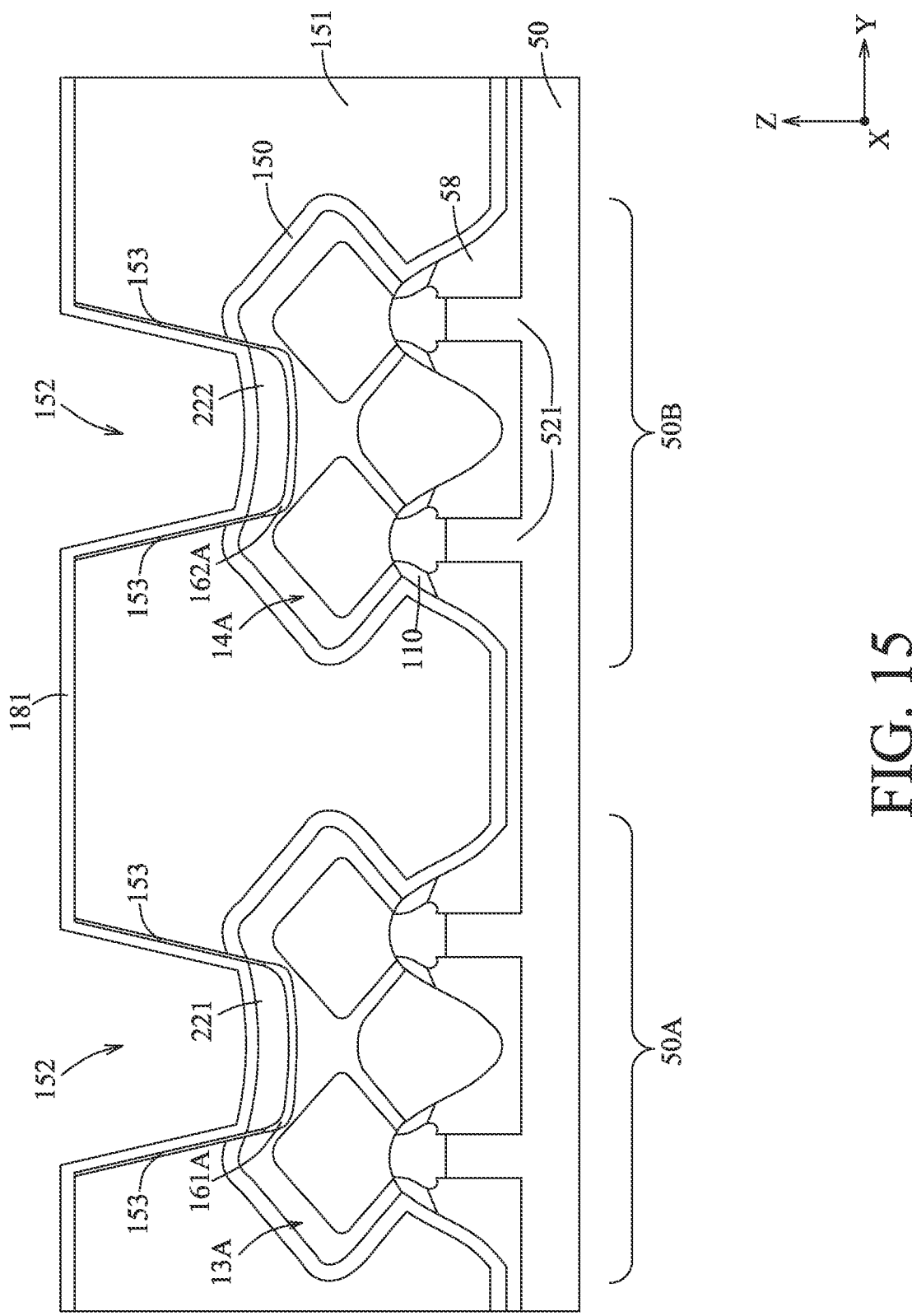

Referring to FIG. 1 and the examples illustrated in FIGS. 14 and 15, the method 200 proceeds to step 212, where a metal capping layer 181 is formed over the structure shown in FIG. 14. FIG. 15 is a view similar to that of FIG. 14, but illustrating the structure after step 212. In some embodiments, the metal capping layer 181 is formed using a blanket deposition process such as CVD, HDPCVD, SACVD, MLD, or PVD. In some embodiments, the metal capping layer 181 includes titanium nitride (TiN), titanium silicon nitride (TiSiN), or a combination thereof. Other suitable processes and materials for forming the metal capping layer 181 are within the contemplated scope of the present disclosure.

Figure 16:
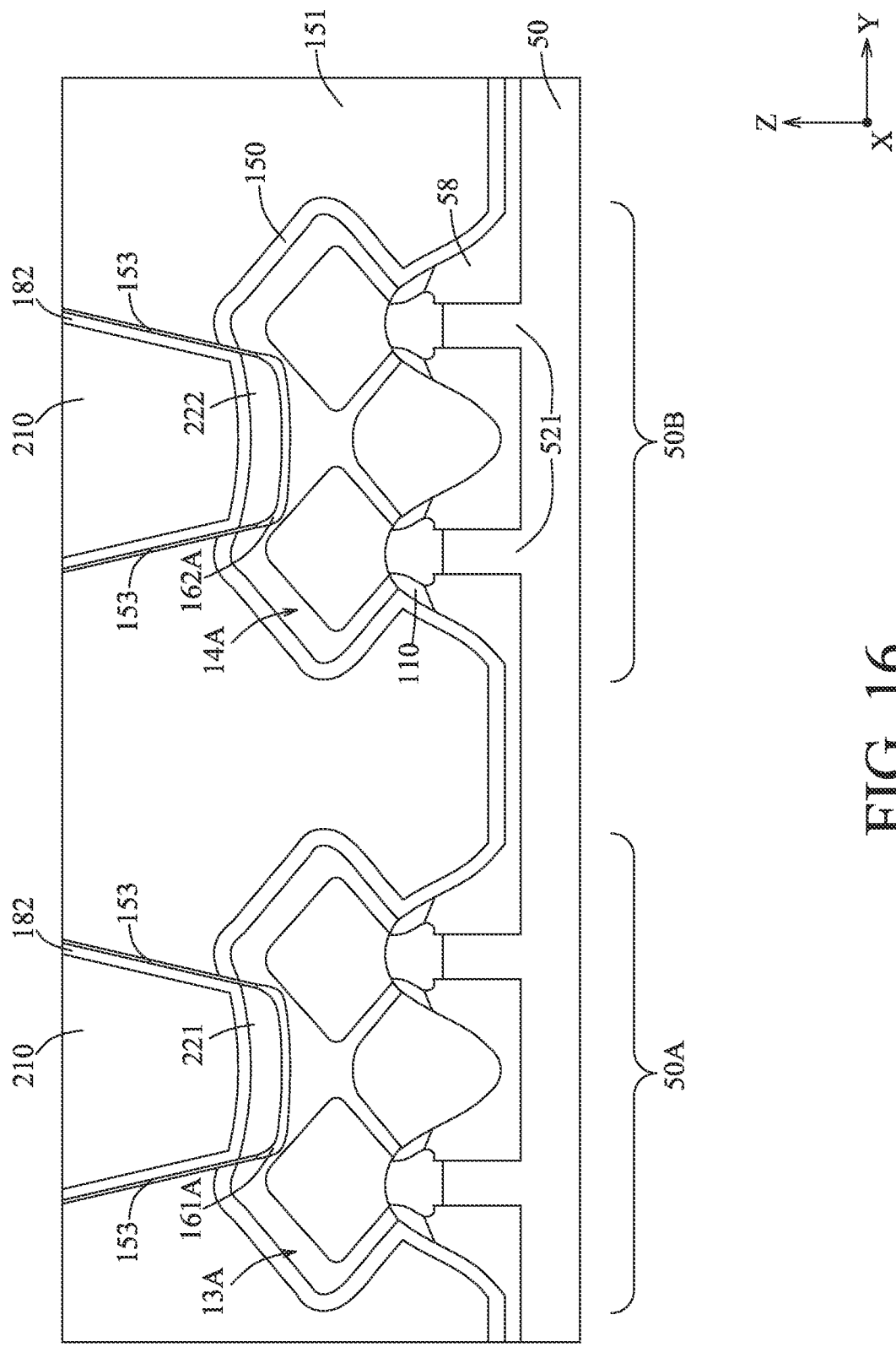

Referring to FIG. 1 and the examples illustrated in FIGS. 15 and 16, the method 200 proceeds to step 213, where a plurality of the metal plugs 210 are formed to fill the recesses 152, respectively. FIG. 16 is a view similar to that of FIG. 15, but illustrating the structure after step 213. In some embodiments, step 213 includes (i) depositing a metal layer (not shown) over the metal capping layer 181 to fill the recesses 152 shown in FIG. 15, and (ii) removing an excess of the metal layer and an excess of the metal capping layer 181 using, for example, but not limited to, CMP, to expose the ILD layer 151. After step 213, the metal layer is formed into the metal plugs 210, and the metal capping layer 181 is formed into a plurality of barrier portions 182 each surrounding a corresponding one of the metal plugs 210 so as to prevent metal ions in the metal plugs 210 from diffusing into the ILD layer 151 and the first and second merged portions 13A, 14A. In some embodiments, the metal plugs 210 include cobalt (Co), copper (Cu), ruthenium (Ru), tungsten (W), or combinations thereof. Other suitable materials for the metal plugs 210 are within the contemplated scope of the present disclosure.

In the above embodiments, each of the first transition layers 161A is formed between a corresponding one of the source/drain portion 13 (or 13A) and a corresponding one of the metal plugs 210 formed at a front side of the semiconductor substrate 50, and each of the second transition layers 162A is formed between a corresponding one of the source/drain portion 14 (or 14A) and a corresponding one of the metal plugs 210 formed at the front side of the semiconductor substrate 50. In some other embodiments, each of the first transition layers 161A is formed between a corresponding one of the source/drain portion 13 (or 13A) and a corresponding one of backside vias 73 (see FIG. 51) formed at a back side of the semiconductor substrate 50 (FIG. 16), and each of the second transition layers 162A is formed between a corresponding one of the source/drain portion 14 (or 14A) and a corresponding one of the backside vias 73 formed at the back side of the semiconductor substrate 50.

FIG. 17 is a partially enlarged view of the n-FET portion 50A of the semiconductor device obtained after step 213 in accordance with some embodiments. FIG. 18 is a partially enlarged view of the p-FET portion 50B of the semiconductor device obtained after step 213 in accordance with some embodiments. In some other embodiments, the two adjacent ones of the first source/drain portions 13 at the n-FET portion 50A are not merged (see FIG. 19, only one of the first source/drain portions 13 is shown), and the two adjacent ones of the second source/drain portions 14 at the p-FET portion 50B are not merged (see FIG. 20, only one of the second source/drain portions 14 is shown).

Figure 21:
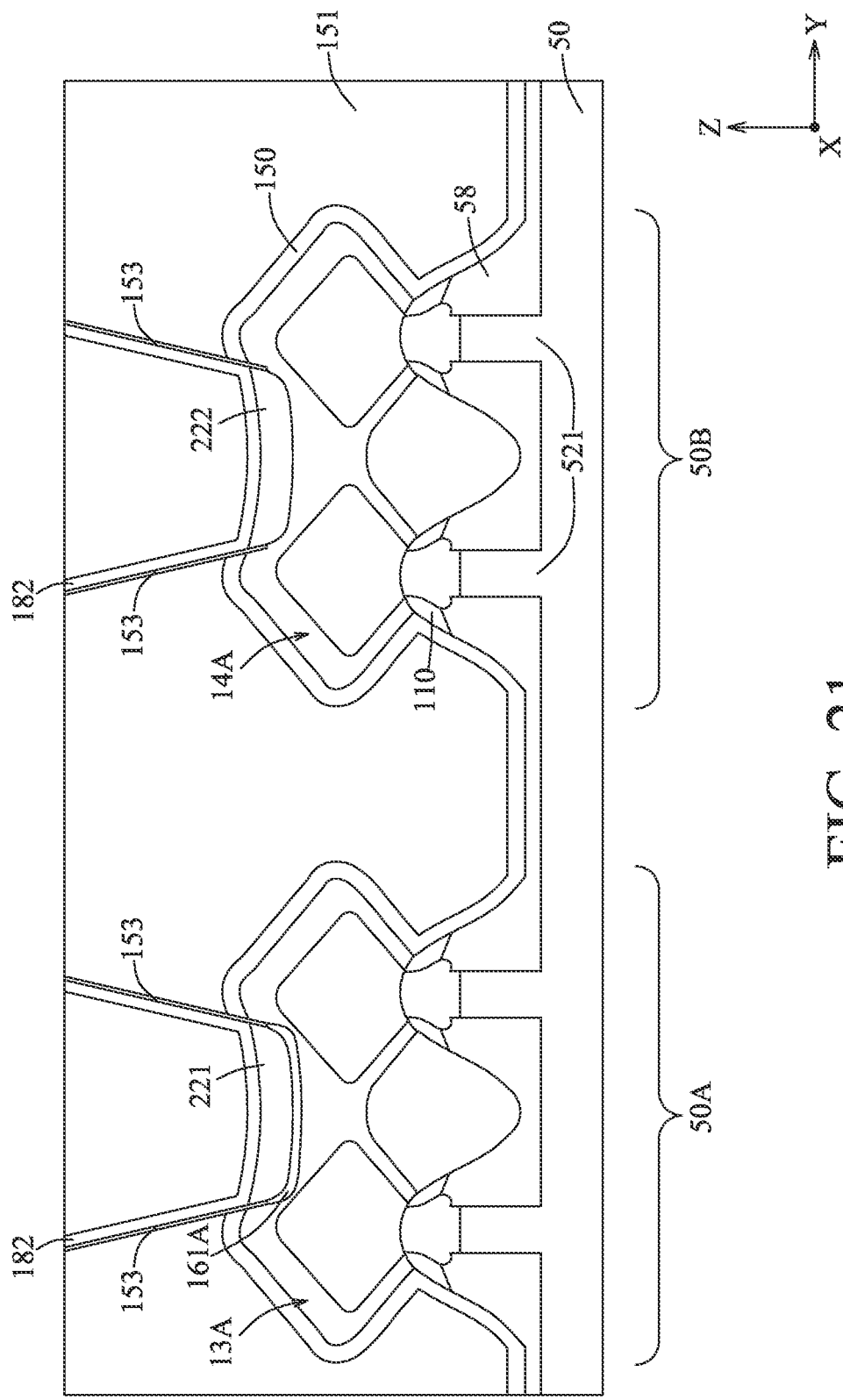
FIGS. 21 to 23 are schematic views illustrating variations of the semiconductor device in accordance with some embodiments.
Figure 22:
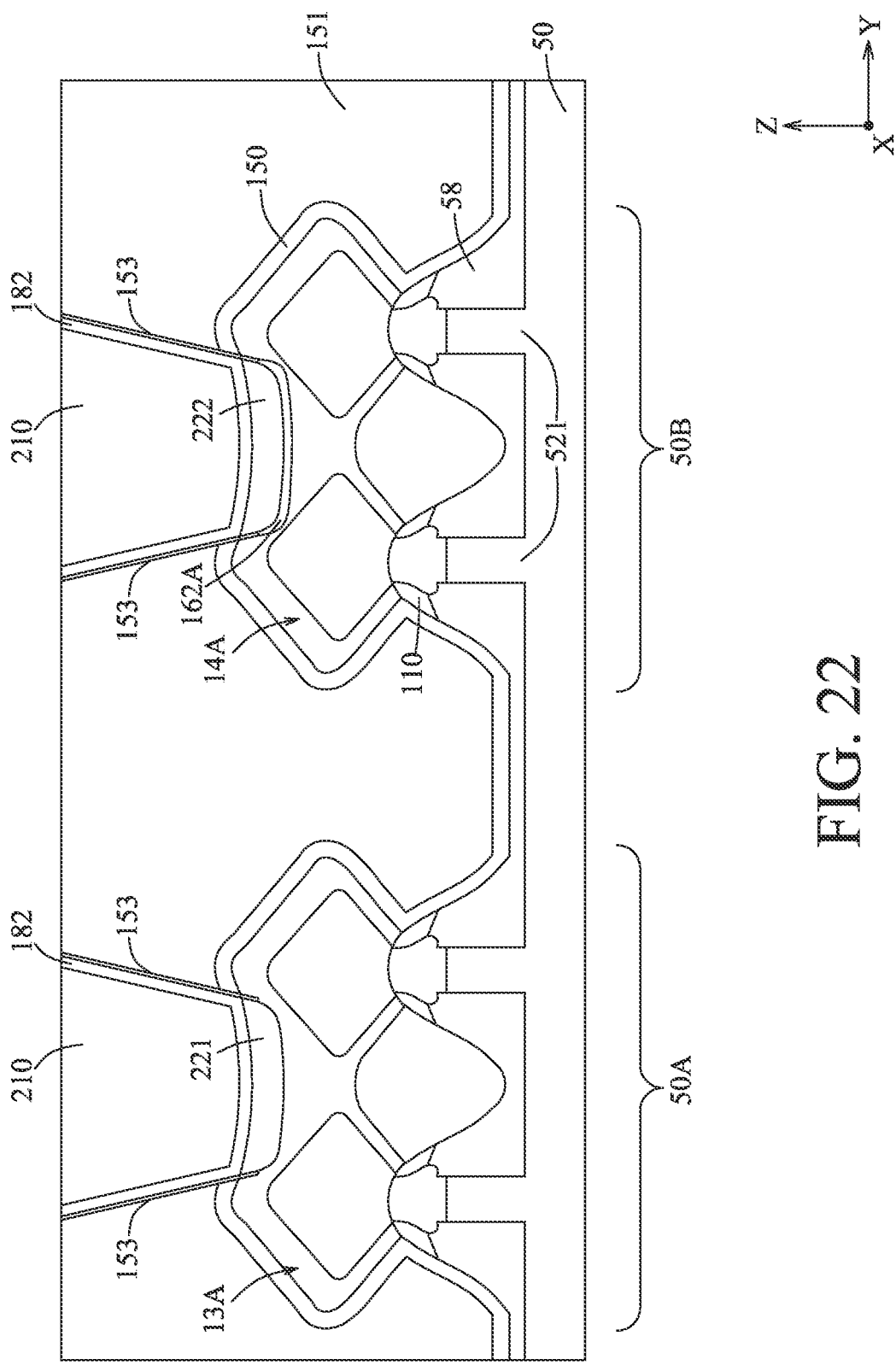
Figure 23:
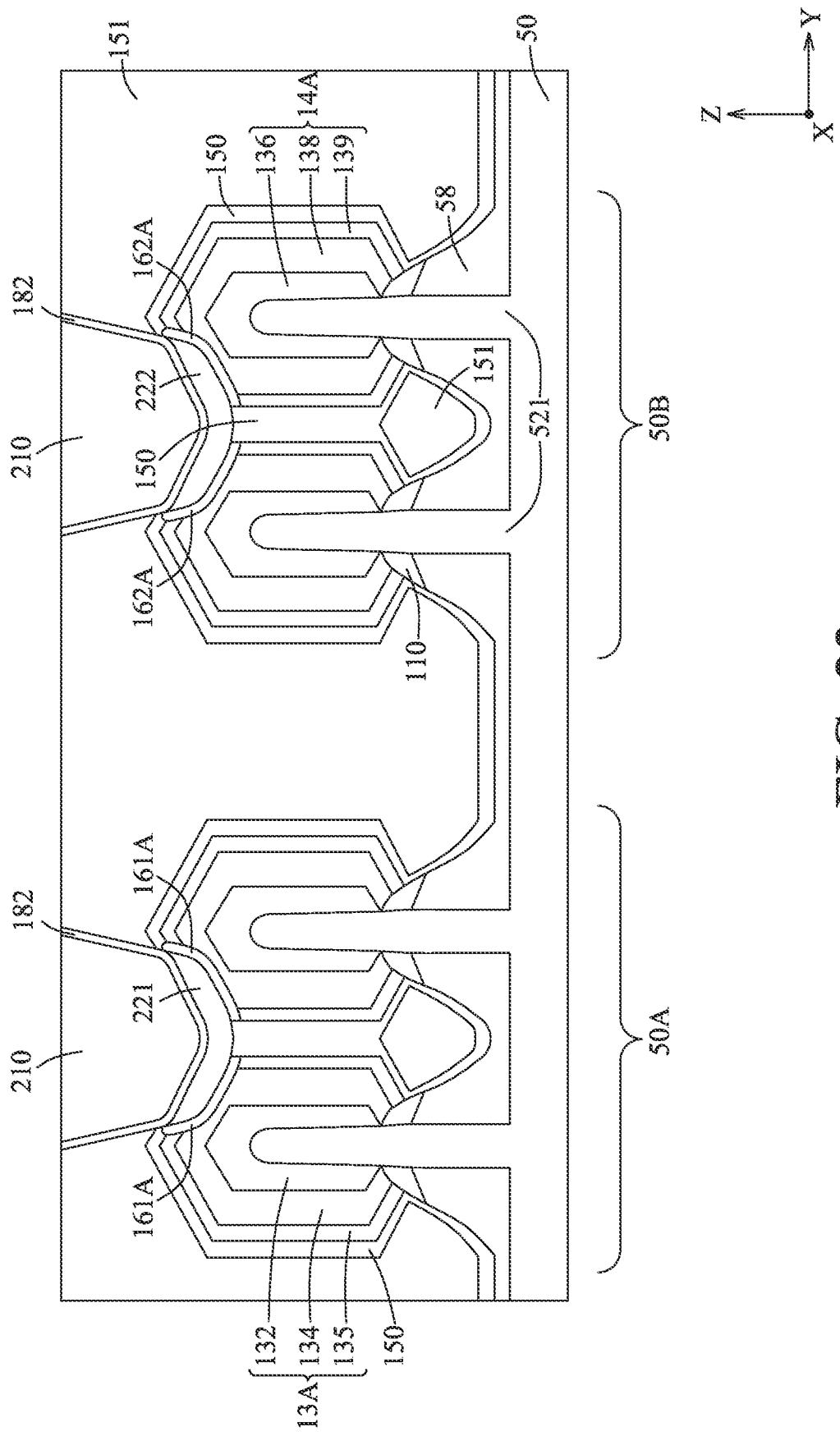

In some embodiments, some steps in the method 200 may be modified, replaced, or eliminated without departure from the spirit and scope of the present disclosure. For example, based on requirements, when the second implantation process (i.e., step 209) is omitted, a semiconductor device shown in FIG. 21 is obtained. When the first implantation process (i.e., step 208) is omitted, a semiconductor device shown in FIG. 22 is obtained. When the first and second merged portions 13A, 14A have a different shape or configuration (which may be varied based on designs or materials), a semiconductor device shown in FIG. 23 is obtained.

Figure 24:
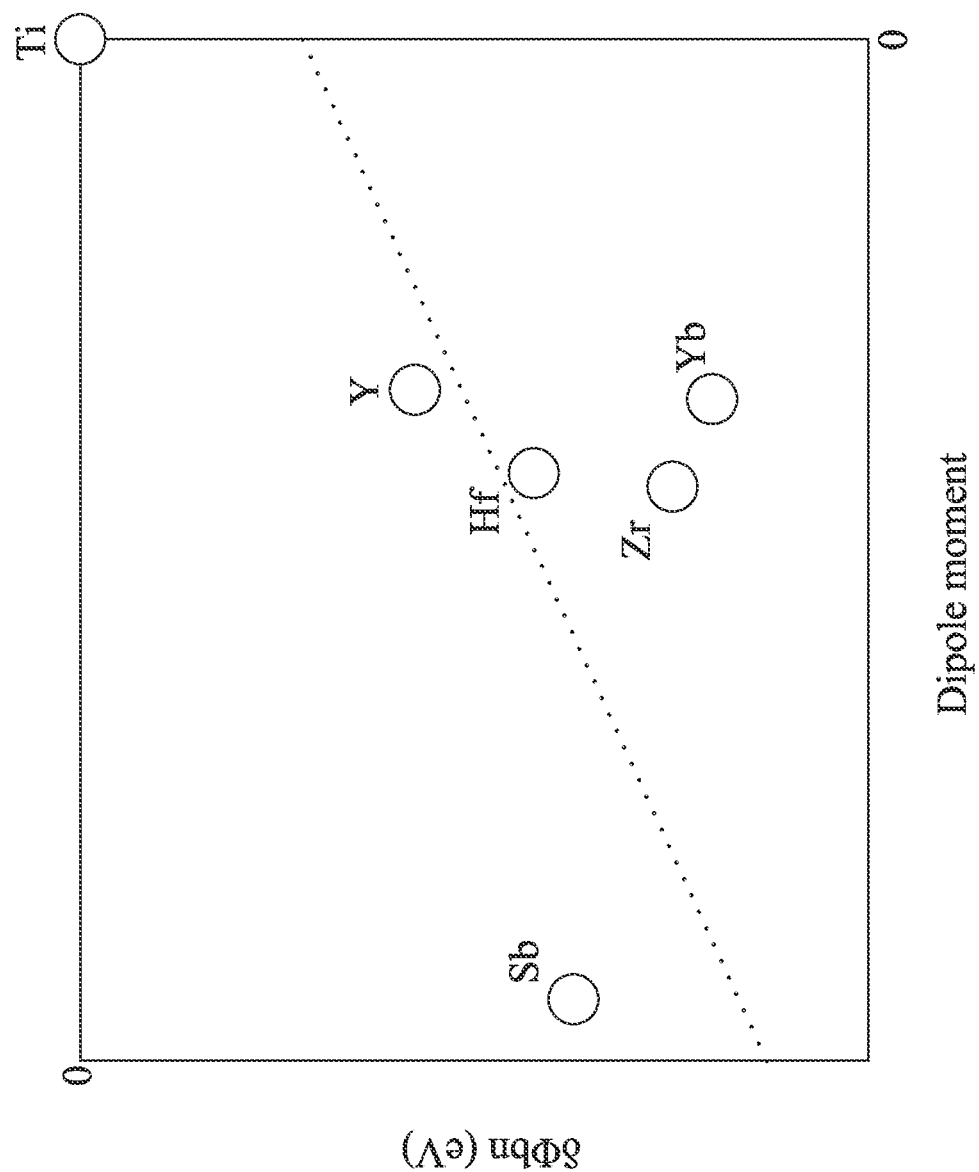
FIG. 24 is a graph illustrating a relationship between a simulated reduction of SBH ($\delta\Phi bn$) at the n-FET portion and a dipole moment for examples cases of semiconductor devices having different first implantation elements in accordance with some embodiments.
Figure 25:
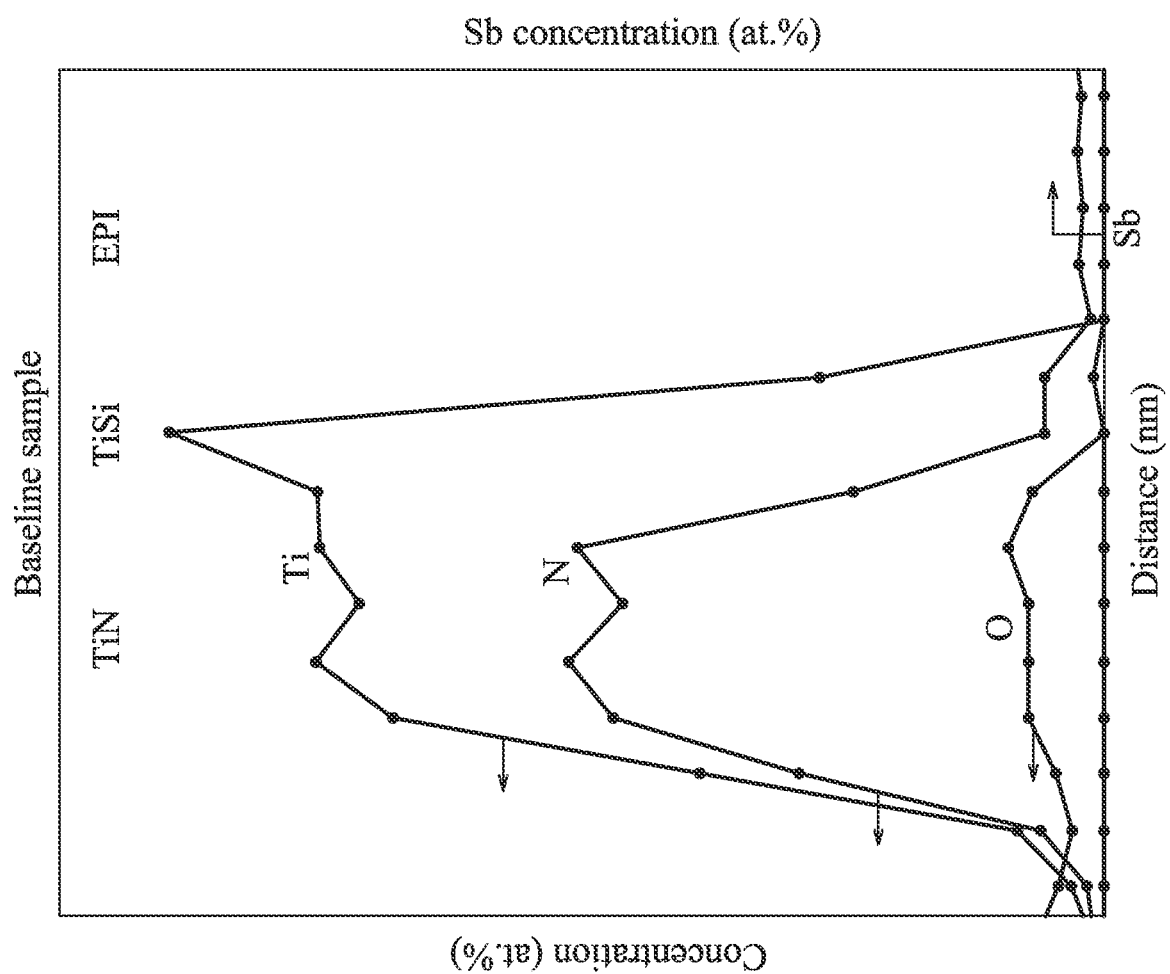
FIGS. 25 to 28 are graphs respectively illustrating atomic probe tomography (APT) results for a baseline sample and Samples A to C of semiconductor devices in accordance with some embodiments.
Figure 26:
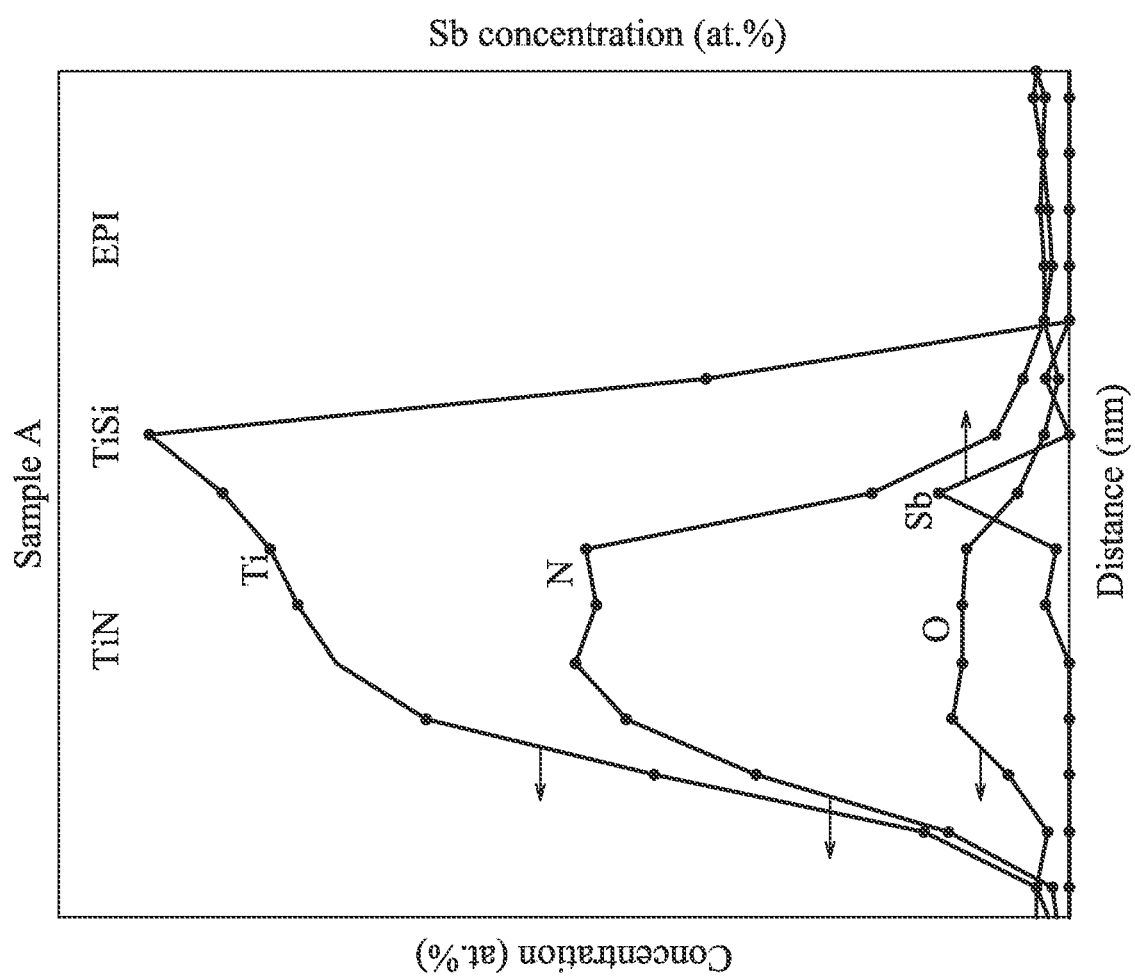
Figure 27:
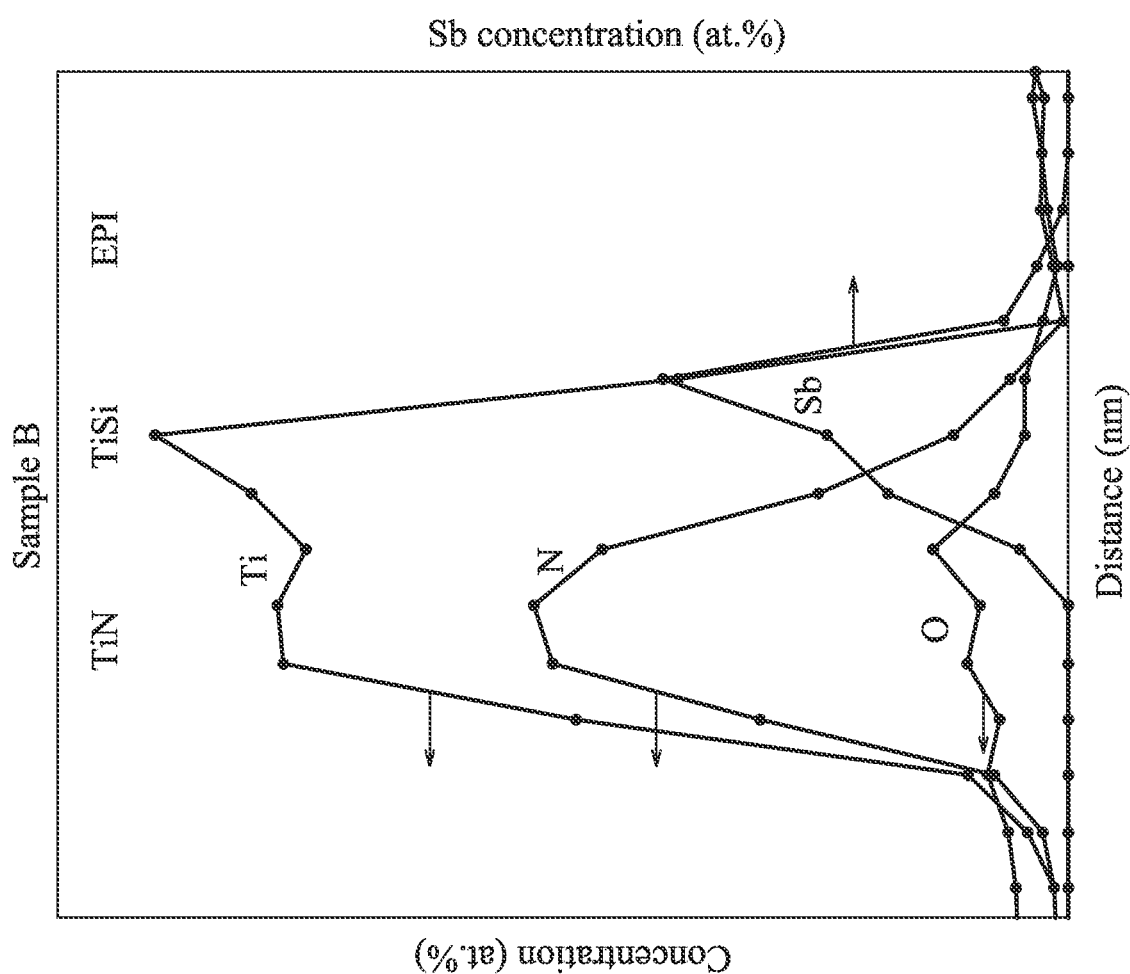
Figure 28:
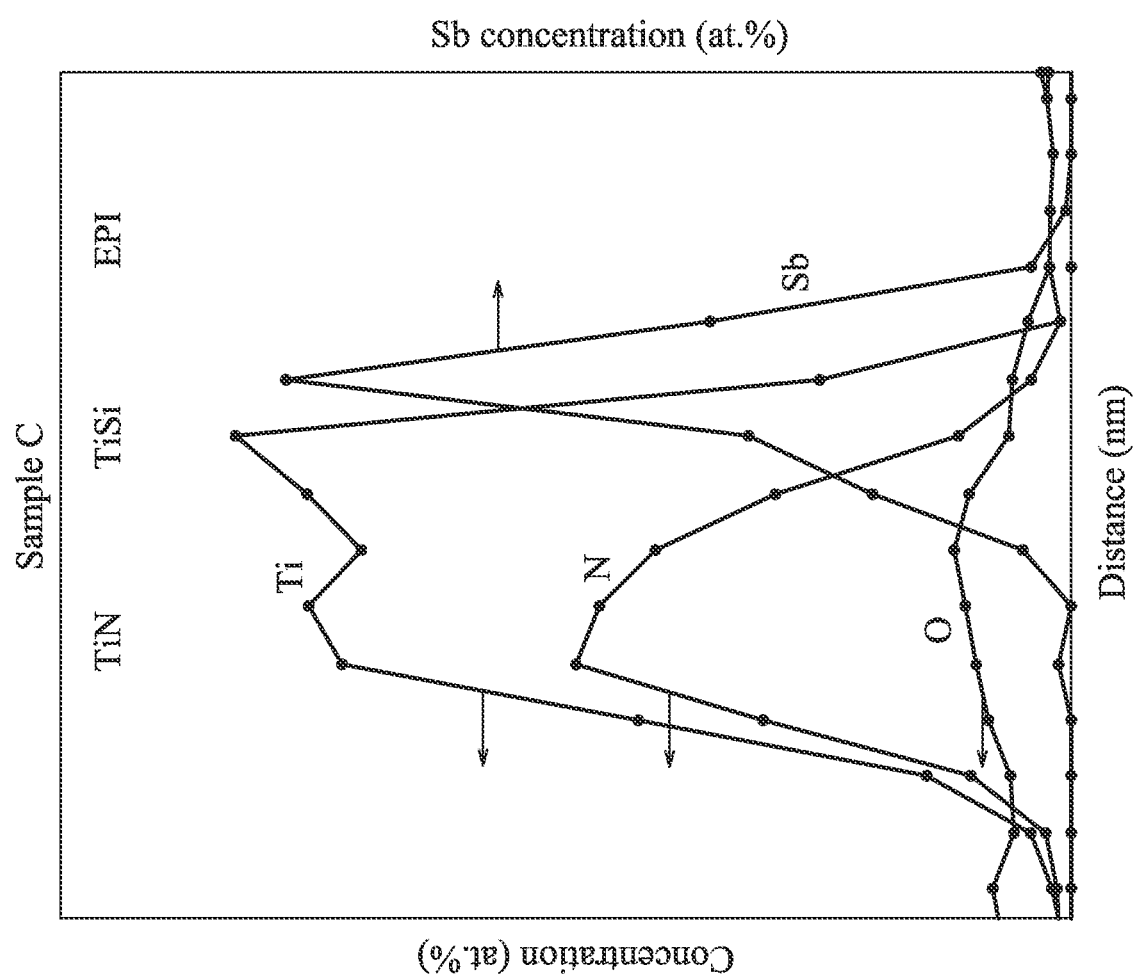

FIG. 24 is a graph illustrating a relationship between a simulated reduction of SBH ($\delta\Phi bn$) at the n-FET portion 50A and a dipole moment for examples cases of semiconductor devices having different first implantation elements in accordance with some embodiments. In each of the example cases, the semiconductor device has a configuration similar to that of the n-FET portion 50A shown in FIG. 17 or 19, and is made using a method similar to the method 200. In FIG. 24, the symbol "Ti" is shown to represent the properties of a baseline case in which the first implantation element is not introduced (i.e., step 208 is omitted), and the symbols "Zr," "Hf," "Sb," "Y," and "Yb" are shown to respectively represent properties of the the example cases which includes different first implantation elements. For example, the symbol "Zr" is shown to represent the properties where the first implantation elements are zirconium (Zr). The reduction of SBH ($\delta\Phi bn$) in each of the example cases is obtained by subtracting the SBH of the baseline case from the SBH of each of the example cases. In other words, the lower the value of $\delta\Phi bn$, the more the reduction of the SBH is. In FIG. 24, the values of $\delta\Phi bn$ in the example cases are all negative, indicating that the first implantation elements are effective for reducing SBH. In addition, the value of the dipole moment is obtained by subtracting the dipole moment of the baseline case from the dipole moment of each of the example cases. The example cases have a relatively lower dipole moment relative to that of the baseline case, and the values of the dipole moment in the example cases are all negative. It can be seen that the reduction of the SBH at the n-FET portion 50A has some correlation with the dipole moment. Since Rscd is positively correlated to the SBH value, it is believed that introduction of the first transition layers 161A including the first implantation elements as described above will result in a relatively lower Rcsd value.

FIG. 25 to 28 are graphs respectively illustrating atomic probe tomography (APT) results for a baseline sample and Samples A to C of semiconductor devices in accordance with some embodiments. Each of Samples A to C may have a configuration similar to that of the n-FET portion 50A shown in FIG. 17 or 19. In FIGS. 25 to 28, signals of titanium (Ti), nitride (N), oxygen (O), and antimony (Sb) are shown, while signals of other elements (e.g., Si elements) are omitted. For the APT analysis, the first implantation elements are Sb elements, the first metal silicide layers 221 are made of titanium silicide, and the barrier portions 182 are made of TiN. A respective one of Samples A, B and C is prepared by a method similar to the method 200, and Samples A, B and C are subjected to the first implantation process with different implantation dosages. For Sample B, a dosage of the first implantation elements is higher than that of Sample A. For Sample C, a dosage of the first implantation elements is even higher than that of Sample B. The baseline sample is made in a manner similar to the method 200 but without the first merged portions 13A being subjected to the first implantation process (i.e., step 208 is omitted). In each of FIGS. 25 to 28, a distance range (position) of the source/drain portion 13 (or 13A) is represented by "EPI," a distance range (position) of the first metal silicide layer 221 is represented by "TiSi," and a distance range (position) of the barrier portion 182 is represented by "TiN." It can be seen that the Sb signals of the first implantation elements in Samples A, B, and C are detected and identified in APT analysis. Furthermore, an atomic concentration of the Sb in Sample B is higher than that of Sample A, and the atomic concentration of the Sb in Sample C is even higher than that of Sample B. Moreover, as the atomic concentration of the Sb increases to an extent (Samples B and C), the Sb tends to pile up to form the first transition layer 161A between the TiSi portion (i.e., the first metal silicide layers 221) and the EPI portion (i.e., the source/drain portion 13 or 13A). It is believed that when an atomic concentration of the second implantation elements increases to an extent, the second transition layer 162A can be formed at the p-FET portion 50B between the second metal silicide layer 222 and the source/drain portion 14 or 14A.

Figure 29:
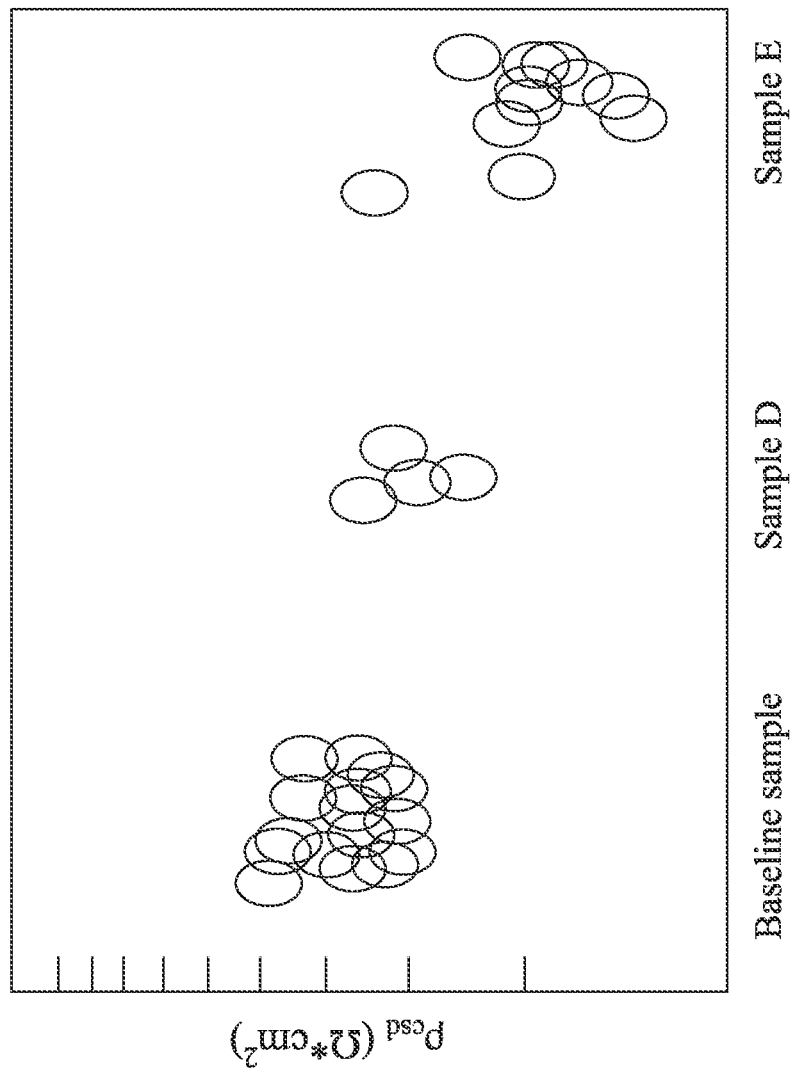
FIG. 29 is a scatter plot illustrating source/drain contact resistivity ($\rho_{csd}$) for a baseline sample and Samples D and E of semiconductor devices in accordance with some embodiments.

FIG. 29 is a scatter plot illustrating source/drain contact resistivities ($\rho_{csd}$) for a baseline sample and Samples D and E of semiconductor devices in accordance with some embodiments. The source/drain contact resistivity ($\rho_{csd}$) is a specific contact resistivity between the source/drain portion 13 (or 13A) and the first metal silicide layer 221. Sample D has a configuration similar to that of the n-FET portion 50A shown in FIG. 17 or 19. In Sample D, the source/drain portion 13 (or 13A) is made of silicon doped with phosphorus (P), and the first transition layer 161A includes the first implantation element of phosphorus (P). Sample E has a structure similar to that of Sample D, except that the first implantation elements in the first transition layer 161A are antimony (Sb). The baseline sample has a structure similar to that of Sample D, except that the first transition layer 161A is absent. It can be seen that Sample D has a relatively lower $\rho_{csd}$ than that of the baseline sample, and that Sample E has a $\rho_{csd}$ even lower than that of Sample D.

Figure 30:
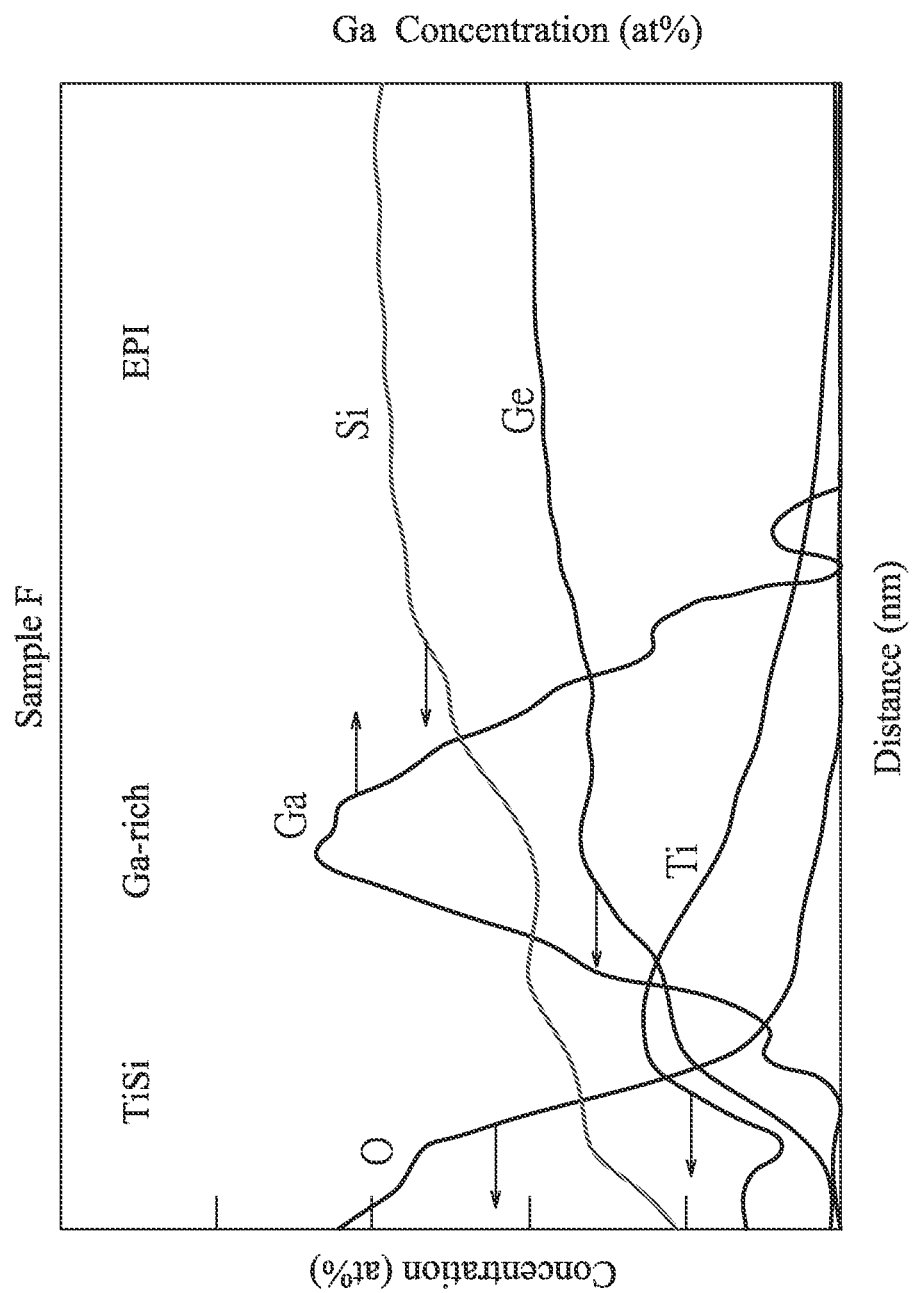
FIG. 30 is an X-ray photoelectron spectroscopy (XPS) graph illustrating compositional depth profile for Sample F of a semiconductor device in accordance with some embodiments.

FIG. 30 is an X-ray photoelectron spectroscopy (XPS) graph illustrating compositional depth profile for Sample F of a semiconductor device in accordance with some embodiments. Sample F has a configuration similar to that of the p-FET portion 50B shown in FIG. 18 or 20. In FIG. 30, a distance range (position) of the source/drain portion 14 (or 14A) made of silicon germanium is represented by "EPI," a distance range (position) of the second metal silicide layer 222 made of titanium silicide is represented by "TiSi", and a distance range (position) of the second transition layer 162A including the second implantation element of gallium (Ga) is represented by "Ga-rich." Hereinafter, the second transition layer 162A is referred to as a Ga-rich transition layer. It can be seen that the Ga-rich transition layer is formed between the TiSi portion (i.e., the second metal silicide layer 222) and the EPI portion (i.e., the second source/drain portion 14). The atomic concentration of Ga in the Ga-rich transition layer may range from about 1% to about 5%. By virtue of introduction of the Ga-rich transition layer, the SBH between the source/drain portion 14 (or 14A) and the metal plug 210 may be reduced by about 0.1 eV to about 0.2 eV.

Figure 31:
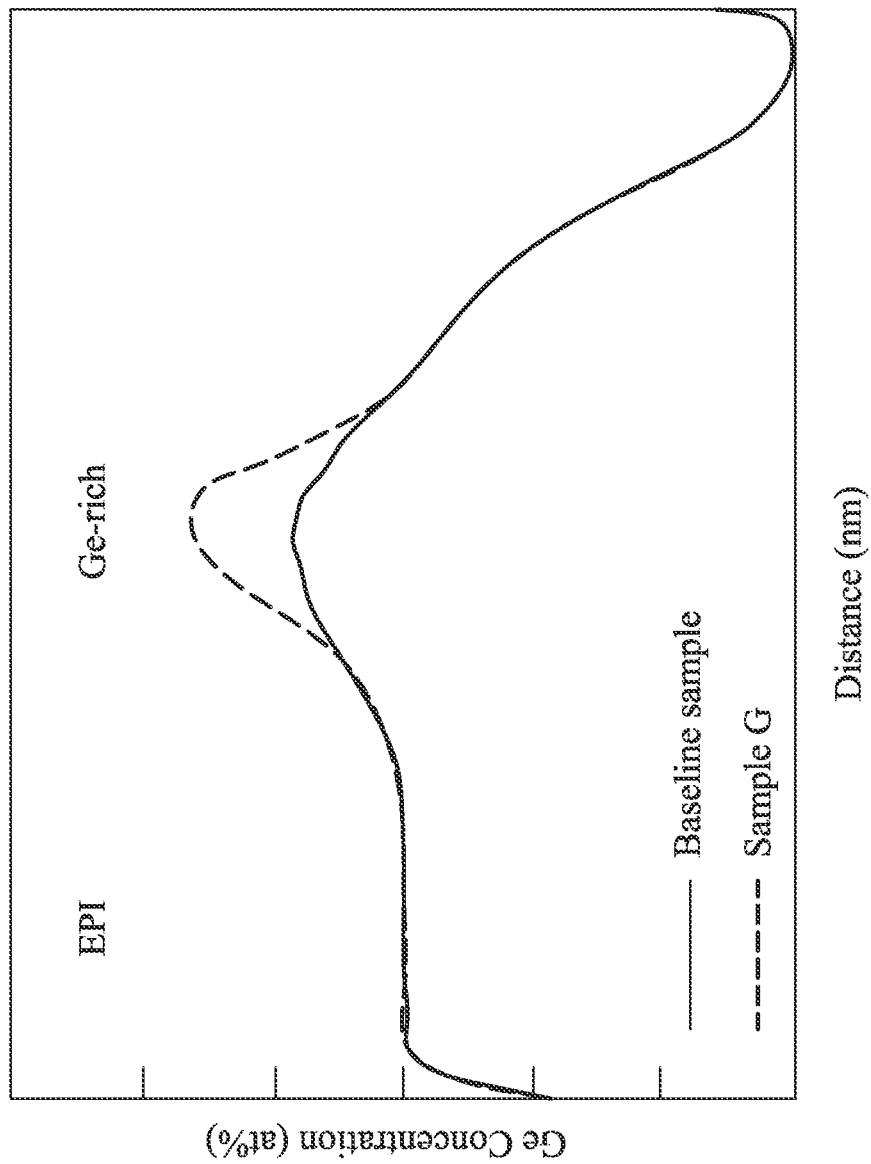
FIG. 31 is a secondary ion mass spectrometry (SIMS) graph illustrating compositional depth profile for a baseline sample and Sample G of semiconductor devices in accordance with some embodiments.

FIG. 31 is a secondary ion mass spectrometry (SIMS) graph illustrating compositional depth profile for a baseline sample and Sample G of semiconductor devices in accordance with some embodiments. Sample G has a configuration similar to that of the p-FET portion 50B shown in FIG. 18 or 20, and is prepared by a method similar to the method 200. In Sample G, a distance range (position) of the source/drain portion 14 (or 14A) made of silicon germanium (SiGe) doped with boron is represented by "EPI," and a distance range (position) of a region between the EPI portion and the second metal silicide layer 222 is represented by "Ge-rich." In addition, in Sample G, germanium (Ge) is used as the second implantation element for forming the second transition layer 162A in the Ge-rich portion. The baseline sample is prepared by a method similar to that for preparing Sample G but without being subjected to the second implantation process. In FIG. 31, signals of germanium (Ge) are shown, and signals of other elements (for example, Si, Ti, B) are omitted. It can be seen that in both the baseline sample and Sample G, an atomic concentration of Ge in the EPI portion is relatively higher near the Ge-rich portion. In addition, the atomic concentration of Ge in the Ge-rich portion of Sample G is higher than that in the Ge-rich portion of the baseline sample by about 0.5% to about 35%, which suggests that the second transition layer 162A is formed in the Ge-rich portion. Furthermore, although not shown in FIG. 31, an Rcsd between the second metal silicide layer 222 and the source/drain portion 14 (or 14A) in Sample G can be greatly reduced relative to that of the baseline sample by at least 5%. For example, the Rcsd of Sample G may be ranging from about 25% to about 50% relative to that of the baseline sample. Theoretically, Si has a band gap of about 1.1 eV, and Ge has a band gap of about 0.67 eV. For $Si_xGe_{1-x}$, $Si_xGe_{1-x}$ has a smaller band gap when x is smaller. For example, $Si_{0.05}Ge_{0.95}$ has a smaller band gap than that of $Si_{0.6}Ge_{0.4}$ by about 0.18 eV, which may result in a lower SBH between the source/drain portion 14 (or 14A) and the metal plug 210. Therefore, the Rcsd reduction in Sample G can be attributed to the "Ge pile up" phenomenon (i.e., the formation of the second transition layer 162A).

Figure 32:
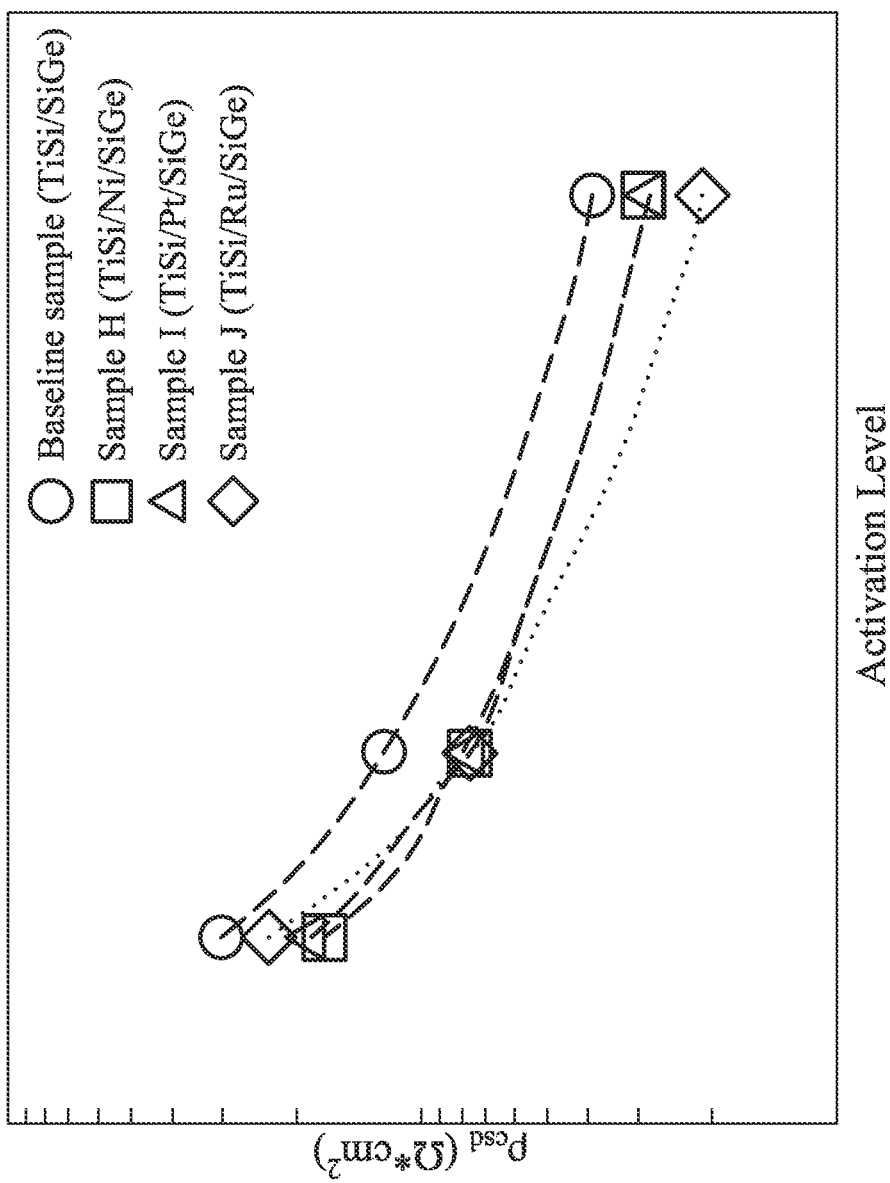
FIG. 32 is a graph illustrating a relationship of source/drain contact resistivity ($\rho_{csd}$) versus an activation level for a baseline sample and Samples H to J of semiconductor devices in accordance with some embodiments.

FIG. 32 is a graph illustrating a relationship of source/drain contact resistivity ($\rho_{csd}$) versus an activation level for a baseline sample and Samples H to J of semiconductor devices in accordance with some embodiments. In FIG. 32, the activation level may represent a doping concentration of p-type impurities. Sample H has a configuration similar to that of the p-FET portion 50B shown in FIG. 18 or 20, and includes the source/drain portion 14 (or 14A) made of silicon germanium doped with p-type impurities, the second metal silicide layer 222 made of titanium silicide, and the second transition layer 162A including the second implantation element of nickel (Ni). Sample I has a structure similar to that of Sample H, except that the second implantation element is platinum (Pt). Sample J has a structure similar to that of Sample H, except that the second implantation element is ruthenium (Ru). The baseline sample has a structure similar to that of Sample H, except that the second transition layer 162A is absent. It can be seen that the $\rho_{csd}$ value of all four samples is lower as the activation level (or the doping concentration of the p-type impurities) increases. Moreover, in FIG. 32, the $\rho_{csd}$ values of Samples H, I and J at the same activation level are even lower that of the baseline sample, and thus it can be concluded that the introduction of the second transition layer 162A may lower the $\rho_{csd}$ values.

Figure 33:
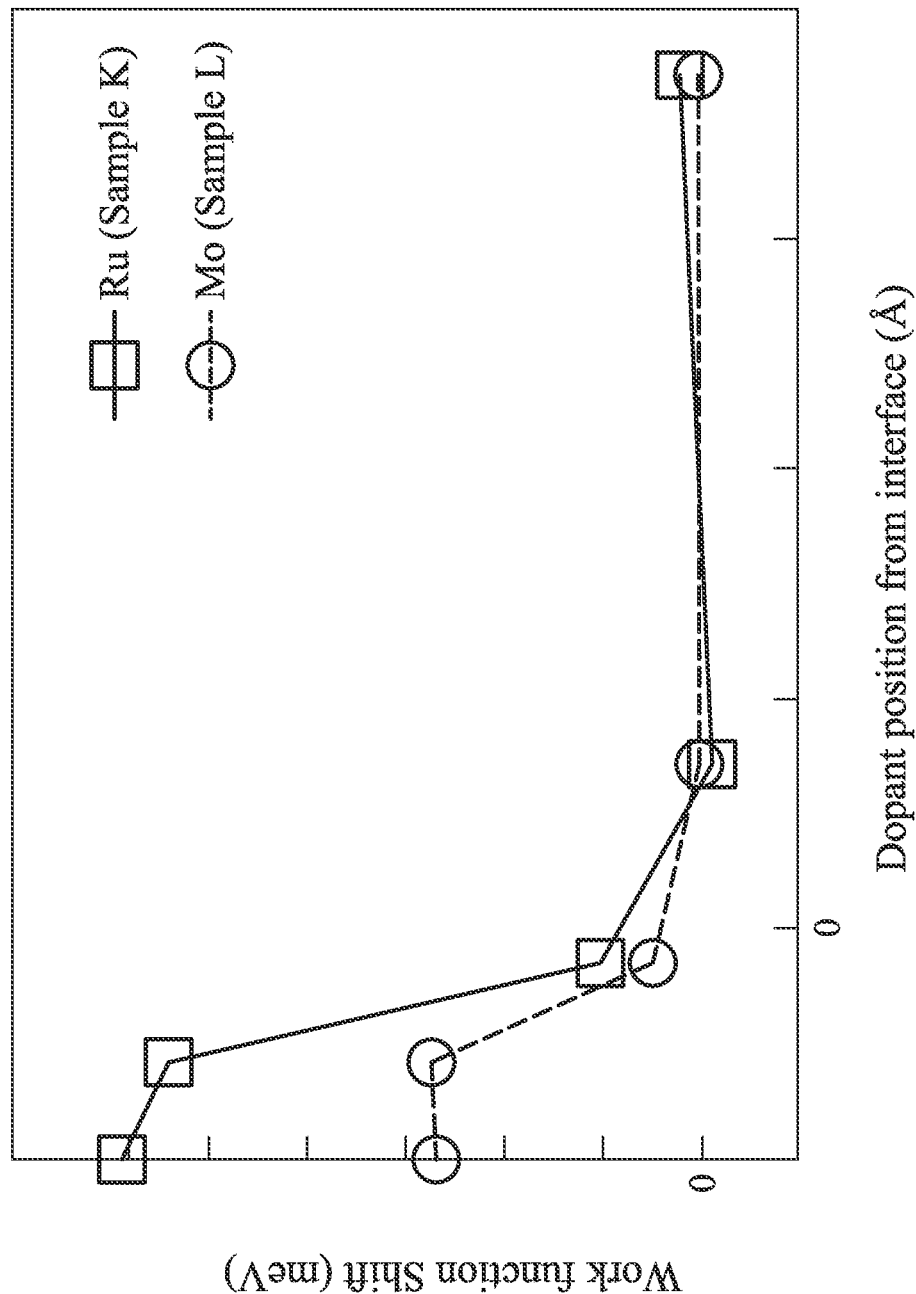
FIG. 33 is a graph illustrating a relationship of a work function shift versus a dopant position from an interface for Samples K and L of semiconductor devices in accordance with some embodiments.

FIG. 33 is a graph illustrating a relationship of a work function shift versus a dopant position from an interface for Samples K and L of semiconductor devices in accordance with some embodiments. Sample K has a configuration similar to that of the p-FET portion 50B shown in FIG. 18 or 20, and includes the source/drain portion 14 (or 14A) made of silicon, the second metal silicide layer 222 made of titanium silicide, and the second transition layer 162A which includes the second implantation elements of ruthenium (Ru), which has an Ru atomic concentration ranging from about 4% to about 15%, and which has a thickness ranging from about 0.5 nm to about 3 nm. Sample L has a structure similar to that of Sample K, except that the second implantation elements is molybdenum (Mo). In each of Samples K and L, the interface is formed between the source/drain portion 14 (or 14A) and the second metal silicide layer 222, and the work function shift (at each of the dopant positions from the interface) is obtained by subtracting a work function energy of a baseline sample from that of each of Samples K and L. The baseline sample has a structure similar to that of Sample K, except that the second transition layer 162A is absent. It can be seen that for Samples K and J, the work function shift at a proximate position which is proximate to the interface between the source/drain portion 14 (or 14A) and the second metal silicide layer 222 is significantly increased relative to a distal position which is distal from the interface. Furthermore, the work function shift at the proximate position in Sample K is further higher than that in Sample L. Therefore, a relatively large work function shift at the proximate position can be achieved through introduction of the second transition layer 162A, which can result in reduction of SBH at the p-FET portion 50B, thereby reducing the value of Rcsd. For example, the Rcsd in Samples K and L may be lower than that of the baseline sample by about 25% to about 50%.

Figure 34:
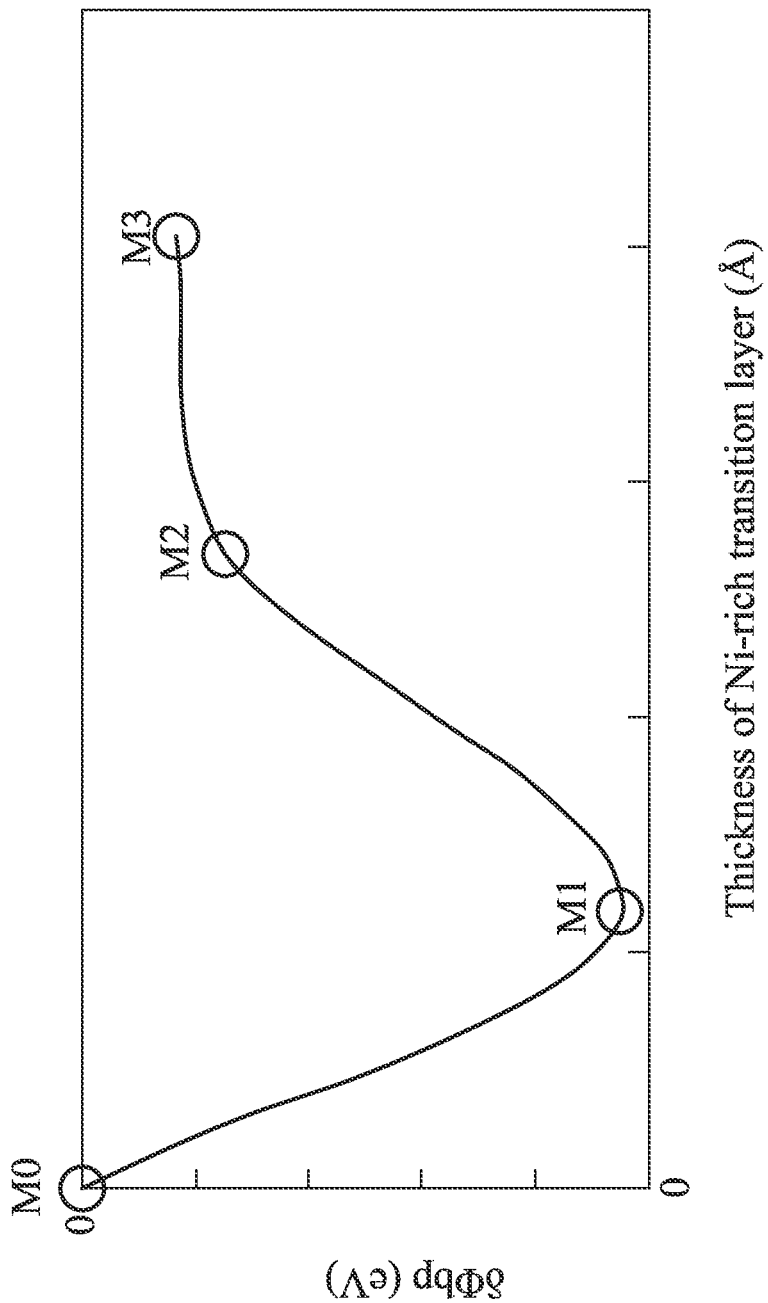
FIG. 34 is a graph illustrating a relationship of simulated reduction of SBH ($\delta\Phi bp$) at the p-FET portion versus a thickness of a second transition layer in accordance with some embodiments.

FIG. 34 is a graph illustrating a relationship of simulated reduction of SBH ($\delta\Phi$bp) at the p-FET portion 50B versus a thickness of the second transition layer 162A in accordance with some embodiments. In FIG. 34, four samples (M0, M1, M2, M3) of semiconductor devices are provided. Each of Samples M1 to M3 has a configuration similar to that of the p-FET portion 50B shown in FIG. 18 or 20, and is made using a method similar to the method 200. The second implantation elements for forming the second transition layer 162A in each of Samples M1 to M3 are nickel (Ni) (hereinafter the second transition layer 162A is referred to as a Ni-rich transition layer as shown in horizontal axis of FIG. 34). Sample M0 is made in a manner similar to that of Sample M1, except that the second implantation elements are not implanted and thus, a thickness of the Ni-rich transition layer is zero. In Samples M1, M2, and M3, the Ni-rich transition layers have different thicknesses (thickness of the Ni-rich transition layer: M1<M2<M3). The reduction of SBH ($\delta\Phi$bp) in each of Samples M0 to M3 is obtained by subtracting the SBH of Sample M0 from the SBH of a corresponding one of Samples M0 to M3, and thus, the reduction of the SBH ($\delta\Phi$bp) in Sample M0 is zero. The reduction of SBH is significantly increased when the Ni-rich transition layer has a predetermined thickness which may range from about 0.2 Å to about 5 Å (Sample M1). If the Ni-rich transition layer has a thickness greater than the predetermined thickness (Sample M2 or M3), the reduction in the SBH instead becomes smaller.

Figure 35:
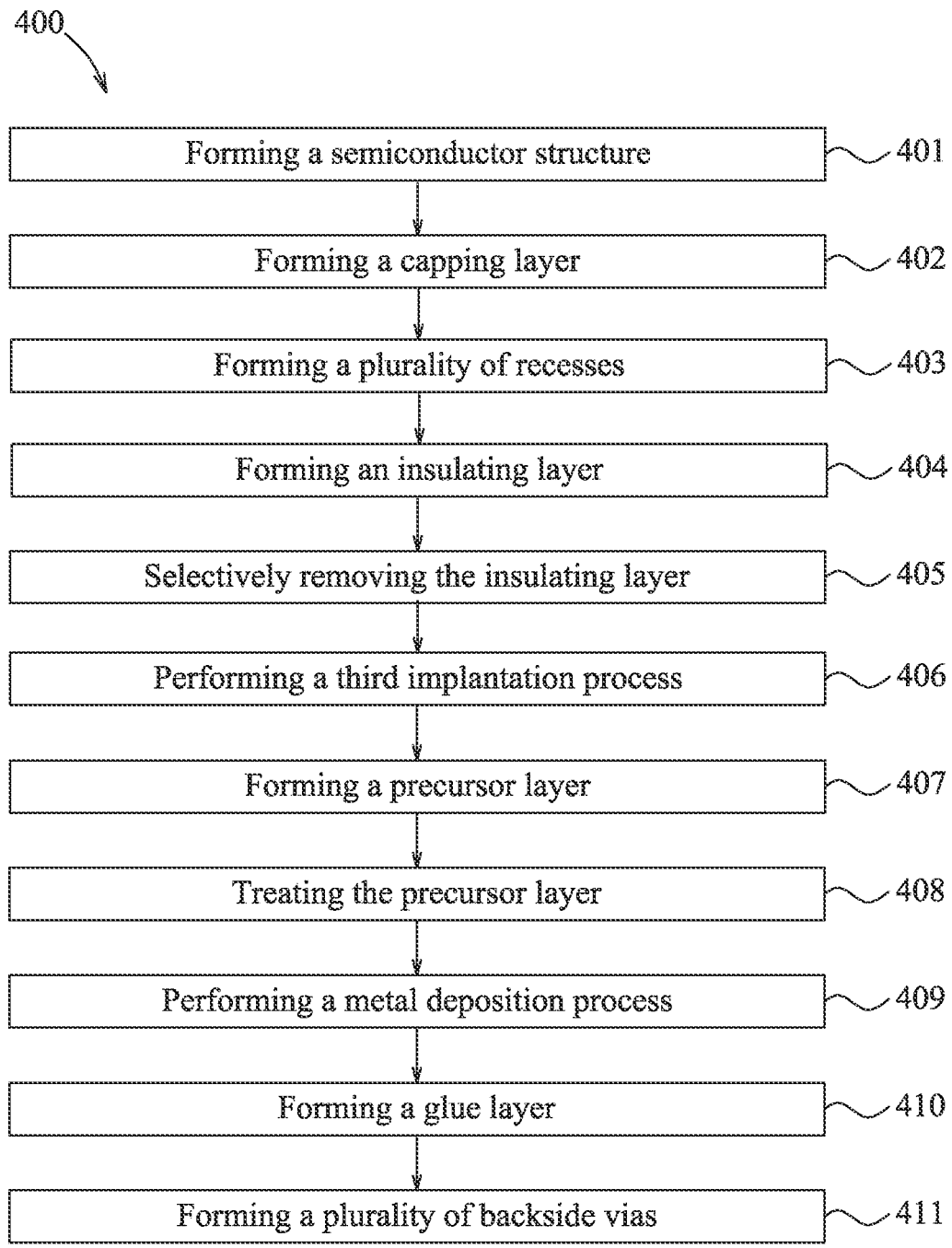
FIG. 35 is a flow diagram illustrating another method for manufacturing a semiconductor device in accordance with some embodiments.
Figure 51:
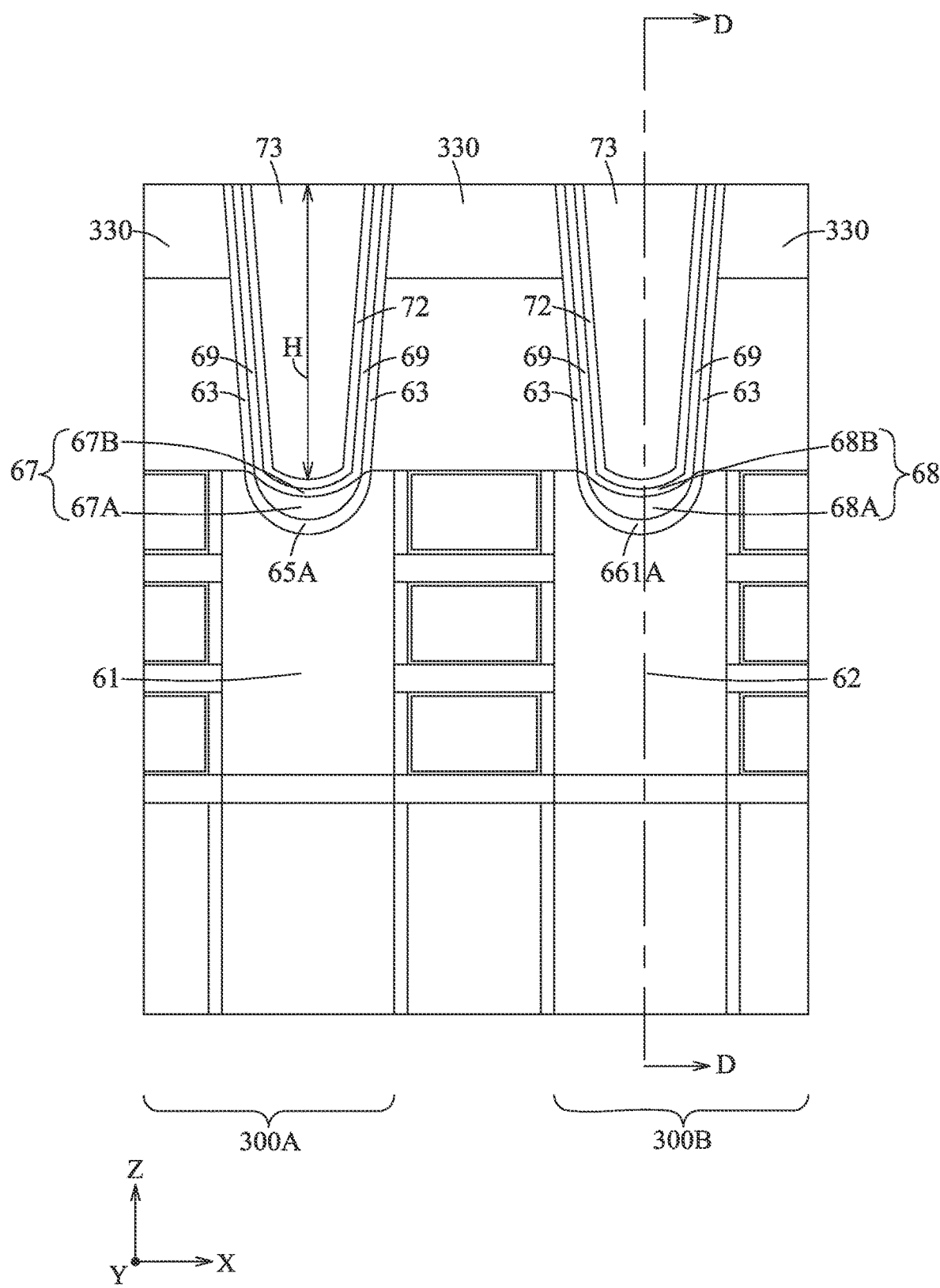
Figure 52:
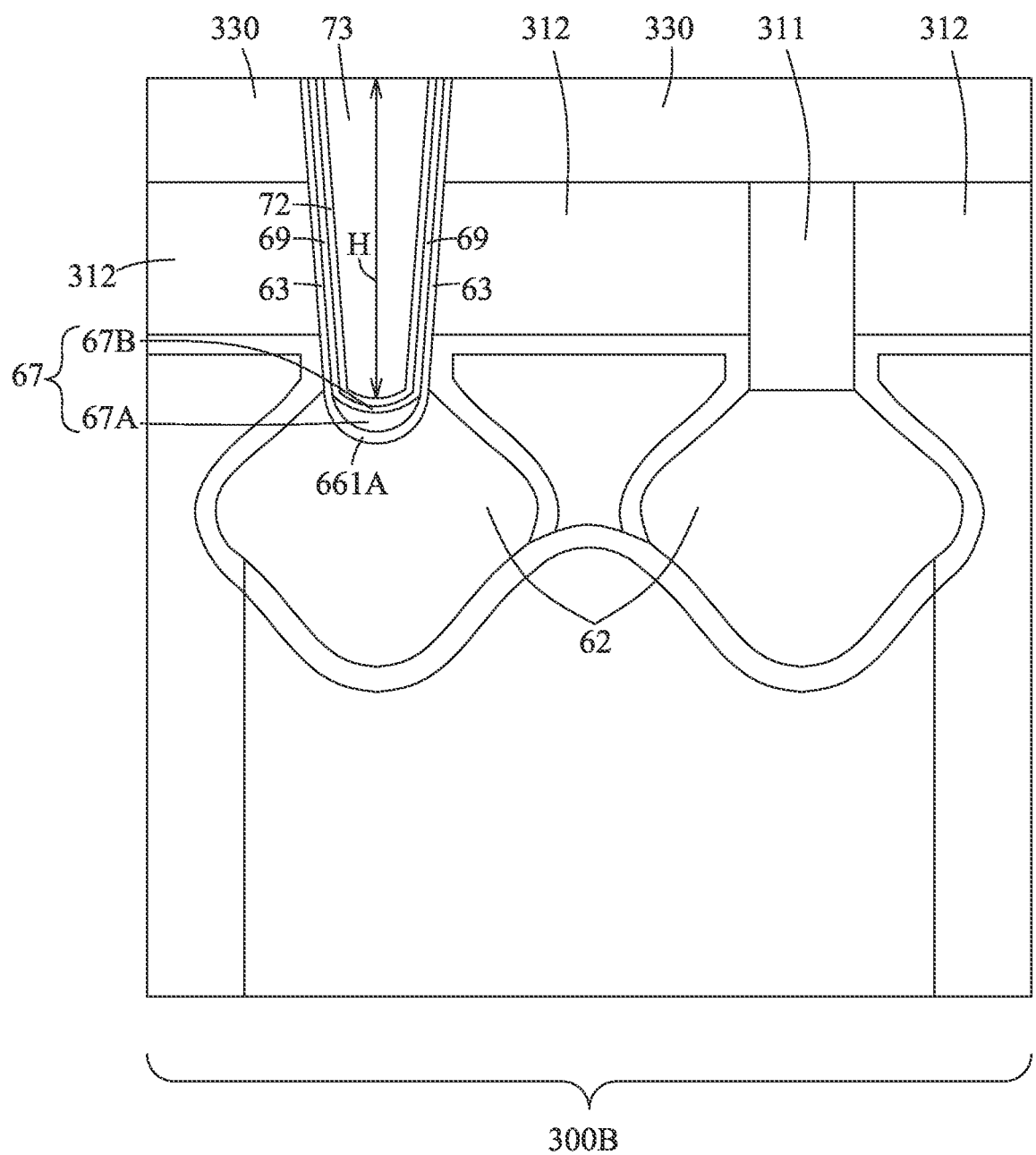

FIG. 35 is a flow diagram illustrating a method 400 for manufacturing a semiconductor device (for example, the semiconductor device as shown in FIGS. 51 and 52) in accordance with some embodiments. FIGS. 36 to 52 illustrate schematic views of intermediate stages of the method 400 in accordance with some embodiments.

Figure 36:
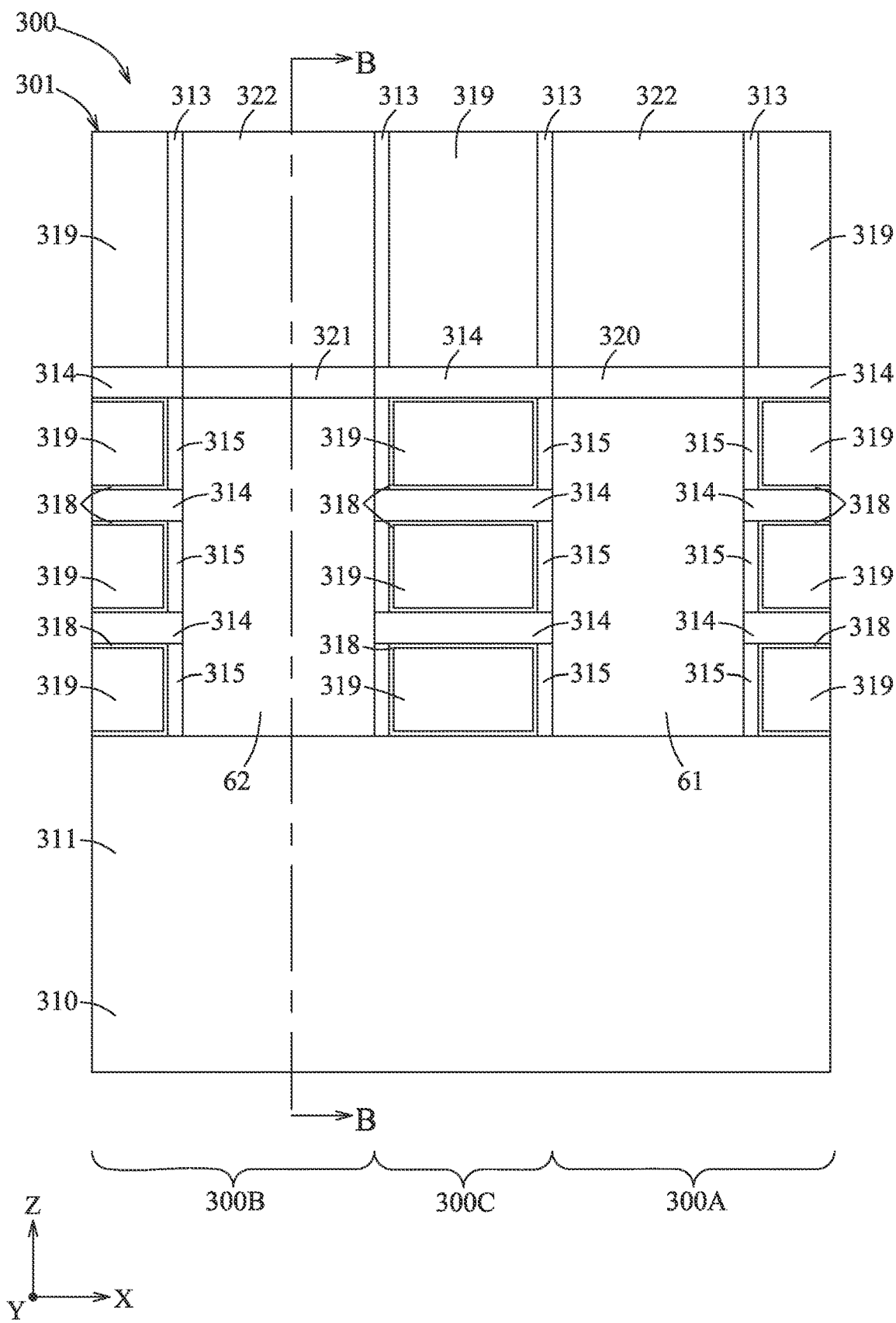
FIGS. 36 to 52 are schematic views illustrating intermediate stages of the method depicted in FIG. 35 in accordance with some embodiments.
Figure 37:
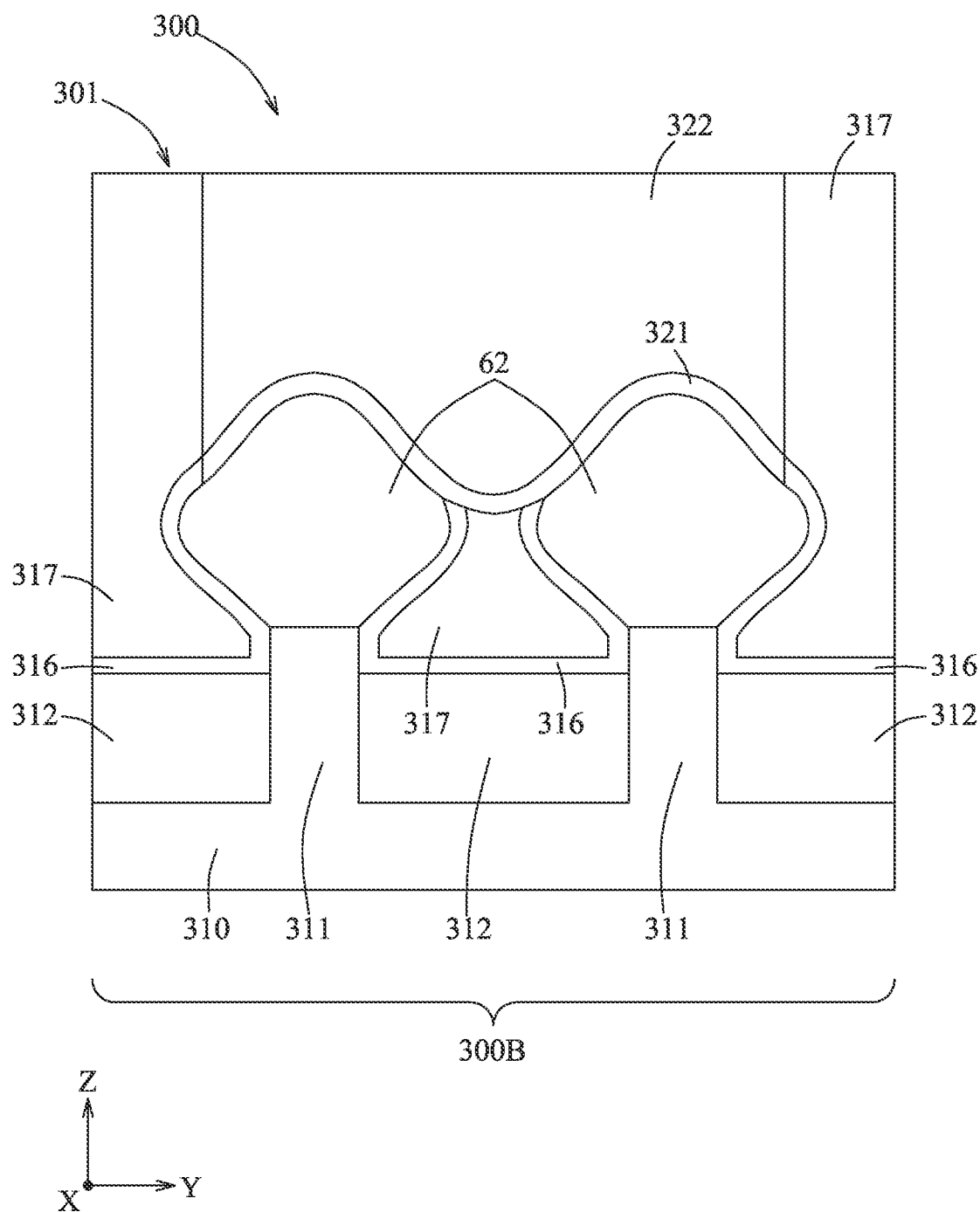

Referring to FIG. 35 and the examples illustrated in FIGS. 36 and 37, the method 400 begins at step 401, where a semiconductor structure 300 is formed. FIG. 36 is a sectional schematic view of the semiconductor structure 300 in accordance with some embodiments, and FIG. 37 is a cross-sectional view taken along line B-B of FIG. 36. The semiconductor 300 is formed as a gate-all-around (GAA) structure, and includes a semiconductor substrate 310, isolation features 312, gate spacers 313, channel layers 314, inner spacers 315, first source/drain portions 61 (one of which is shown in FIG. 36), second source/drain portions 62 (one of which is shown in FIG. 36), contact etching stop layers (CESL) 316, interlayer dielectric (ILD) layers 317, gate dielectric layers 318, gate electrodes 319, first front-side metal silicide layers 320, second front-side metal silicide layers 321, and metal plugs 322. In FIG. 36, three of the channel layers 314 are exemplified for description. In some embodiments, the number of the channel layers 314 ranges from about two to six. In some other embodiments, the semiconductor structure 300 may further include an interconnect structure (not shown) formed on the structure shown in FIG. 36 opposite to the semiconductor substrate 310. The interconnect structure may include a plurality of dielectric layers and a plurality of metal interconnecting layers, each of which is embedded in a corresponding one of the dielectric layers. The metal interconnecting layers are electrically connected to the gate electrodes 319 and the metal plugs 322 according to the circuit design of the semiconductor structure 300.

The semiconductor structure 300 can be divided into a first type portion 300A and a second type portion 300B. In some embodiments, the semiconductor structure 300 may further include an isolation portion 300C disposed between the first type portion 300A and the second type portion 300B. In some embodiments, the first type portion 300A is an n-FET portion, and the second type portion 30B is a p-FET portion.

In some embodiments, the semiconductor structure 300 may be formed by (i) patterning a substrate and a stack (not shown) formed thereon to form a plurality of fin structures on the semiconductor substrate 310 (i.e., the substrate is patterned into the semiconductor substrate 310 and lower portions 311 of the fin structures, and the stack is patterned into upper portions of the fin structures each including a plurality of sacrificial films and a plurality of channel films disposed to alternate with the sacrificial films), (ii) forming an isolation layer over the semiconductor substrate 310 and the fin structures followed by a planarization process, for example, but not limited to, chemical mechanism polishing (CMP), to form isolation regions at two opposite sides of each of the fin structures, (iii) recessing the isolation regions to form the isolation features 312 so as to expose the upper portion of each of the fin structures and an upper part of the lower portion 311 of each of the fin structures, (iv) forming a plurality of dummy gate portions (not shown) over each of the fin structures such that each of the fin structures has a plurality of exposed portions formed in pairs, each pair of the exposed portions being exposed from the dummy gate portions, each pair of the exposed portions being located at two opposite sides of a corresponding one of the dummy gate portions in the X direction, (v) forming the gate spacers 313 at two opposite sides of a corresponding one of the dummy gate portions, (vi) etching the exposed portions of the fin structures to form source/drain recesses (not shown), such that the channel films are patterned into the channel layers 314, and the sacrificial films are patterned into sacrificial layers (not shown), (vii) recessing the sacrificial layers through the source/drain recesses to form lateral recesses, (viii) forming the inner spacers 315 in the lateral recesses to cover the remaining sacrificial layers, (ix) forming the first and second source/drain portions 61, 62 respectively in the source/drain recesses, such that each of the channel layers 314 at the n-FET portion 300A extends between the first source/drain portions 61 (one of which is shown in FIG. 36) and each of the channel layers 314 at the p-FET portion 300B extends between the second source/drain portions 62 (one of which is shown in FIG. 36), (x) forming the CESL 316 and the ILD layer 317 on each of the first and second source/drain portions 61, 62, (xi) removing the dummy gate portions and the remaining sacrificial layers using a wet etching process or other suitable processes to form cavities (not shown), (xii) sequentially depositing the gate dielectric layer 318 and the gate electrode 319 to fill each of the cavities, followed by a planarization process to remove excesses of the gate electrode 318 and the gate dielectric layer 319 and to expose the ILD layers 317, (xiii) removing a portion of each of the CESL 316 and a portion of each of the ILD layers 317 to form a plurality of trenches which expose the first and second source/drain portions 61, 62, respectively, (xiv) forming the first front-side metal silicide layers 320 (one of which is shown in FIG. 36) respectively on the first source/drain portions 61 and forming the second front-side metal silicide layers 321 (one of which is shown in FIG. 36) respectively on the second source/drain portions 62, (xv) forming a plurality of the metal plugs 322 to fill the trenches, respectively, and (xvi) forming the interconnect structure (not shown) on the structure shown in FIG. 36 opposite to the semiconductor substrate 310 so as to permit the interconnecting layers to be electrically connected to the gate electrodes 319 and the metal plugs 322. Other suitable processes for forming the semiconductor structure 300 are within the contemplated scope of the present disclosure.

In some embodiments, each of the semiconductor substrate 310 and the lower portions 311 of the fin structures may be made of a material that is similar to those for forming the semiconductor substrate 50 described above with reference to FIG. 4, and thus the details thereof are omitted for the sake of brevity.

In some embodiments, the materials and configurations of the isolation features 312 are similar to those of the isolation portions 58 described above with reference to FIG. 2, and thus the details thereof are omitted for the sake of brevity.

In some embodiments, the materials and configurations of the dummy gate portions are similar to those of the dummy portion 53 described above with reference to FIG. 2, and thus the details thereof are omitted for the sake of brevity.

In some embodiments, the materials of the gate spacers 313 are similar to those of the gate spacers 54 described above with reference to FIG. 2, and thus the details thereof are omitted for the sake of brevity.

In some embodiments, the materials of the channel layers 314 are similar to those of the semiconductor substrate 310, and thus the details thereof are omitted for the sake of brevity. The channel layer 314 may be made of a material that is the same as or different from that of the semiconductor substrate 310.

In some embodiments, the inner spacers 315 may be made of a material that is similar to those for forming the gate spacers 313, and thus the details thereof are omitted for the sake of brevity.

In some embodiments, since the materials and configurations of the first source/drain portions 61 are similar to those of the first source/drain portions 13 described above with reference to FIG. 4, and since the materials and configurations of the second source/drain portions 62 are similar to those of the second source/drain portions 14 described above with reference to FIG. 4, the details thereof are omitted for the sake of brevity.

In some embodiments, since the materials for the CESL 316 are similar to those for forming the CESL 150 described above with reference to FIG. 6, and since the ILD layers 317 are similar to those for forming the ILD layer 151 described above with reference to FIG. 6, the details thereof are omitted for the sake of brevity.

In some embodiments, since the materials and configurations of the gate dielectric layers 318 are similar to those of the gate dielectric 552 described above with reference to FIG. 7, and since the materials and configurations of the gate electrodes 319 are similar to those of the gate electrode 551 described above with reference to FIG. 7, the details thereof are omitted for the sake of brevity.

In some embodiments, since the materials and configurations of the first front-side metal silicide layers 320 are similar to those of the first metal silicide layers 221 described above with reference to FIG. 14, and since the materials and configurations of the second front-side metal silicide layers 321 are similar to those of the first metal silicide layers 222 described above with reference to FIG. 14, the details thereof are omitted for the sake of brevity.

In some embodiments, the materials of each of the metal plugs 322 are similar to those for forming the metal plugs 210 described above with reference to FIG. 16, and thus the details thereof are omitted for the sake of brevity.

In some alternative embodiments, the semiconductor structure 300 may further include additional features, and/or some features present in the semiconductor structure 300 may be modified, replaced, or eliminated without departure from the spirit and scope of the present disclosure.

Figure 38:
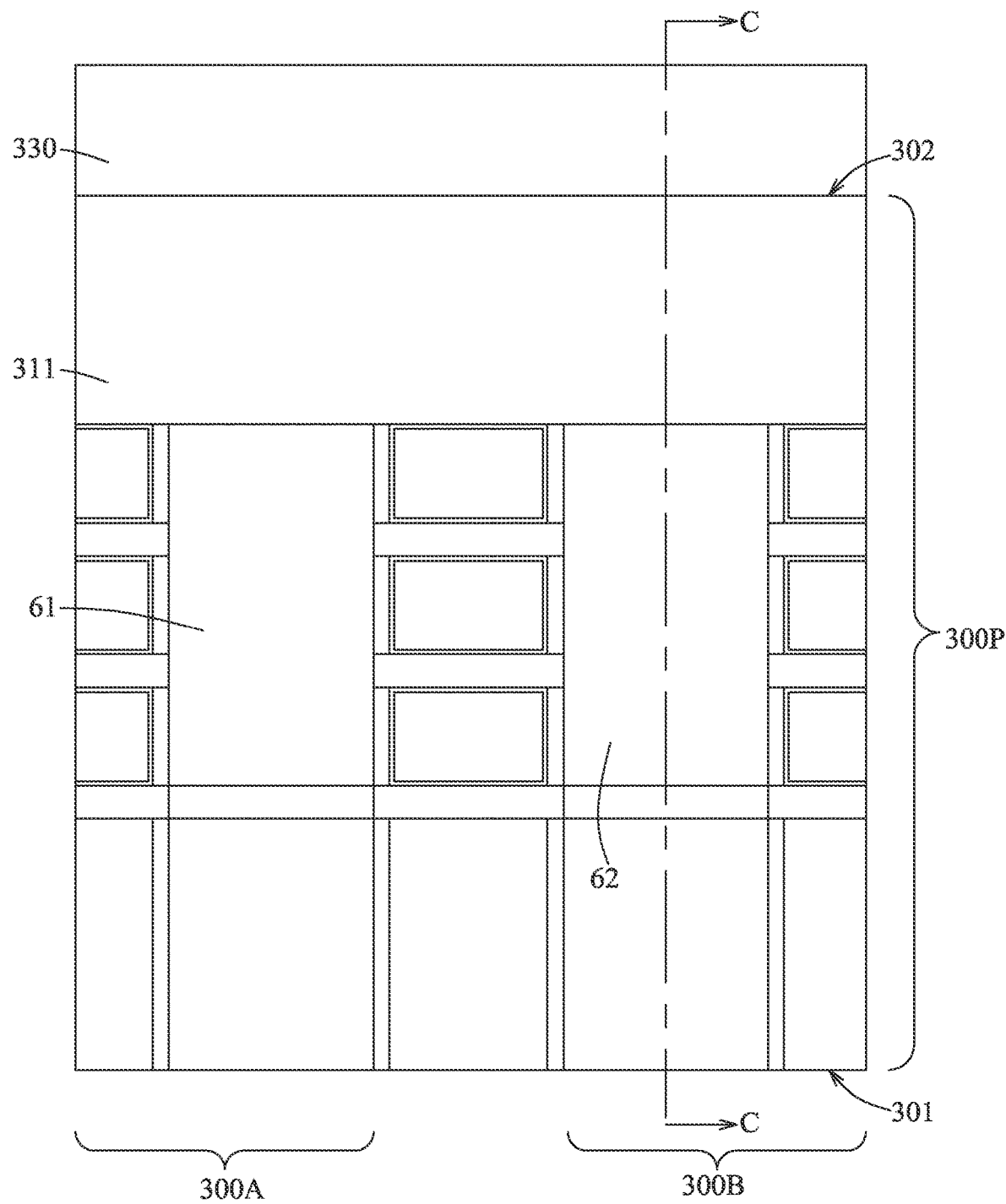
Figure 39:
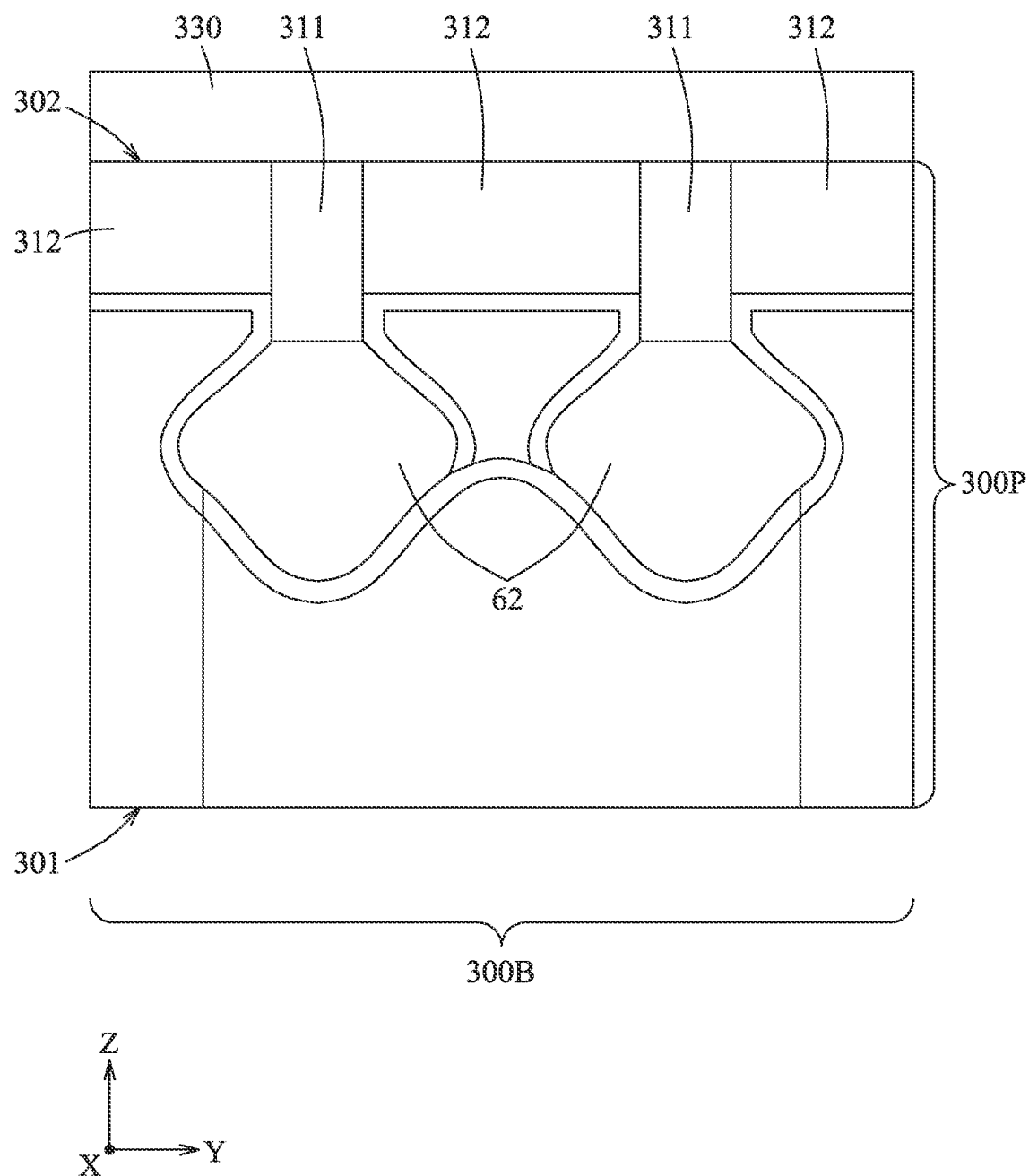

Referring to FIG. 35 and the examples illustrated in FIGS. 38 and 39, the method 400 proceeds to step 402, where a capping layer 330 is formed. FIG. 38 is an upside down view of the structure shown in FIG. 36, but further illustrating the structure after step 402, and FIG. 39 is a cross-sectional view taken along line C-C of FIG. 38. In some embodiments, the capping layer 330 is made of a material that is similar to those for forming the hard mask 530 described above with reference to FIG. 2, and thus the details thereof are omitted for the sake of brevity. In some embodiments, step 402 includes (i) attaching a carrier substrate (not shown) to a front-side surface 301 of the semiconductor structure 300 opposite to the semiconductor substrate 310 (see FIG. 36), (ii) flipping the semiconductor structure 300 (see FIG. 36) upside down through the carrier substrate, (iii) removing the semiconductor substrate 310 (see FIG. 37) by a planarization process, for example, but not limited to, chemical mechanism polishing (CMP), to expose the isolation feature 312 and the lower portion 311 of each of the fin structures (see FIGS. 38 and 39), such that a backside-polished semiconductor structure 300P having a backside surface 302 opposite to the front-side surface 301 is formed, and (iv) forming the capping layer 330 on the backside surface 302 of the backside-polished semiconductor structure 300P by CVD, ALD, or other suitable deposition techniques.

Figure 40:
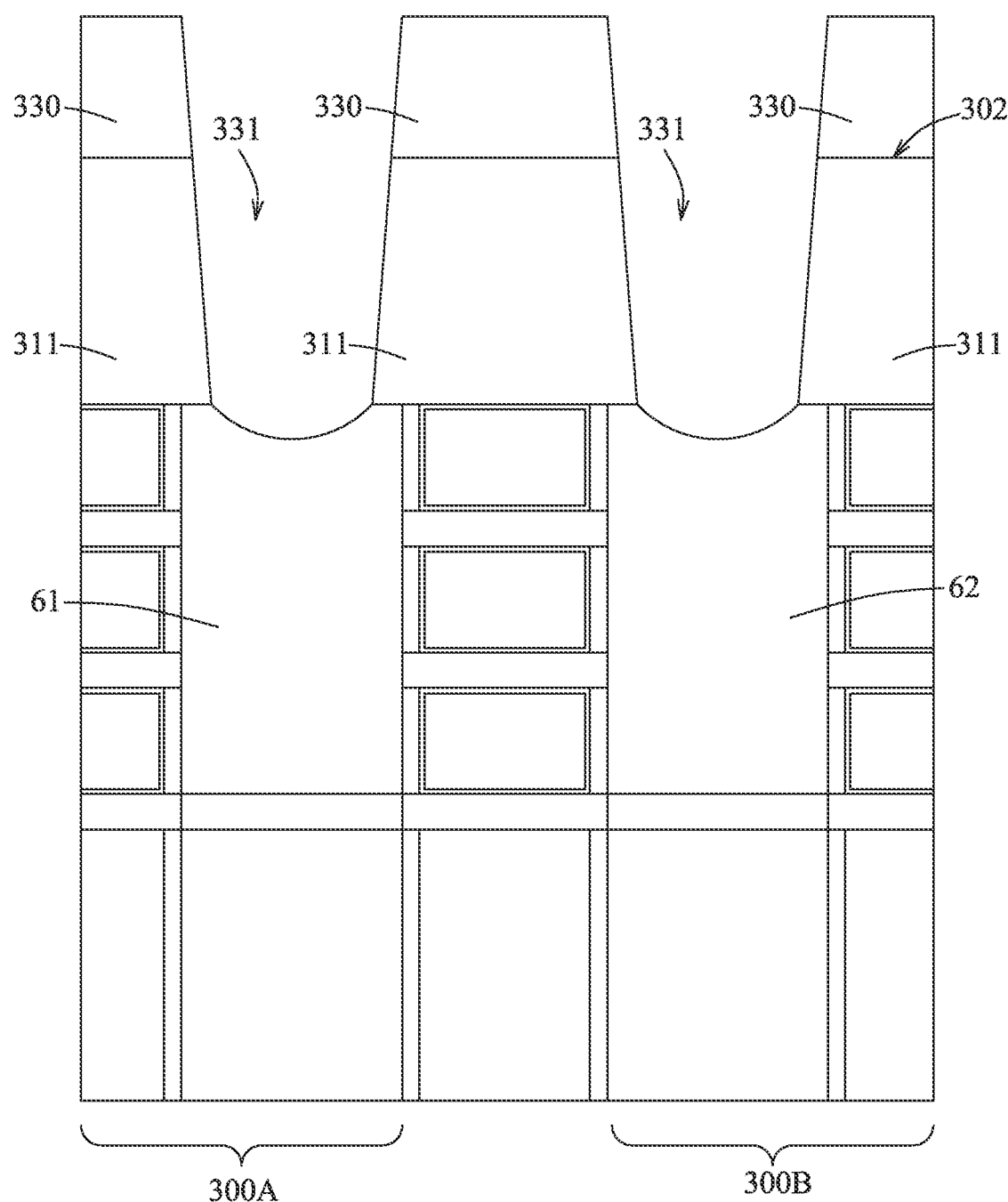
Figure 41:
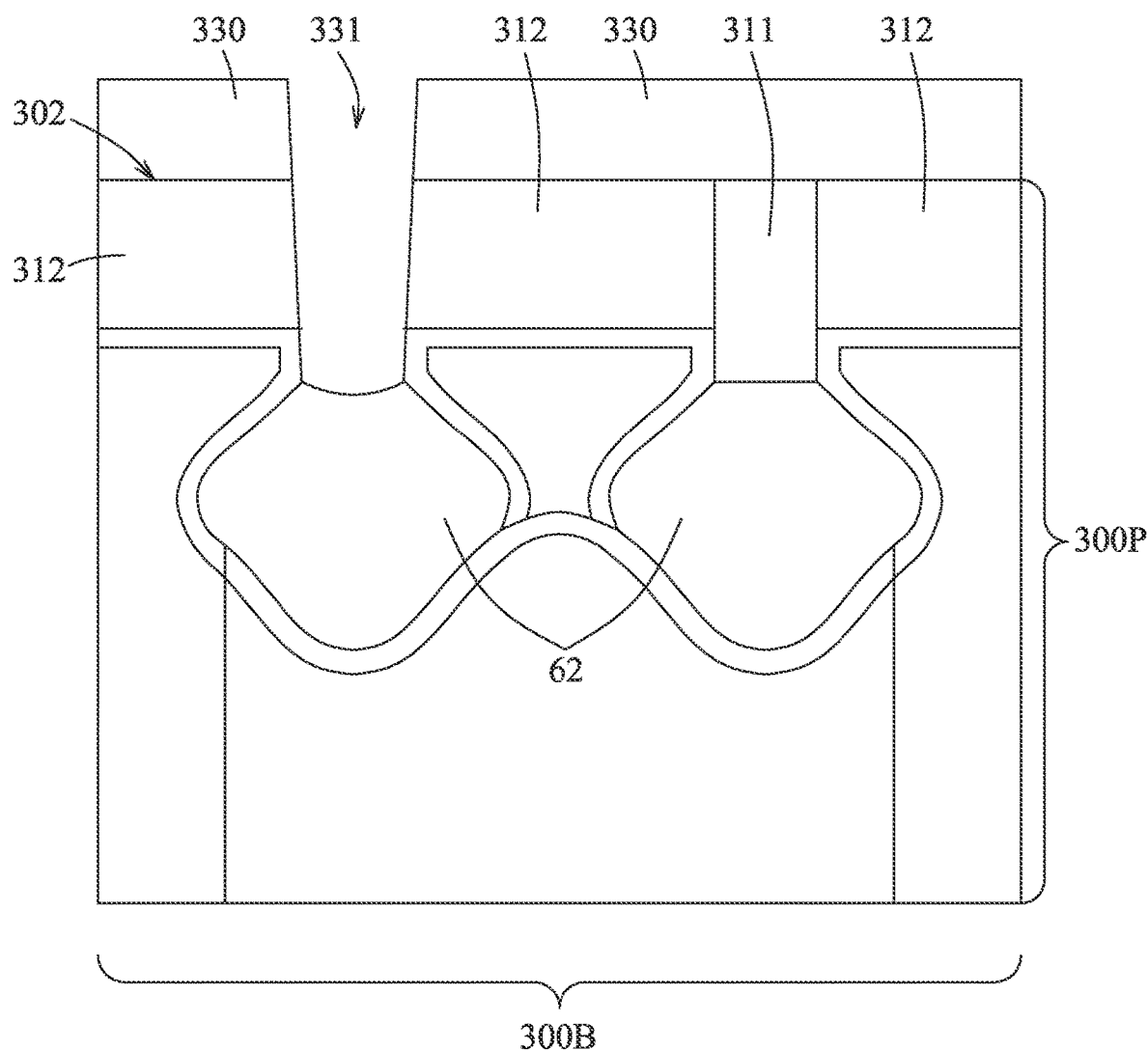

Referring to FIG. 35 and the examples illustrated in FIGS. 40 and 41, the method 400 proceeds to step 403, where a plurality of recesses 331 are formed. FIGS. 40 and 41 are schematic views similar to FIGS. 38 and 39, respectively, but illustrating the structure after step 403. Each of the recesses 331 extends through the capping layer 330 and the lower portion 311 of a corresponding one of the fin structures (one of which is shown in FIG. 40) to expose a corresponding one of the first and second source/drain portions 61, 62. In some embodiments, step 403 includes (i) forming a patterned mask layer (not shown) to cover a top surface of the capping layer 330 shown in FIGS. 38 and 39, the patterned mask layer being a patterned photoresist or a patterned hard mask and having openings in positions corresponding to the first and second source/drain portions 61, 62, (ii) etching the capping layer 330 and the lower portion 311 of each of the fin structures through the openings of the patterned mask layer using dry etching, wet etching, other suitable processes, or combinations thereof, to form the recesses 331 until the first and second source/drain portions 61, 62 are exposed, thereby obtaining the recesses 331, and (iii) removing the patterned mask layer. Other suitable processes for forming the recesses 331 are within the contemplated scope of the present disclosure.

Figure 42:
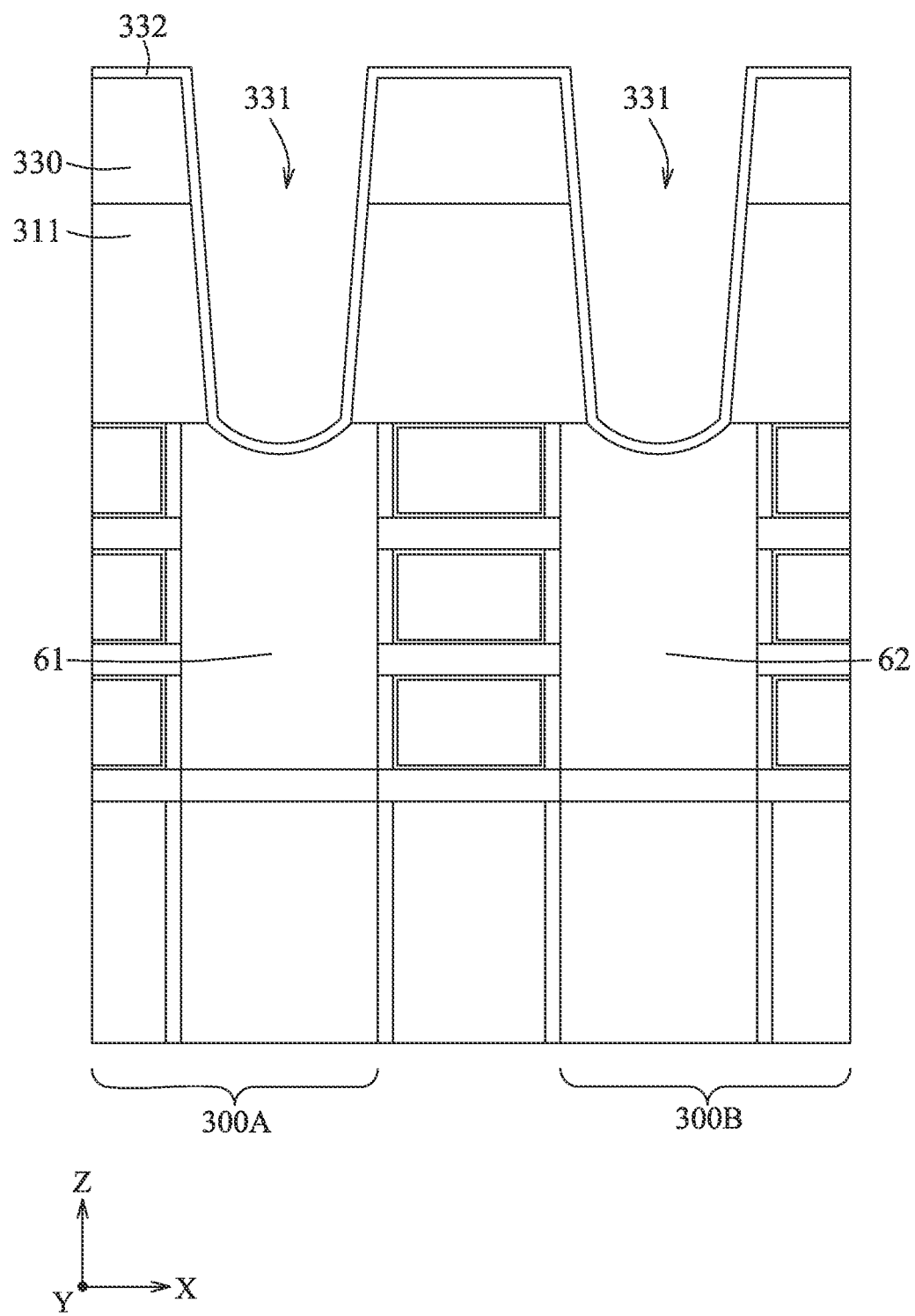

Referring to FIG. 35 and the example illustrated in FIG. 42, the method 400 proceeds to step 404, where an insulating layer 332 is formed over the structure shown in FIGS. 40 and 41, by CVD, ALD, or other suitable deposition techniques. FIG. 42 is a view similar to that of FIG. 40, but illustrating the structure after step 404. In some embodiments, the insulating layer 332 is made of a material that is similar to those for forming the SNR portions 153 describe above with reference to FIG. 9, and thus the details thereof are omitted for the sake of brevity. In some embodiments, the insulating layer 332 may be made of silicon nitride, silicon carbon nitride (SiCN), silicon oxycarbonnitride (SiOCN), silicon oxycarbide (SiOC), or combinations thereof. Other suitable materials for forming the insulating layer are within the contemplated scope of the present disclosure.

Figure 43:
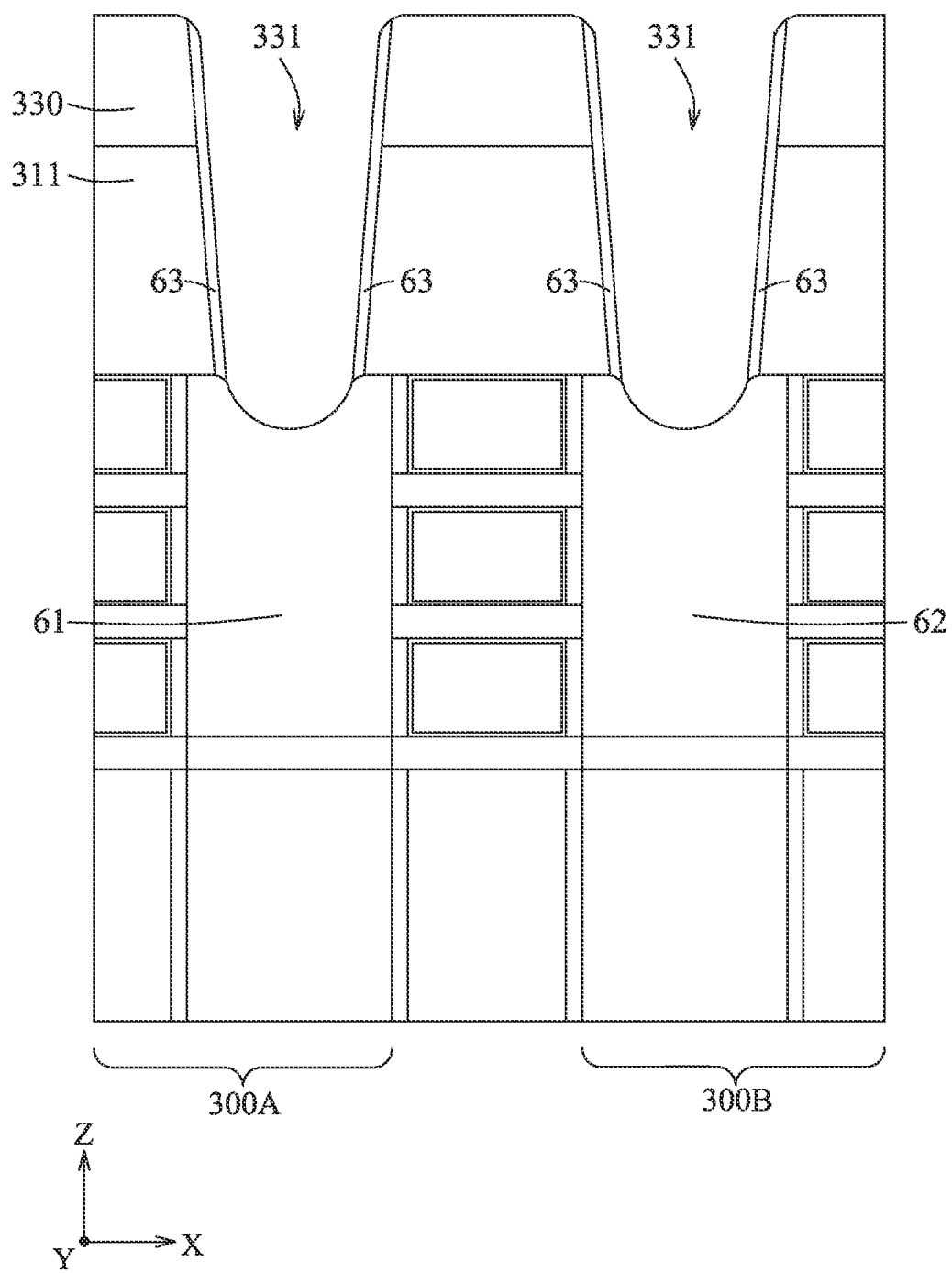

Referring to FIG. 35 and the example illustrated in FIG. 43, the method 400 proceeds to step 405, where the insulating layer 332 is selectively removed. FIG. 43 is a view similar to that of FIG. 42, but illustrating the structure after step 405. After step 405, the insulating layer 332 on an upper surface of the capping layer 330 and on the first and second source/drain portions 61, 62 is selectively removed by, for example, but not limited to, anisotropic etching, thereby leaving portions of the insulating layer 332 (i.e., liners 63) respectively on an inner sidewall surface of each of the recesses 331. The liners 63 are provided to prevent one of the backside vias 73 formed thereafter (see FIG. 51) from contacting and forming short circuit with adjacent ones of the backside vias 73. In some embodiments, each of the liners 63 has a thickness ranging from about 1 nm to about 4 nm.

Figure 44:
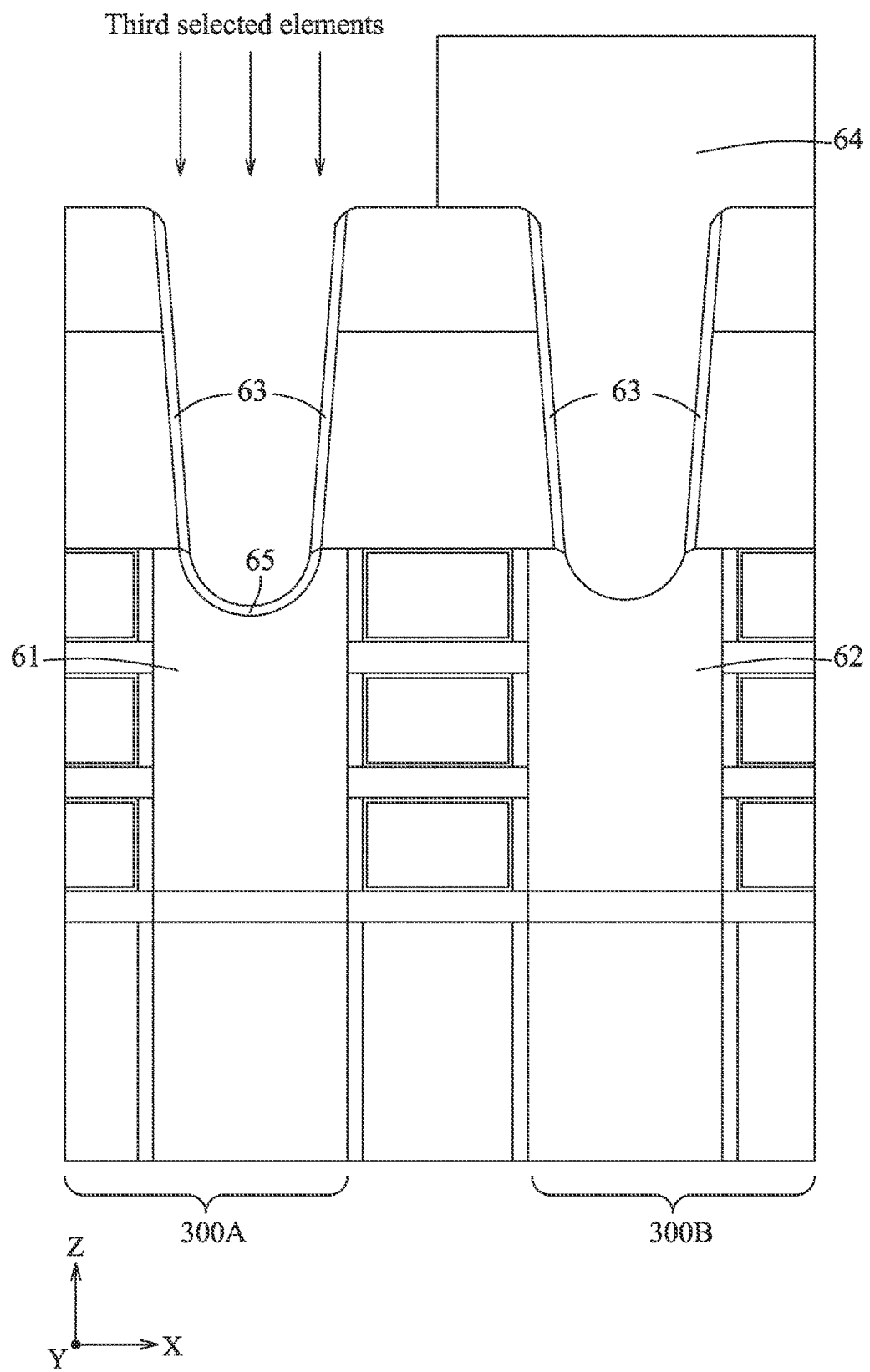

Referring to FIG. 35 and the example illustrated in FIG. 44, the method 400 proceeds to step 406, where the first source/drain portions 61 (one of which is shown in FIG. 44) are subjected to a third implantation process. FIG. 44 is a view similar to that of FIG. 43, but illustrating the structure after step 406. In some embodiments, step 406 includes (i) forming a third mask layer 64 to cover the p-FET portion 300B, (ii) implanting an upper region of the first source/drain portion 61 using first selected elements, and (iii) removing the third mask layer 64 by, for example, but not limited to, a stripping process and/or an etching process. The third implantation process is similar to the first implantation process described above with reference to FIG. 11, and is used to reduce a Schottky barrier height (SBH) between each of the backside vias 73 (see FIG. 51) on the n-FET portion 300A and a corresponding one of the first source/drain portions 61. After the third implantation process, each of the first source/drain portions 61 has a third implanted region 65 which is amorphous. The implantation conditions (e.g., energy, dosage and implantation angle for implanting the first selected elements) of the third implantation process are similar to those of the first implantation process described above with reference to FIG. 11, and thus the details thereof are omitted for the sake of the brevity. Suitable species for the first selected elements in step 406 are similar to those of the first selected elements in the abovementioned step 208, and thus the details thereof are omitted for the sake of the brevity. Thickness of the third implanted region 65 is similar to that of the first implanted region 161 (see the abovementioned step 208 and FIG. 11), and thus details thereof are omitted for the sake of the brevity.

In some embodiments, the method 400 may further include a pre-amorphization implantation process which is similar to that described in step 207. In some embodiments, the pre-amorphization implantation process can be performed before step 406 and after step 405. In some embodiments, the pre-amorphization implantation process can be performed together with step 406. Since the pre-amorphization implantation process is similar to that described in step 207, the details thereof are omitted for the sake of the brevity.

Figure 45:
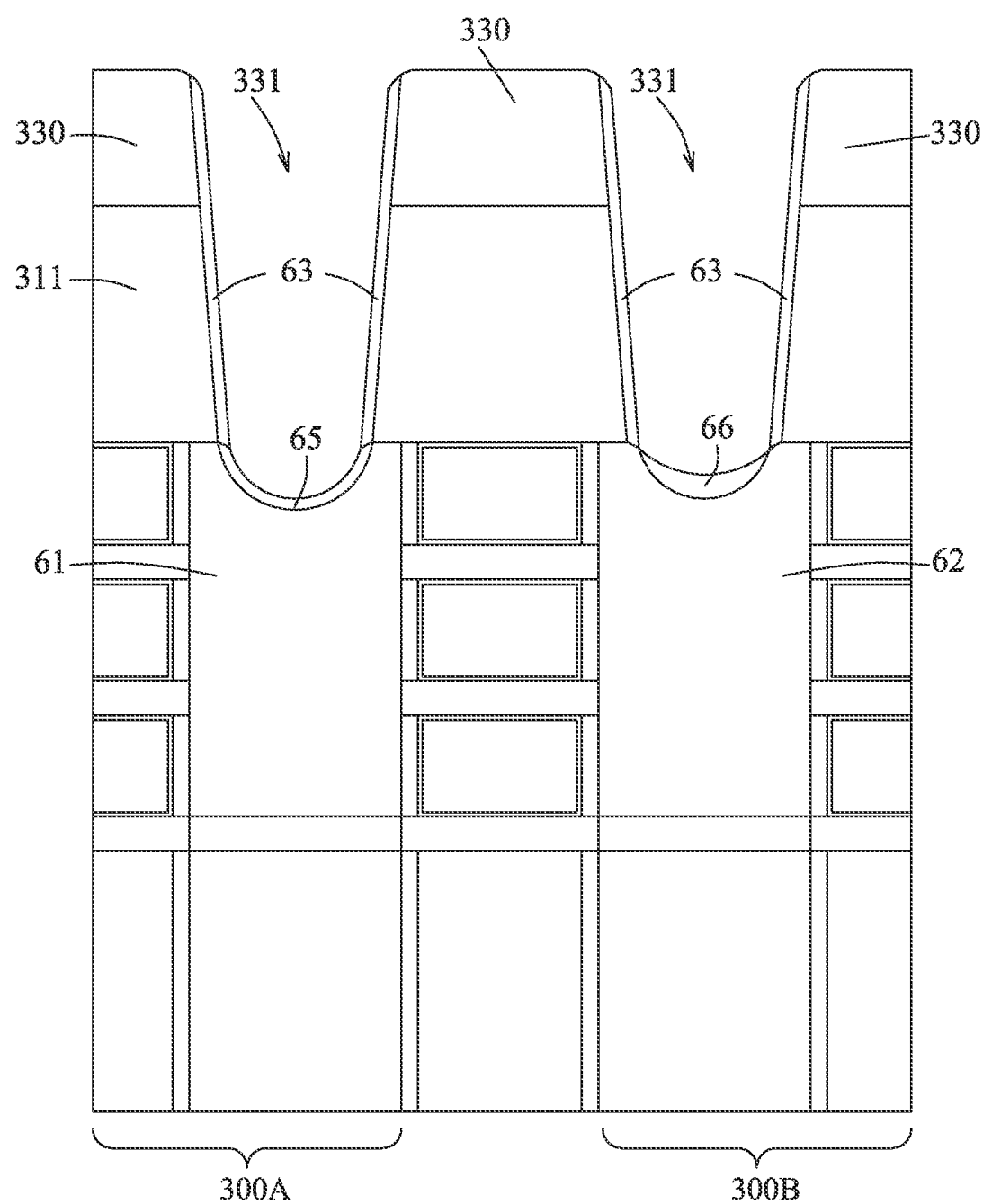

Referring to FIG. 35 and the example illustrated in FIG. 45, the method 400 proceeds to step 407, where a precursor layer 66 is selectively deposited on a corresponding one of the second source/drain portions 62 (one of which is shown in FIG. 45) by CVD, ALD, or other suitable deposition techniques. FIG. 45 is a view similar to that of FIG. 44, but illustrating the structure after step 407. In some embodiments, the precursor layer 66 includes second selected elements. Suitable species for the second selected elements in the precursor layer 66 are similar to those of the second selected elements in the abovementioned step 209. In some embodiments, during formation of the precursor layer 66, a volatile material having functional groups for bonding the second selected elements may be used to facilitate the precursor layer 66 to be selectively formed on the corresponding second source/drain portion 62. Thus, the precursor layer 66 is not formed on the third implanted region 65, the liners 63, or the upper surface of the capping layer 330. In some embodiments, the precursor layer 66 has a thickness ranging from about 5 nm to about 10 nm.

Figure 46:
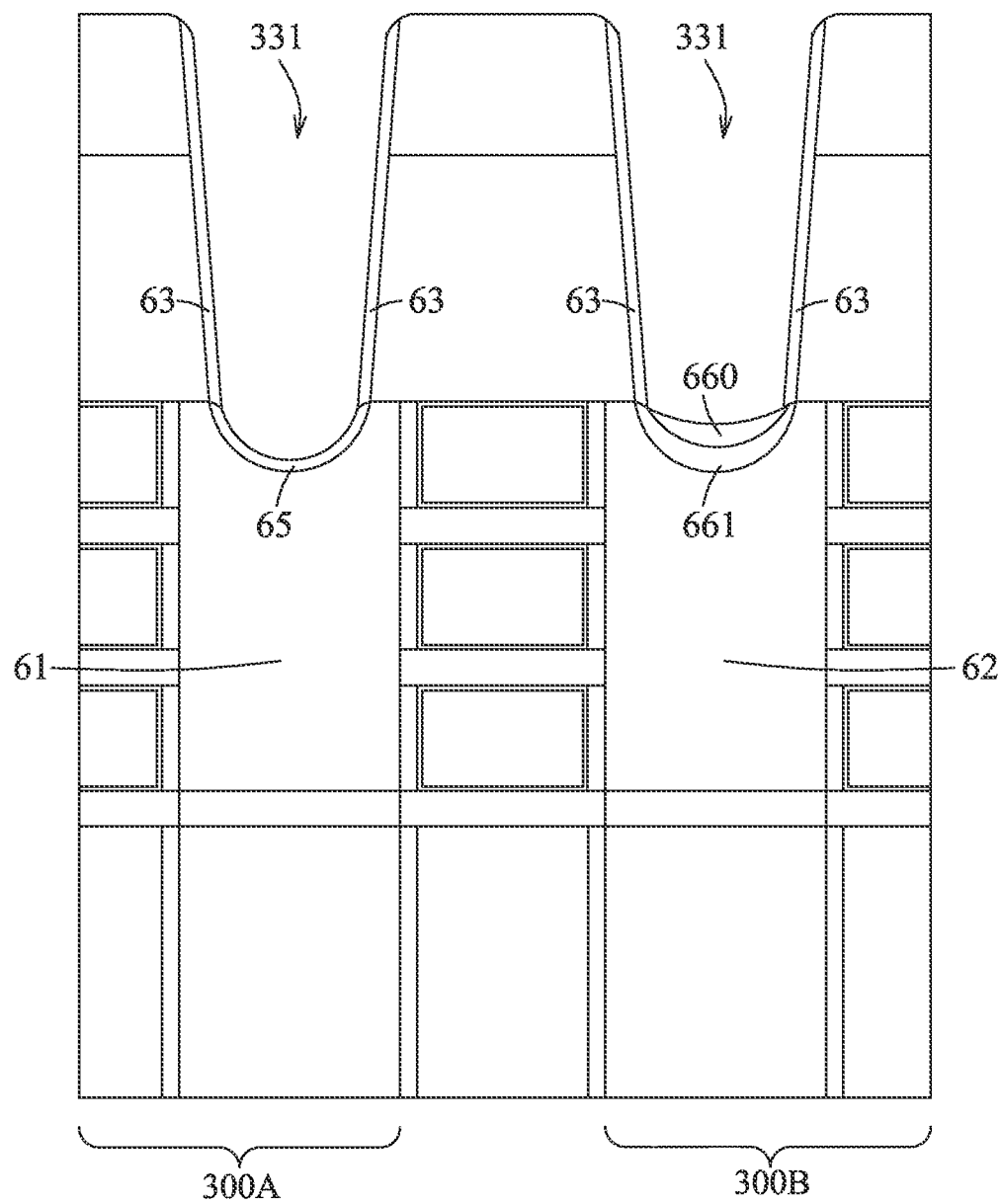
Figure 47:
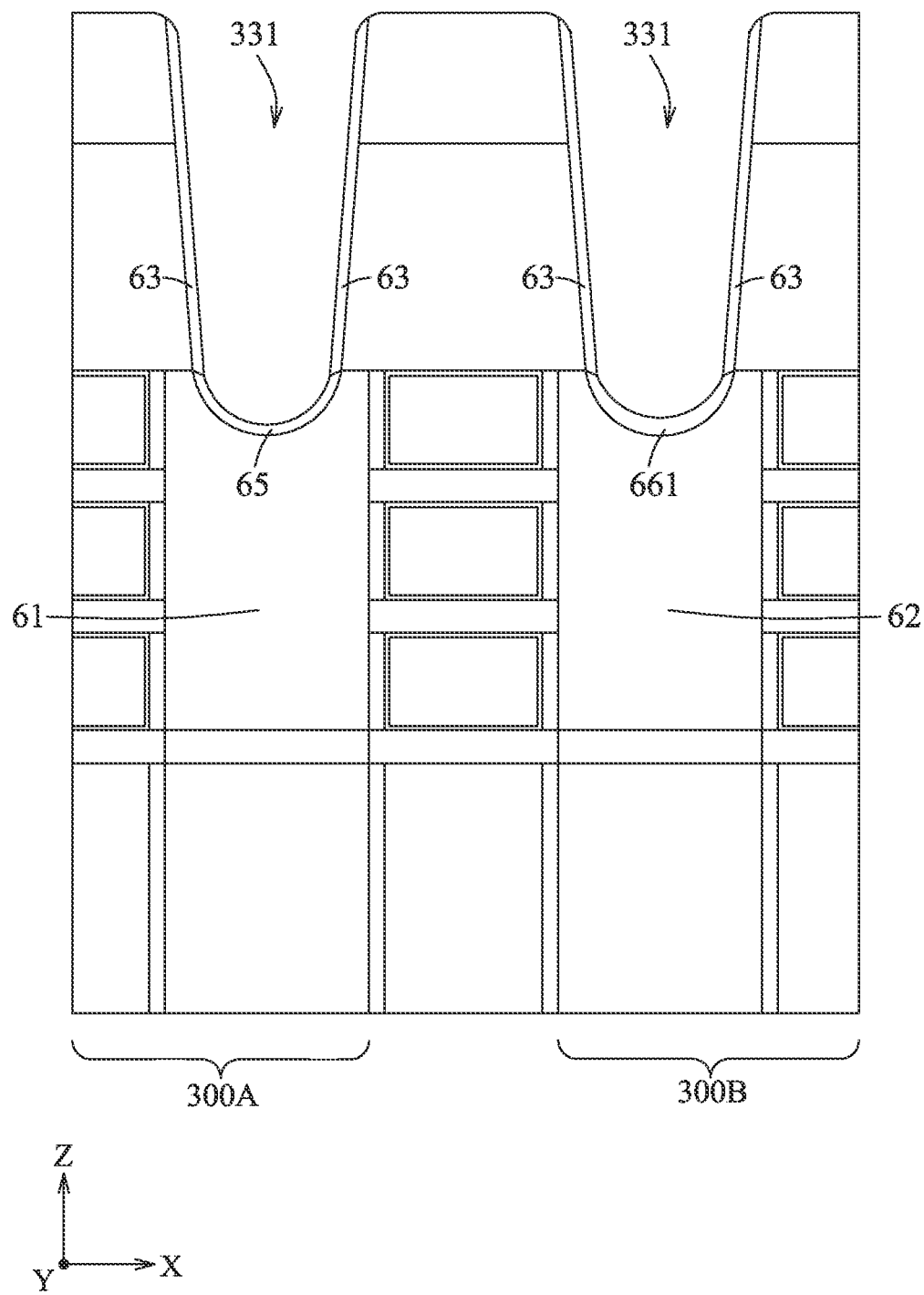

Referring to FIG. 35 and the example illustrated in FIG. 47, the method 400 proceeds to step 408, where the precursor layer 66 shown in FIG. 45 is treated to permit silicon elements from a corresponding one of the second source/drain portions 62 (one of which is shown in FIG. 46) to diffuse into the precursor layer 66, thereby obtaining a Si-containing precursor layer 661 which is disposed on a remaining region of the corresponding second source/drain portion 62. FIG. 47 is a view similar to that of FIG. 45, but illustrating the structure after step 408. In some embodiments, the treatment of the precursor layer 66 may be a thermal treatment. In some embodiments, the thermal treatment may be performed at a temperature ranging from about 250° C. to about 850° C. for a time period ranging from about 30 seconds to about 5 minutes. In some other embodiments, the treatment of the precursor layer 66 can be performed together with step 407 when selective deposition of the precursor layer 66 is performed at a relatively high temperature to permit the silicon elements from the corresponding second source/drain portion 62 to diffuse and react with the second selected elements in the precursor layer 66 so as to form the Si-containing precursor layer 661. In some embodiments, the Si-containing precursor layer 661 may include Mo-containing silicide (e.g., MoSiGe), Ru-containing silicide (e.g., RuSiGe), Ni-containing silicide (e.g., NiSiGe), Co-containing silicide (e.g., CoSiGe), or combinations thereof. Other suitable treatments and materials for obtaining the Si-containing precursor layer 661 are within the contemplated scope of the present disclosure.

In some embodiments, after the Si-containing precursor layer 661 is formed, an unreacted portion 660 of the precursor layer 66 may not react with the corresponding second source/drain portion 62, and remains on the Si-containing precursor layer 661, as shown in FIG. 46. In this case, step 408 includes (i) treating the precursor layer 66 to form the Si-containing precursor layer 661 on the remaining region of the corresponding second source/drain portion 62, and (ii) removing the unreacted portion 660 of the precursor layer 66 by, for example, but not limited to, a wet etching process, a dry etching process, other suitable processes, or combinations thereof.

Figure 48:
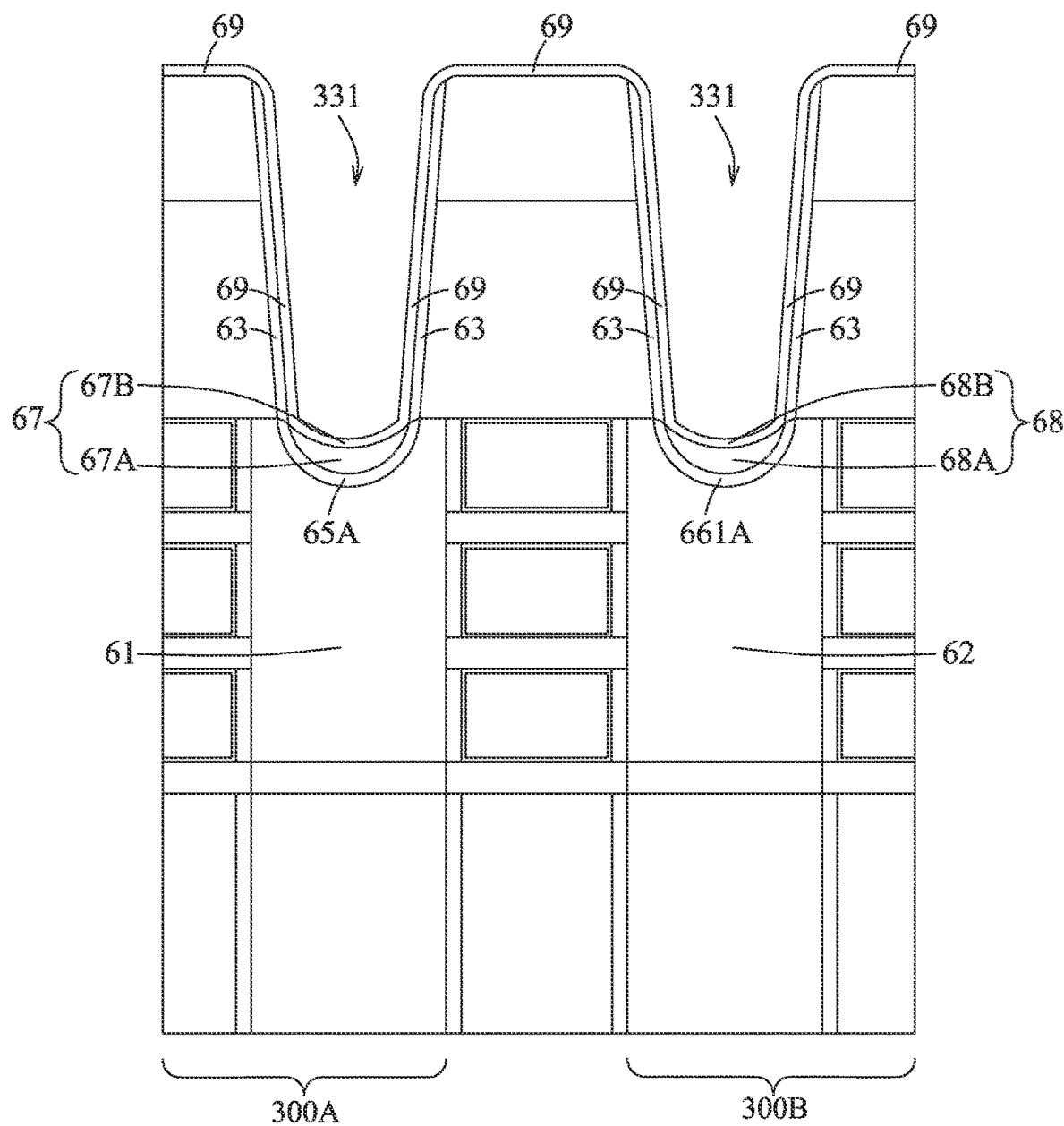

Referring to FIG. 35 and the example illustrated in FIG. 48, the method 400 proceeds to step 409, where a metal deposition process is performed on the structure as shown in FIG. 47. FIG. 48 is a view similar to that of FIG. 47, but illustrating the structure after step 409. After the metal deposition process, (i) a first backside metal silicide layer 67 is formed on a remaining region of a corresponding one of the first source/drain portions 61, (ii) a second backside metal silicide layer 68 is formed on a remaining region of the corresponding second source/drain portion 62, (iii) a first backside transition layer 65A is formed between the first backside metal silicide layer 67 and the remaining region of the corresponding first source/drain portion 61, and (iv) a second backside transition layer 661A is formed between the second backside metal silicide layer 68 and the remaining region of the corresponding second source/drain portion 62. The first and second backside transition layers 65A, 661A respectively include the first and second selected elements. In some embodiments, in the case that the second selected elements in the precursor layer 66 shown in FIG. 45 is Mo, Ru, Ni, or Co, the second backside transition layer 661A may include Mo-containing silicide (e.g., MoSiGe), Ru-containing silicide (e.g., RuSiGe), Ni-containing silicide (e.g., NiSiGe), or Co-containing silicide (e.g., CoSiGe). In some embodiments, the atomic concentration of the first selected elements in the first backside transition layer 65A is higher than that in each of the first backside metal silicide layer 67 and the remaining region of the corresponding first source/drain portion 61 by about 0.5% to about 35%. In some embodiments, the atomic concentration of the second selected elements in the second backside transition layer 661A is higher than that in each of the second backside metal silicide layer 68 and the remaining region of the corresponding second source/drain portion 62 by about 0.5% to about 35%. In some embodiments, each of the first and second backside transition layers 65A, 661A independently has a thickness ranging from one atomic layer to three atomic layers. In some embodiments, the thickness of each of the first and second backside transition layers 65A, 661A independently ranges from about 0.3 nm to about 5 nm. In some embodiments, the second backside transition layer 661A has a thickness ranging from about 1 nm to about 5 nm.

In some embodiments, step 409 includes (i) depositing metal elements (not shown) over the structure shown in FIG. 47 at a relatively high temperature to permit silicon elements in the third implanted region 65 to diffuse and react with a first portion of the metal elements deposited on the third implanted region 65 so as to form the first backside metal silicide layer 67 on the remaining region of the corresponding first source/drain portion 61, and to permit silicon elements in the Si-containing precursor layer 661 to diffuse and react with a second portion of the metal elements deposited on the Si-containing precursor layer so as to form the second backside metal silicide layer 68 on the remaining region of the corresponding second source/drain portion 62, (ii) removing unreacted metal elements (if any). In step 409, during the time period when the silicon elements in the third implanted region 65 are driven to diffuse and react with the first portion of the metal elements to form the first backside silicide layer 67, the first selected elements in the third implanted region 65 (see FIG. 47) are simultaneously separated from the silicon elements in the third implanted regions 65 to form the first backside transition layer 65A (which may be also called as a segregation layer) between the first backside metal silicide layer 67 and the remaining region of the corresponding first source/drain portion 61. During the time period when the silicon elements in the Si-containing precursor layer 661 are driven to diffuse and react with the second portion of the metal elements, an upper portion of the Si-containing precursor layer 661 (see FIG. 47) is converted into the second backside metal silicide layer 68, and a lower remaining portion of the Si-containing precursor layer 661 serves as the second backside transition layer 661A. In other words, the second selected elements in the Si-containing precursor layer 661 are simultaneously separated from the silicon elements in the Si-containing precursor layer 661 to form the second backside transition layer 661A (which may be also called as a segregation layer) between the second backside metal silicide layer 68 and the remaining region of the corresponding second source/drain portion 68. In some embodiments, the metal elements include titanium (Ti), nickel (Ni), cobalt (Co), ruthenium (Ru), molybdenum (Mo), or combinations thereof. Other suitable materials for the metal elements are within the contemplated scope of the present disclosure. In the case that the metal elements is titanium, the first backside metal silicide layer 67 includes titanium-based silicide (for example, but not limited to, TiSi), and the second metal silicide layer 68 includes titanium-based silicide (for example, but not limited to, MoTiSiGe, RuTiSiGe, NiTiSiGe, CoTiSiGe). In some embodiments, each of the first and second backside metal silicide layers 67, 68 independently has a thickness ranging from about 1 nm to about 5 nm.

In some other embodiments, when deposition of the metal elements is performed at a relatively low temperature (for example, but not limited to, a room temperature), the metal elements may be formed into a metal film, and step 409 may further include performing a thermal treatment so as to permit the silicon elements in the third implanted region 65 and the Si-containing precursor layer 661 to diffuse and react with the first and second portions of the metal elements in the metal film so as to respectively form the first and second backside metal silicide layers 67, 68.

In the case that the liners 63 and the capping layer 330 are made of silicon nitride-based material (for example, but not limited to, silicon nitride, silicon carbon nitride, silicon oxycarbonnitride), during deposition of the metal elements, the metal elements may react with silicon elements and nitrogen elements in outer portions of the liners 63 and the capping layer 330 which the metal elements are deposited on, and thus a nitrogen-containing layer 69 may be formed on remaining portions of the liners 63 and the capping layer 330. In some embodiments, the nitrogen-containing layer 69 may include titanium silicon nitride (TiSiN), but is not limited thereto. In some embodiments, the nitrogen-containing layer 69 has a thickness ranging from about 0.5 nm to about 4 nm.

In some embodiments, step 409, after deposition of the metal elements, further includes performing a nitrogen treatment to the first and second backside metal silicide layers 67, 68, so that each of the first backside metal silicide layers 67 has an upper nitrogen-containing portion 67B and a lower remaining portion 67A which is nitrogen-free or has a nitrogen concentration much lower than that of the upper nitrogen-containing portion 67B, and the second backside metal silicide layer 68 has an upper nitrogen-containing portion 68B and a lower remaining portion 68A which is nitrogen-free or has a nitrogen concentration much lower than that of the upper nitrogen-containing portion 68B. In some embodiments, the upper nitrogen-containing portions 67B, 68B each serves as an oxygen barrier layer to prevent oxygen from diffusing into the first and second source/drain portions 61, 62, so that the first and second source/drain portions 61, 62 are less likely to be oxidized. In some embodiments, the upper nitrogen-containing portions 67B, 68B may include titanium silicon nitride (TiSiN), but is not limited thereto. In some embodiments, each of the upper nitrogen-containing portions 67B, 68B respectively has a thickness ranging from about 1 nm to about 5 nm.

Figure 49:
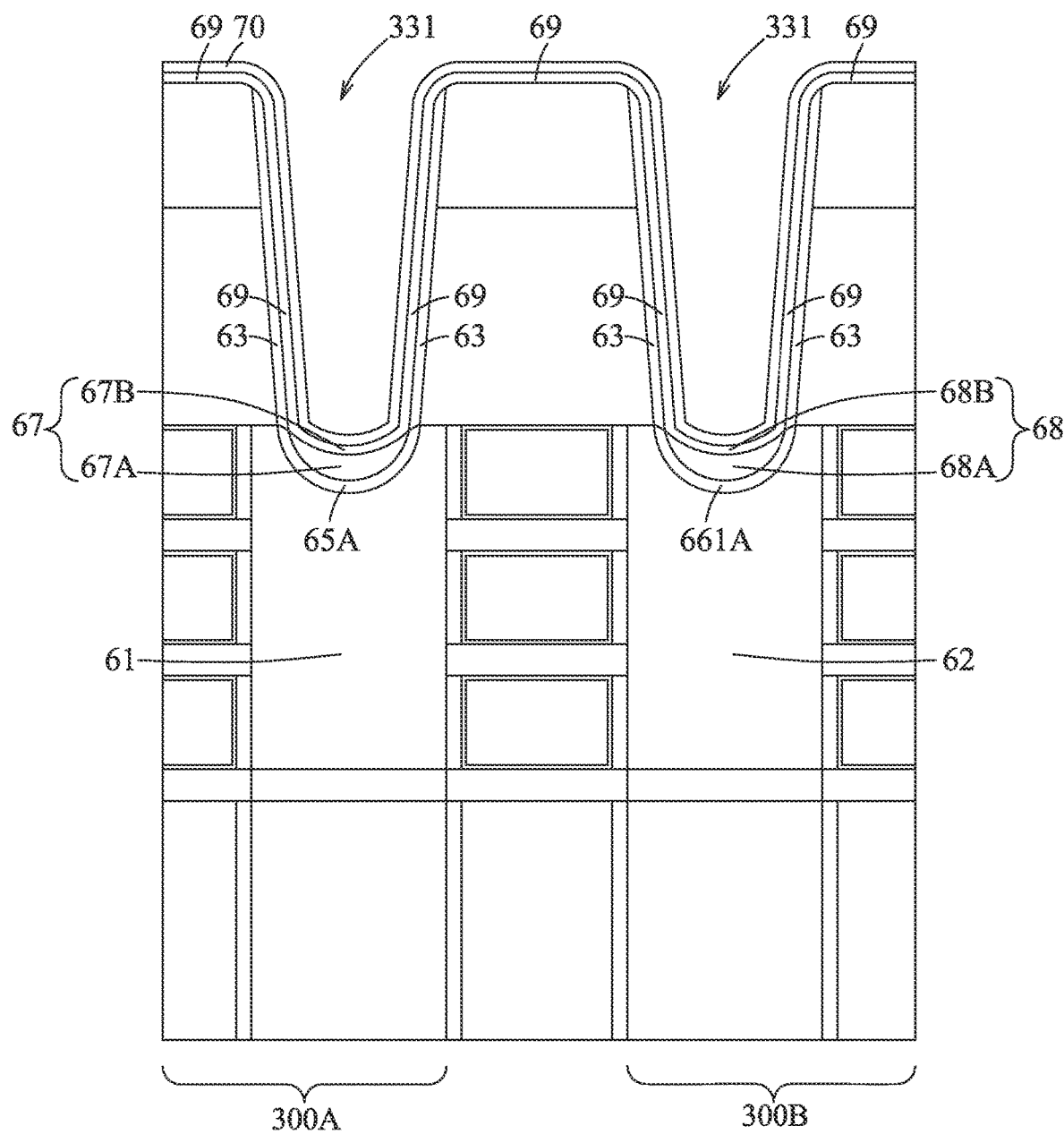
Figure 50:
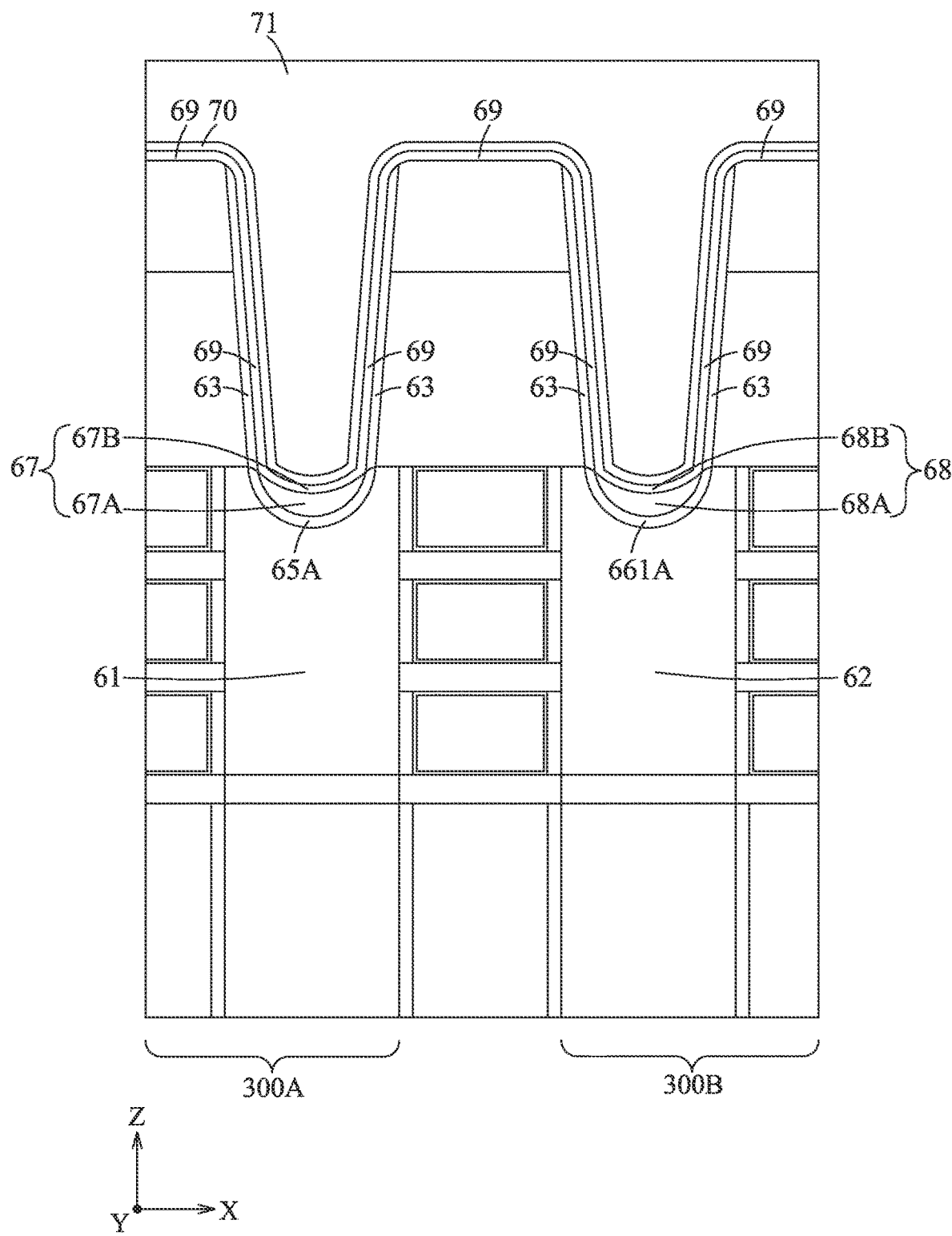

Referring to FIG. 35 and the example illustrated in FIG. 49, the method 400 proceeds to step 410, where a glue layer 70 is formed over the structure shown in FIG. 48. FIG. 49 is a view similar to that of FIG. 48, but illustrating the structure after step 410. The glue layer 70 is optional, but often serves as a barrier layer which has a function that is similar to that of the liners 63, or is used to improve uniformity of the bottom vias 73 to be subsequently formed. In some embodiments, the glue layer 70 is formed using a blanket deposition process such as CVD, HDPCVD, SACVD, MLD, or PVD. In some embodiments, the glue layer 70 includes titanium nitride (TiN), tantalum nitride (TaN), or a combination thereof, but is not limited thereto. In some embodiments, the glue layer 70 has a thickness ranging from about 0.3 nm to about 3 nm. Other suitable processes and materials for forming the glue layer 70 are within the contemplated scope of the present disclosure.

Referring to FIG. 35 and the examples illustrated in FIGS. 51 and 52, the method 400 proceeds to step 411, where a plurality of the backside vias 73 are formed to fill the recesses 311 (see FIG. 49), respectively. FIG. 51 is a view similar to that of FIG. 49, but illustrating the structure after step 411, and FIG. 52 is a cross-sectional view taken along line D-D of FIG. 51. In some embodiments, step 411 includes (i) depositing a metal layer 71 (see FIG. 50) over the glue layer 70 to fill the recesses 311, and (ii) removing an excess of the metal layer 71, an excess of the nitrogen-containing layer 69, and an excess of the glue layer 70 using, for example, but not limited to, CMP, to expose the capping layer 330. After step 411, the metal layer 71 is formed into the backside vias 73, and the glue layer 70 is formed into a plurality of barrier portions 72 each surrounding a corresponding one of the backside vias 73 so as to prevent metal ions in the backside vias 73 from diffusing therefrom. In some embodiments, each of the backside vias 73 has a height (H) ranging from about 10 nm to about 50 nm. In some embodiments, the backside vias 73 include cobalt (Co), ruthenium (Ru), tungsten (W), molybdenum (Mo), or combinations thereof. Other suitable processes and materials for forming the backside vias 73 are within the contemplated scope of the present disclosure.

In some embodiments, some steps in the method 400 may be modified, replaced, or eliminated without departure from the spirit and scope of the present disclosure. For example, in some embodiments, the first backside transition layer 65A may be formed in a manner similar to that of the second backside transition layer 661A (i.e., an implantation-free process). In this case, step 406 may be replaced by selectively depositing a precursor layer (not shown, but in a position corresponding to the third implanted region 65 shown in FIG. 47) on a corresponding one of the first source/drain portions 61 at the n-FET portion 300A. During formation of the precursor layer at the n-FET portion 300A, a volatile material having functional groups for bonding to the first selected elements may be used to facilitate the precursor layer to be selectively formed on the corresponding first source/drain portion 61. In step 408, in addition to formation of the Si-containing precursor layer 661, the precursor layer at the n-FET portion 300A is also treated to permit silicon elements from the corresponding first source/drain portion 61 to diffuse into the precursor layer at the n-FET portion 300A, thereby obtaining a Si-containing precursor layer which is disposed on a remaining region of the corresponding first source/drain portion 61. In step 409, in addition to the reaction at the p-FET region 300B, the silicon elements in the Si-containing precursor layer at the n-FET portion 300A are driven to diffuse and react with the first portion of the metal elements, an upper portion of the Si-containing precursor layer at the n-FET portion 300A is converted to serve as the first backside metal silicide layer 67, and a lower remaining portion of the Si-containing precursor layer serves as the first backside transition layer 65A. In some other embodiments, the first transition layer 161A, which is formed by the implantation process described in the method 200, may also be formed in a manner similar to the implantation-free process for forming the first backside transition layer 65A, and the details thereof are omitted for the sake of brevity. In some other embodiments, the second backside transition layer 661A, which is formed by the implantation-free process, may be formed in a manner similar to the implantation process for forming the second transition layer 162A, and vice versa, and the details thereof are omitted for the sake of brevity.

In some embodiments, step 408 may be omitted. In this case, the metal elements are deposited on the precursor layer 66 in step 409. When deposition of the metal elements is performed at a relatively high temperature, and when the precursor layer 66 is thin enough for the silicon elements in an upper region of a corresponding one of the second source/drain portions 62 to diffuse therethrough, the silicon elements may be driven to diffuse through the precursor layer 66 and react with the metal elements deposited thereon to form the second backside silicide layer 68, and the second selected elements in the precursor layer 66 simultaneously diffuse to a position beneath the second backside silicide layer 68 to form the second backside transition layer 661A between the second backside metal silicide layer 68 and the remaining region of the corresponding second source/drain portion 62.

In this disclosure, with the provision of the transition layer between the metal silicide layer and the source/drain portion, the semiconductor device can have a reduced SBH and Rcsd. The transition layer including the selected elements can be formed simultaneously with the metal silicide layer in the metal deposition process either by an implantation process or an implantation-free process. In the method of this disclosure, by varying parameters in the implantation process (for example, the dosage and energy of the selected elements, the species of the selected elements, and so on) and/or in the implantation-free process (for example, thickness of the precursor layer including the selected elements), atomic concentration of the selected elements in the transition layer and the thickness of the transition layer can be varied accordingly, thereby permitting the values of the SBH and Rcsd to be tuned. Therefore, the method in this disclosure provides a flexible strategy which is beneficial for Rcsd reduction and silicide formation.

In accordance with some embodiments of the present disclosure, a semiconductor device includes a source/drain portion, a metal silicide layer disposed over the source/drain portion, and a transition layer disposed between the source/drain portion and the metal silicide layer. The transition layer includes implantation elements, and an atomic concentration of the implantation elements in the transition layer is higher than that in each of the source/drain portion and the metal silicide layer so as to reduce a contact resistance between the source/drain portion and the metal silicide layer.

In accordance with some embodiments of the present disclosure, the transition layer has a thickness ranging from one atomic layer to three atomic layers.

In accordance with some embodiments of the present disclosure, the atomic concentration of the selected elements in the transition layer is higher than that in each of the source/drain portion and the metal silicide layer by 0.5% to 35%.

In accordance with some embodiments of the present disclosure, the source/drain portion has an n-type conductivity, and the selected elements in the transition layer include phosphorus (P), zirconium (Zr), hafnium (Hf), antimony (Sb), cerium (Ce), scandium (Sc), yttrium (Y), ytterbium (Yb), erbium (Er), or combinations thereof.

In accordance with some embodiments of the present disclosure, the source/drain portion has a p-type conductivity, and the selected elements in the transition layer include boron (B), aluminum (Al), gallium (Ga), indium (In), germanium (Ge), tin (Sn), molybdenum (Mo), platinum (Pt), nickel (Ni), cobalt (Co), ruthenium (Ru), or combinations thereof.

In accordance with some embodiments of the present disclosure, a method for manufacturing a semiconductor device includes forming a source/drain portion, and forming a metal silicide layer and a transition layer such that the metal silicide layer is formed above the source/drain portion and the transition layer is formed beneath the metal silicide layer. The transition layer includes selected elements, and an atomic concentration of the selected elements in the transition layer is higher than that in each of the source/drain portion and the metal silicide layer.

In accordance with some embodiments of the present disclosure, formation of the metal silicide layer and the transition layer includes implanting the selected elements into an upper region of the source/drain portion, and performing a metal deposition process to permit metal elements to react with silicon elements in the upper region of the source/drain portion such that the metal silicide layer is formed on a remaining region of the source/drain portion, and such that the transition layer including the selected elements is formed between the metal silicide layer and the remaining region of the source/drain portion.

In accordance with some embodiments of the present disclosure, formation of the metal silicide layer and the transition layer further includes performing a nitrogen treatment on the metal silicide layer so that the metal silicide layer has an upper nitrogen-containing portion.

In accordance with some embodiments of the present disclosure, formation of the metal silicide layer and the transition layer further includes, before performing the metal deposition process, implanting pre-amorphization elements into the upper region of the source/drain portion so as to transform a crystalline phase in the upper region of the source/drain portion into an amorphous phase, thereby facilitating reaction between the metal elements and the silicon elements in the upper region of the source/drain portion.

In accordance with some embodiments of the present disclosure, an energy for implanting the selected elements is lower than an energy for implanting the pre-amorphization element.

In accordance with some embodiments of the present disclosure, a dosage for implanting the selected elements is higher than a dosage for implanting the pre-amorphization elements.

In accordance with some embodiments of the present disclosure, the selected elements are implanted to form an implanted region which has a thickness ranging from 0.5 nm to 7 nm.

In accordance with some embodiments of the present disclosure, an energy for implanting the selected elements ranges from 0.3 keV to 3 keV.

In accordance with some embodiments of the present disclosure, a dosage for implanting the selected elements ranges from 5E14 atoms/cm$^2$ to 5E16 atoms/cm$^2$.

In accordance with some embodiments of the present disclosure, formation of the metal silicide layer and the transition layer includes depositing a precursor layer including the selected elements on the source/drain portion, and performing a metal deposition process to permit metal elements to react with the silicon elements in an upper region of the source/drain portion such that the metal silicide layer is formed on a remaining region of the source/drain portion, and such that the precursor layer remaining between the metal silicide layer and the remaining region of the source/drain portion is converted to serve as the transition layer.

In accordance with some embodiments of the present disclosure, formation of the metal silicide layer and the transition layer further includes performing a nitrogen treatment on the metal silicide layer so that the metal silicide layer has an upper nitrogen-containing portion.

In accordance with some embodiments of the present disclosure, a method for manufacturing a semiconductor device, comprising: forming a first source/drain portion and a second source/drain portion each having conductivity types different from each other; implanting first selected elements into an upper region of the first source/drain portion; selectively depositing a precursor layer on the second source/drain portion, the precursor layer including second selected elements; treating the precursor layer to permit silicon elements from the second source/drain portion to diffuse into the precursor layer, thereby obtaining a Si-containing precursor layer; and performing a metal deposition process for depositing metal elements such that a first portion of the metal elements deposited on the first source/drain portion reacts with silicon elements in the upper region of the first source/drain portion to form a first metal silicide layer on a remaining region of the first source/drain portion and to form a first transition layer which includes the first selected elements and which is disposed between the metal silicide layer and the remaining region of the first source/drain portion, and such that a second portion of the metal elements deposited on the Si-containing precursor layer reacts with the silicon elements in the Si-containing precursor layer such that an upper portion of the Si-containing precursor layer is converted into the metal silicide layer, and a lower remaining portion of the Si-containing precursor layer serves as a second transition layer.

In accordance with some embodiments of the present disclosure, the precursor layer is selectively deposited on the second source/drain portion after implanting the first selected elements into the upper region of the first source/drain portion.

In accordance with some embodiments of the present disclosure, during implantation of the first selected elements into the upper region of the first source/drain portion, the second source/drain portion is covered by a masking layer In accordance with some embodiments of the present disclosure, the first selected elements include phosphorus (P), zirconium (Zr), hafnium (Hf), antimony (Sb), cerium (Ce), scandium (Sc), yttrium (Y), ytterbium (Yb), erbium (Er), or combinations thereof, and the second selected elements include boron (B), aluminum (Al), gallium (Ga), indium (In), germanium (Ge), tin (Sn), molybdenum (Mo), platinum (Pt), nickel (Ni), cobalt (Co), ruthenium (Ru), or combinations thereof.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   forming a source/drain portion; and
   forming a metal silicide layer and a transition layer such that the metal silicide layer is formed above the source/drain portion and the transition layer is formed beneath the metal silicide layer, the transition layer including selected elements, an atomic concentration of the selected elements in the transition layer being higher than an atomic concentration of the selected elements in each of the source/drain portion and the metal silicide layer.

2. The method of claim 1, formation of the metal silicide layer and the transition layer includes
   implanting the selected elements into an upper region of the source/drain portion; and
   performing a metal deposition process to permit metal elements to react with silicon elements in the upper region of the source/drain portion such that the metal silicide layer is formed on a remaining region of the source/drain portion, and such that the transition layer including the selected elements is formed between the metal silicide layer and the remaining region of the source/drain portion.

3. The method of claim 2, wherein formation of the metal silicide layer and the transition layer further includes
   performing a nitrogen treatment on the metal silicide layer so that the metal silicide layer has an upper nitrogen-containing portion.

4. The method of claim 2, wherein formation of the metal silicide layer and the transition layer further includes, before performing the metal deposition process:
   implanting pre-amorphization elements into the upper region of the source/drain portion so as to transform a crystalline phase in the upper region of the source/drain portion into an amorphous phase, thereby facilitating reaction between the metal elements and the silicon elements in the upper region of the source/drain portion.

5. The method of claim 4, wherein an energy for implanting the selected elements is lower than an energy for implanting the pre-amorphization element.

6. The method of claim 4, wherein a dosage for implanting the selected elements is higher than a dosage for implanting the pre-amorphization elements.

7. The method of claim 2, wherein the selected elements are implanted to form an implanted region which has a thickness ranging from 0.5 nm to 7 nm.

8. The method of claim 2, wherein an energy for implanting the selected elements ranges from 0.3 keV to 3 keV.

9. The method of claim 2, wherein a dosage for implanting the selected elements ranges from 5E14 atoms/cm2 to 5E16 atoms/cm2.

10. The method of claim 1, wherein formation of the metal silicide layer and the transition layer includes:
    depositing a precursor layer on the source/drain portion, the precursor layer including the selected elements; and
    performing a metal deposition process to permit metal elements to react with the silicon elements in an upper region of the source/drain portion such that the metal silicide layer is formed on a remaining region of the source/drain portion, and such that the precursor layer remaining between the metal silicide layer and the remaining region of the source/drain portion is converted to serve as the transition layer.

11. The method of claim 10, wherein formation of the metal silicide layer and the transition layer further includes
    performing a nitrogen treatment on the metal silicide layer so that the metal silicide layer has an upper nitrogen-containing portion.

12. A method for manufacturing a semiconductor device, comprising:
    forming a first source/drain portion and a second source/drain portion each having conductivity types different from each other;

implanting first selected elements into an upper region of the first source/drain portion;

selectively depositing a precursor layer on the second source/drain portion, the precursor layer including second selected elements;

treating the precursor layer to permit silicon elements from the second source/drain portion to diffuse into the precursor layer, thereby obtaining a Si-containing precursor layer; and performing a metal deposition process for depositing metal elements such that a first portion of the metal elements deposited on the first source/drain portion reacts with silicon elements in the upper region of the first source/drain portion to form a first metal silicide layer on a remaining region of the first source/drain portion and to form a first transition layer which includes the first selected elements and which is disposed between the metal silicide layer and the remaining region of the first source/drain portion, and such that a second portion of the metal elements deposited on the Si-containing precursor layer reacts with the silicon elements in the Si-containing precursor layer such that an upper portion of the Si-containing precursor layer is converted into the metal silicide layer, and a lower remaining portion of the Si-containing precursor layer serves as a second transition layer.

13. The method of claim 12, wherein the precursor layer is selectively deposited on the second source/drain portion after implanting the first selected elements into the upper region of the first source/drain portion.

14. The method of claim 12, wherein during implantation of the first selected elements into the upper region of the first source/drain portion, the second source/drain portion is covered by a masking layer.

15. The method of claim 12, wherein the first selected elements include phosphorus (P), zirconium (Zr), hafnium (Hf), antimony (Sb), cerium (Ce), scandium (Sc), yttrium (Y), ytterbium (Yb), erbium (Er), or combinations thereof, and the second selected elements include boron (B), aluminum (Al), gallium (Ga), indium (In), germanium (Ge), tin (Sn), molybdenum (Mo), platinum (Pt), nickel (Ni), cobalt (Co), ruthenium (Ru), or combinations thereof.

16. A method for manufacturing a semiconductor device, comprising:

forming a source/drain portion;

forming a metal silicide layer over the source/drain portion; and forming a transition layer between the source/drain portion and the metal silicide layer, the transition layer including selected elements, an atomic concentration of the selected elements in the transition layer being higher than an atomic concentration of the selected elements in each of the source/drain portion and the metal silicide layer.

17. The method of claim 16, wherein the transition layer has a thickness ranging from one atomic layer to three atomic layers.

18. The method of claim 16, wherein the atomic concentration of the selected elements in the transition layer is higher than the atomic concentration of the selected elements in each of the source/drain portion and the metal silicide layer by 0.5% to 35%.

19. The method of claim 16, wherein the source/drain portion has an n-type conductivity, and the selected elements in the transition layer include phosphorus (P), zirconium (Zr), hafnium (Hf), antimony (Sb), cerium (Ce), scandium (Sc), yttrium (Y), ytterbium (Yb), erbium (Er), or combinations thereof.

20. The method of claim 16, wherein the source/drain portion has a p-type conductivity, and the selected elements in the transition layer include boron (B), aluminum (Al), gallium (Ga), indium (In), germanium (Ge), tin (Sn), molybdenum (Mo), platinum (Pt), nickel (Ni), cobalt (Co), ruthenium (Ru), or combinations thereof.

* * * * *